United States Patent
Ono et al.

(10) Patent No.: US 12,119,611 B2
(45) Date of Patent: Oct. 15, 2024

(54) SEMICONDUCTOR LASER APPARATUS AND SEMICONDUCTOR LASER DEVICE

(71) Applicant: NUVOTON TECHNOLOGY CORPORATION JAPAN, Kyoto (JP)

(72) Inventors: Masayuki Ono, Toyama (JP); Katsuya Samonji, Toyama (JP); Tohru Nishikawa, Toyama (JP); Hiroshi Asaka, Toyama (JP); Mitsuru Nishitsuji, Toyama (JP); Kazuya Yamada, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 575 days.

(21) Appl. No.: 17/408,998

(22) Filed: Aug. 23, 2021

(65) Prior Publication Data

US 2021/0384701 A1    Dec. 9, 2021

Related U.S. Application Data

(63) Continuation of application No. PCT/JP2020/002231, filed on Jan. 23, 2020.

(30) Foreign Application Priority Data

Feb. 26, 2019 (JP) ................................. 2019-033391

(51) Int. Cl.
*H01S 5/0234* (2021.01)
*H01S 5/022* (2021.01)
(Continued)

(52) U.S. Cl.
CPC ............ *H01S 5/0234* (2021.01); *H01S 5/022* (2013.01); *H01S 5/2207* (2013.01);
(Continued)

(58) Field of Classification Search
CPC ..... H01S 5/0234; H01S 5/4018; H01S 5/4021
See application file for complete search history.

(56) References Cited

U.S. PATENT DOCUMENTS

| 5,887,012 A | 3/1999 | Yamada |
| 7,034,340 B2 * | 4/2006 | Yukimoto ............. H01L 27/153 |
| | | 257/93 |

(Continued)

FOREIGN PATENT DOCUMENTS

| JP | S58-05889 A | 1/1983 |
| JP | H8-46279 A | 2/1996 |

(Continued)

OTHER PUBLICATIONS

International Search Report and Written Opinion issued on Mar. 31, 2020 in International Application No. PCT/JP2020/002231, with partial English translation.

(Continued)

*Primary Examiner* — Michael Carter
(74) *Attorney, Agent, or Firm* — Rimon P.C.

(57) ABSTRACT

A semiconductor laser apparatus includes: a semiconductor laser device for junction down mounting that includes a first light-emitting device region and a second light-emitting device region formed separately on a substrate. The first light-emitting device region and the second light-emitting device region in the semiconductor laser device each have a stack structure in which an n-type semiconductor layer, an active layer, and a p-type semiconductor layer are stacked in stated order. The first light-emitting device region includes a first electrode film located on the n-type semiconductor layer. The second light-emitting device region includes a second electrode film located on the p-type semiconductor layer. The first electrode film and the second electrode film are electrically connected to each other.

20 Claims, 46 Drawing Sheets

(51) Int. Cl.
*H01S 5/22* (2006.01)
*H01S 5/40* (2006.01)
*H01S 5/02* (2006.01)
*H01S 5/323* (2006.01)

(52) U.S. Cl.
CPC .......... *H01S 5/4018* (2013.01); *H01S 5/4031* (2013.01); *H01S 5/0202* (2013.01); *H01S 5/0203* (2013.01); *H01S 5/32341* (2013.01)

(56) References Cited

U.S. PATENT DOCUMENTS

| | | | | |
|---|---|---|---|---|
| 7,709,849 | B1* | 5/2010 | Kal | H01L 27/153 |
| | | | | 257/97 |
| 7,723,737 | B2* | 5/2010 | Lee | H01L 27/153 |
| | | | | 257/E33.068 |
| 11,152,766 | B2* | 10/2021 | Vethake | H01S 5/04256 |
| 2004/0161010 | A1 | 8/2004 | Matsumura | |
| 2005/0225973 | A1* | 10/2005 | Eliashevich | H01L 27/153 |
| | | | | 362/217.1 |
| 2010/0296537 | A1 | 11/2010 | Kotani | |
| 2011/0249694 | A1 | 10/2011 | Nishiguchi et al. | |
| 2018/0034243 | A1 | 2/2018 | Kelemen et al. | |

FOREIGN PATENT DOCUMENTS

| | | |
|---|---|---|
| JP | H9-167878 A | 6/1997 |
| JP | H11-220204 A | 8/1999 |
| JP | 2000-58965 A | 2/2000 |
| JP | 2000-357844 A | 12/2000 |
| JP | 3257219 B2 | 2/2002 |
| JP | 2005-101483 A | 4/2005 |
| JP | 3117281 U | 1/2006 |
| JP | 2010-272554 A | 12/2010 |
| JP | 2011-222675 A | 11/2011 |
| JP | 2016-12707 A | 1/2016 |
| JP | 2018-511948 A | 4/2018 |

OTHER PUBLICATIONS

Japanese Office Action dated Feb. 27, 2024 issued in the corresponding Japanese Patent Application No. 2021-501740.

* cited by examiner

FIG. 26

|  | GaAs | GaN |
|---|---|---|
| Substrate | n-GaAs, insulating substrate or semi-insulating substrate | Insulating substrate of n-GaN, sapphire, or the like, insulating substrate or semi-insulating substrate of nitride |
| Current stop layer | p-GaAs, p-AlGaAs, p-AlGaInP, p-GaInP undoped layer of each material may also be used | p-GaN, p-AlGaN undoped layer of each material may also be used |
| n-type semiconductor layer | n-GaAs, n-AlGaAs, n-AlGaInP, n-GaInP | n-AlGaN, n-GaN |
| Active layer | AlGaAs, InGaAs, GaAsP, GaAs | InGaN, Ga |
| p-type semiconductor layer | p-GaAs, p-AlGaAs, p-AlGaInP, p-GaInP | p-GaN, p-AlGaN |
| Insulating film | $SiO_2$, SiN, $TiO_2$, $ZrO_2$, $Al_2O_3$, $Nb_2O_5$, $Ta_2O_5$ | $SiO_2$, SiN, $TiO_2$, $ZrO_2$, $Al_2O_3$, $Nb_2O_5$, $Tb_2O_5$ |
| n-side electrode | Ti, Pt, Al, Mo, Au, Ge, Ni | Ti, Pt, Al, Mo, Au, Ge, Ni |
| p-side electrode | Ti, Pt, Au, Pd, Ni, Mg | Ti, Pt, Au, Pd, Ni, Mg |
| Submount | AlN, SiC, Diamond | AlN, SiC, Diamond |
| Metal film | Ti, Pt, Au | Ti, Pt, Au |
| Joining material | AuSn | AuSn |

SEMICONDUCTOR LASER APPARATUS AND SEMICONDUCTOR LASER DEVICE

CROSS REFERENCE TO RELATED APPLICATIONS

This is a continuation application of PCT International Application No. PCT/JP2020/002231 filed on Jan. 23, 2020, designating the United States of America, which is based on and claims priority of Japanese Patent Application No. 2019-033391 filed on Feb. 26, 2019. The entire disclosures of the above-identified applications, including the specifications, drawings and claims are incorporated herein by reference in their entirety.

FIELD

The present disclosure relates to a semiconductor laser apparatus and a semiconductor laser device.

BACKGROUND

Conventionally, there are semiconductor laser devices such as semiconductor laser array devices having a plurality of light-emitting device regions (for example, see PTL 1).

PTL 1 discloses a structure in which light-emitting device regions in a semiconductor laser array device are electrically connected in parallel. Thus, current is injected in parallel with the light-emitting device regions in the semiconductor laser array device disclosed in PTL 1.

CITATION LIST

Patent Literature

PTL 1: Japanese Unexamined Patent Application Publication No. H11-220204

SUMMARY

Technical Problem

In the structure disclosed in PTL 1, the plurality of light-emitting device regions are connected in parallel. This causes a problem of excessively large drive current.

The present disclosure provides a semiconductor laser apparatus and the like that reduce drive current for a semiconductor laser device.

Solution to Problem

A semiconductor laser apparatus according to an aspect of the present disclosure is a semiconductor laser apparatus, including: a semiconductor laser device for junction-down mounting that includes a first light-emitting device region and a second light-emitting device region formed separately on a substrate, wherein the first light-emitting device region and the second light-emitting device region in the semiconductor laser device each have a stack structure in which a one-conductivity-type semiconductor layer of one conductivity type, an active layer, and an other-conductivity-type semiconductor layer of an other conductivity type different from the one conductivity type are stacked in stated order, the first light-emitting device region includes a first electrode film located on the one-conductivity-type semiconductor layer, the second light-emitting device region includes a second electrode film located on the other-conductivity-type semiconductor layer, and the first electrode film and the second electrode film are electrically connected to each other.

A semiconductor laser device according to an aspect of the present disclosure is a semiconductor laser device having a stack structure in which a one-conductivity-type semiconductor layer of one conductivity type, an active layer, and an other-conductivity-type semiconductor layer of an other conductivity type different from the one conductivity type are stacked in stated order on a substrate, the semiconductor laser device including: a first light-emitting device region and a second light-emitting device region formed separately and each including the stack structure; and a first electrode film located on the one-conductivity-type semiconductor layer in the first light-emitting device region and a second electrode film located on the other-conductivity-type semiconductor layer in the second light-emitting device region, wherein the first electrode film and the second electrode film are electrically connected to each other, a separation region is located between the first light-emitting device region and the second light-emitting device region, the separation region being a region at which the one-conductivity-type semiconductor layer in the first light-emitting device region and the one-conductivity-type semiconductor layer in the second light-emitting device region are separated, in the separation region, a groove portion is provided in the substrate, and a current stop layer is located between the one-conductivity-type semiconductor layer in the first light-emitting device region and the substrate.

Advantageous Effects

A semiconductor laser apparatus, etc. according to an aspect of the present disclosure reduce drive current for a semiconductor laser device.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 26 is a table illustrating examples of the composition of each structural element in a semiconductor laser apparatus according to the present disclosure.

DESCRIPTION OF EMBODIMENTS

Figure 1:
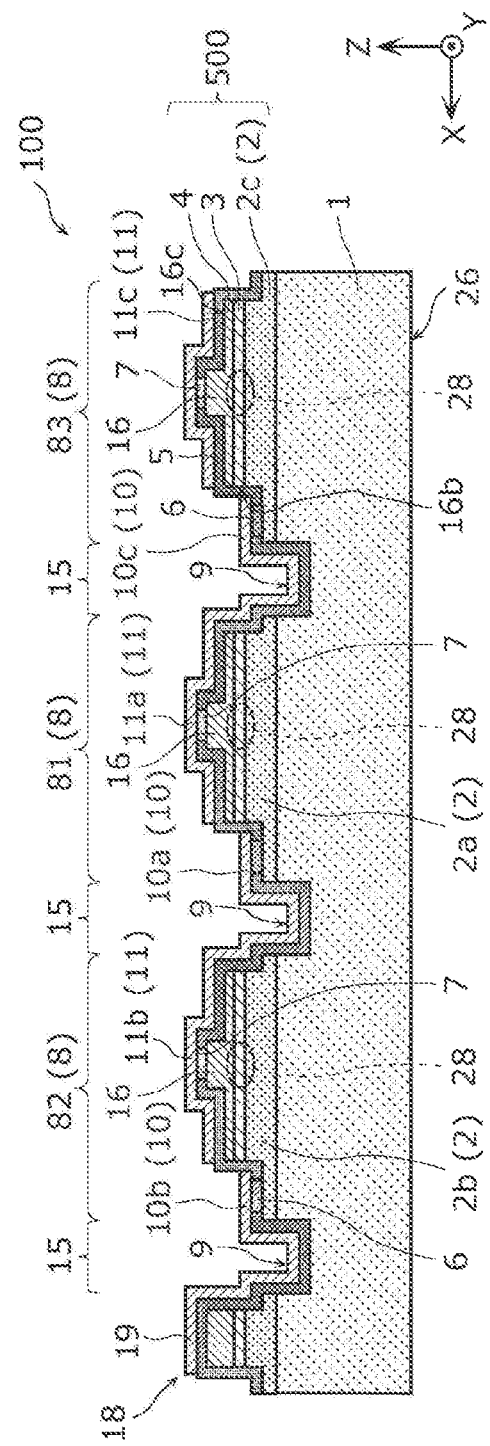
FIG. 1 is a sectional diagram illustrating a semiconductor laser device according to Embodiment 1.

Embodiments of the present disclosure will be described in detail below, with reference to the drawings. The embodiments described below each show a specific example according to the present disclosure. The numerical values, shapes, materials, structural elements, the arrangement and connection of the structural elements, steps, the processing order of the steps etc. shown in the following embodiments are mere examples, and do not limit the scope of the present disclosure.

Each drawing is a schematic and does not necessarily provide precise depiction. Hence, for example, the reduction scale is not necessarily consistent among the drawings. The substantially same structural elements are given the same reference marks throughout the drawings, and repeated description of the substantially same structural elements may be omitted or simplified.

In the embodiments described below, expressions involving numeric values, such as "80 μm", are used. For example, "80 μm" denotes not only exactly 80 μm but also substantially 80 μm, i.e. a difference of about several % being allowed. The same applies to other expressions involving numeric values.

In the embodiments described below, expressions involving "approximately", such as "approximately the same", are used. For example, "approximately" denotes not only exactly the same but also substantially the same, i.e. a difference of about several % being allowed.

In the embodiments described below, the terms "upward" ("up", "upper", "above", etc.) and "downward" ("down", "lower", "below", etc.) do not indicate an upward direction (vertically upward) and a downward direction (vertically downward) in absolute space recognition. The terms "upward" ("up", "upper", etc.) and "downward" ("down", "lower", etc.) apply not only in the case where two structural elements are arranged with a spacing and another structural element is located between the two structural elements but also in the case where two structural elements are arranged in contact with each other. In the embodiments described below, the Z-axis positive direction is referred to as "upward direction", the Z-axis negative direction as "downward direction", the resonator length direction of a semiconductor laser device as "Y-axis direction", and the direction in which the semiconductor laser device emits laser light as "Y-axis positive direction".

In the embodiments described below, in each drawing illustrating only a semiconductor laser device, the side on which a semiconductor layer stacked on a substrate is located with respect to the substrate is referred to as "above". In each drawing illustrating a state in which a semiconductor laser device is junction-down mounted, the side on which a substrate is located with respect to a semiconductor layer stacked on the substrate is referred to as "above".

In the embodiments described below, "thickness" and "height" each denote the length in the Z-axis direction.

Structures in which n-type and p-type in the embodiments described below are interchanged are also included in the present disclosure. In the present disclosure, one of n-type and p-type is referred to as "one conductivity type", and the other one of n-type and p-type as "other conductivity type".

Embodiment 1

[Structure]

A structure of a semiconductor laser apparatus according to Embodiment 1 will be described below, with reference to FIG. 1 and FIG. 2.

FIG. 1 is a sectional diagram illustrating semiconductor laser device 100 according to Embodiment 1. FIG. 2 is a sectional diagram illustrating semiconductor laser apparatus 200 according to Embodiment 1. Specifically, FIG. 2 illustrates semiconductor laser apparatus 200 in which semiconductor laser device 100 according to Embodiment 1 is junction down mounted on submount 12. That is, the semiconductor laser device illustrated in FIG. 2 is in a state in which semiconductor laser device 100 illustrated in FIG. 1 is flipped vertically.

Figure 2:
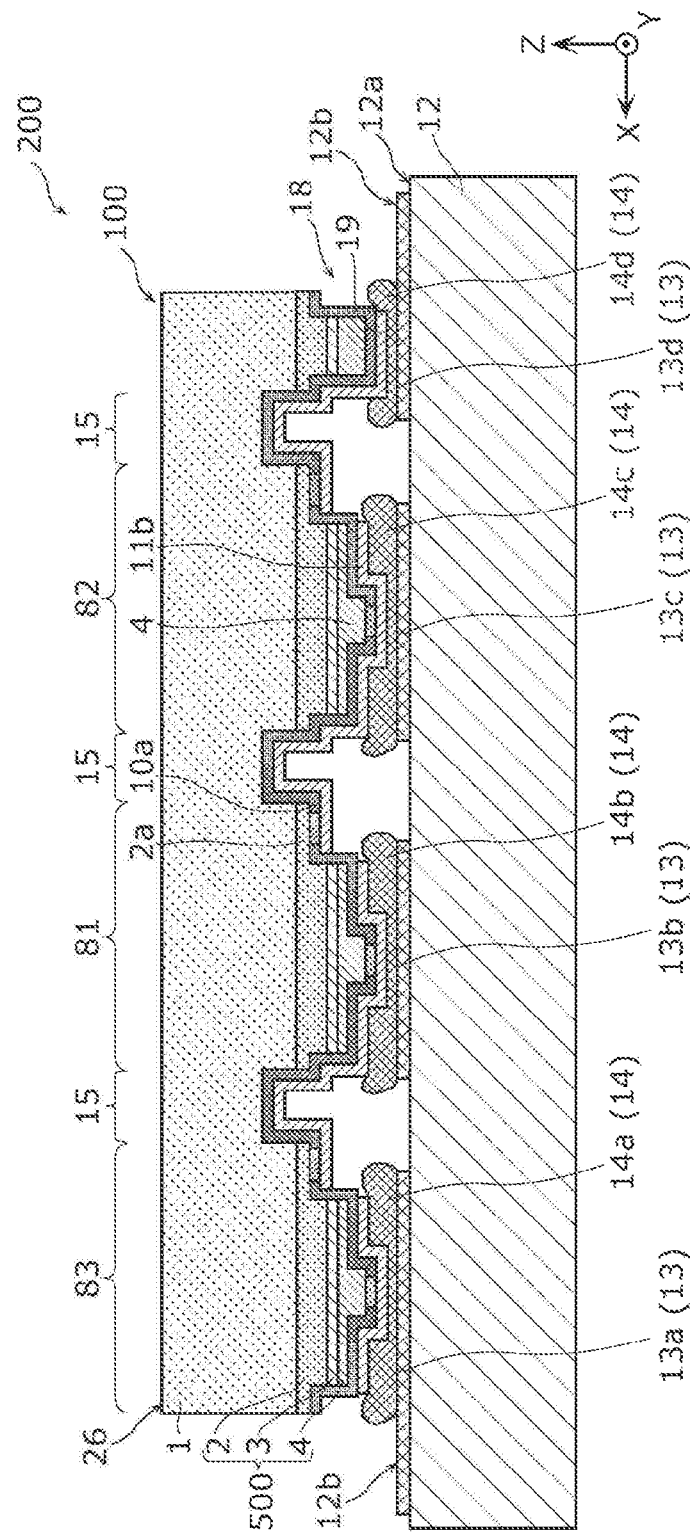
FIG. 2 is a sectional diagram illustrating a semiconductor laser apparatus according to Embodiment 1.

As illustrated in FIG. 2, semiconductor laser apparatus 200 includes semiconductor laser device 100 and submount 12.

Semiconductor laser apparatus 200 is an apparatus including semiconductor laser device 100 that is junction-down mounted on a base material such as submount 12.

Semiconductor laser device 100 includes first light-emitting device region 81 and second light-emitting device region 82 formed separately on substrate 1, and is particularly suitable for junction-down mounting. Semiconductor laser device 100 emits laser light from luminous point 28 of each of first light-emitting device region 81 and second light-emitting device region 82. In this embodiment, semiconductor laser device 100 is a semiconductor laser array device having a plurality of ridge portion 16 (in other words, ridge stripes or waveguides). In this embodiment, semiconductor laser device 100 includes three light-emitting device regions 81, 82, and 83 each having one ridge portion 16. In this embodiment, second light-emitting device region 82, first light-emitting device region 81, and third light-emitting device region 83 are arranged in this order. Second light-emitting device region 82 is located outermost in the direction in which the plurality of light-emitting device regions 8 are arranged (i.e. located at an end of the plurality of light-emitting device regions 8).

In the following description, the plurality of light-emitting device regions 81, 82, and 83 included in semiconductor laser device 100 are also collectively referred to as "light-emitting device region 8" unless they are distinguished.

N-type semiconductor layer 2a located in first light-emitting device region 81, n-type semiconductor layer 2b located in second light-emitting device region 82, and n-type semiconductor layer 2c located in third light-emitting device region 83 are also collectively referred to as "n-type semiconductor layer 2" unless they are distinguished. First electrode film 10a located in first light-emitting device region 81, first electrode film 10b located in second light-emitting device region 82, and first electrode film 10c located in third light-emitting device region 83 are also collectively referred to as "first electrode film 10" unless they are distinguished. Second electrode film 11a located in first light-emitting device region 81, second electrode film 11b located in second light-emitting device region 82, and second electrode film 11c located in third light-emitting device region 83 are also collectively referred to as "second electrode film 11" unless they are distinguished.

As illustrated in FIG. 1, semiconductor laser device 100 includes substrate 1, stack structure 500, insulating film (second insulating film) 5, n-side electrode (one-conductivity-type semiconductor layer-side electrode) 6, p-side electrode (semiconductor layer electrode of the other conductivity type) 7, first electrode film 10, and second electrode film 11. Specifically, semiconductor laser apparatus 200 has the plurality of light-emitting device regions 8, an each of the plurality of light-emitting device regions 8 includes substrate 1, stack structure 500, insulating film 5, n-side electrode 6, p-side electrode 7, first electrode film 10, and second electrode film 11.

The plurality of light-emitting device regions 8 have common substrate 1. In this embodiment, semiconductor laser device 100 includes three light-emitting device regions 8, namely, first light-emitting device region 81, second light-emitting device region 82, and third light-emitting device region 83. The number of light-emitting device regions 8 included in semiconductor laser device 100 may be two, or four or more, as long as the number is more than one.

Substrate 1 is a growth substrate for forming n-type semiconductor layer (one conductivity-type semiconductor layer) 2, active layer 3, and p-type semiconductor layer (other-conductivity-type semiconductor layer) 4 included in stack structure 500. The thickness of substrate 1 is, for example, 80 μm or more and 400 μm or less. This can prevent substrate 1 from warping.

The surface of substrate 1 opposite to the stack surface on which the semiconductor layers such as n-type semiconductor layer 2, active layer 3, and p-type semiconductor layer 4 are formed is polished surface 26. In other words, polished surface 26 is exposed on the side of substrate 1 opposite to the stack surface on which stack structure 500 is formed.

Polished surface 26 is a surface that has been polished, and has low surface roughness. Polished surface 26 accordingly resists scattering of light. Hence, in the case where substrate 1 is a member having translucency in a visible range, the inside of semiconductor laser device 100 is visible from the substrate 1 side.

Stack structure 500 is a semiconductor layer including n-type semiconductor layer 2, active layer 3, and p-type semiconductor layer 4.

N-type semiconductor layer 2 is a semiconductor layer that is formed on substrate 1.

Active layer 3 is a semiconductor layer that is formed on n-type semiconductor layer 2 and generates laser light.

P-type semiconductor layer 4 is a semiconductor layer that is formed on active layer 3.

Thus, n-type semiconductor layer 2 and p-type semiconductor layer 4 are arranged in laminae on substrate 1 so as to sandwich active layer 3 from below and above. In this way, laser light generated in active layer 3 is confined in the vertical direction by n-type semiconductor layer 2 and p-type semiconductor layer 4.

Insulating film 5 is a film for insulating the semiconductor layers such as n-type semiconductor layer 2, active layer 3, and p-type semiconductor layer 4 so as not to be electrically connected to, for example, members such as submount 12 illustrated in FIG. 2. Insulating film 5 is continuously formed from the side surface of ridge portion 16 through to flat portion 16c of p-type semiconductor layer 4. Insulating film 5 is also formed from flat portion 16c of p-type semiconductor layer 4 through to side wall portion 16b of active layer 3 and n-type semiconductor layer 2 and the upper surface of n-type semiconductor layer 2.

N-side electrode 6 is an electrode in contact with the upper surface of n-type semiconductor layer 2. N-side electrode 6 is in contact with first electrode film 10.

P-side electrode 7 is an electrode in contact with the upper surface of ridge portion 16 of p-type semiconductor layer 4. P-side electrode 7 is in contact with second electrode film 11 above ridge portion 16.

First electrode film 10 is a metal film formed in contact with n-side electrode 6.

The thickness of first electrode film 10 is, for example, 0.5 μm or more. This can reduce the voltage applied to semiconductor laser device 100. Accordingly, heat generation in first electrode film 10 can be suppressed, with it being possible to improve the laser light output characteristics and stabilize the laser light output.

Second electrode film 11 is a metal film formed in contact with p-side electrode 7.

First electrode film 10a located in first light-emitting device region 81 and second electrode film 11b located in second light-emitting device region 82 are electrically connected to each other. In this embodiment, first electrode film 10a located in first light-emitting device region 81 and second electrode film 11b located in second light-emitting device region 82 form one continuous electrode film. That is, first electrode film 10a located on n-type semiconductor layer 2a in first light-emitting device region 81 and second electrode film 11b located on p-type semiconductor layer 4 in second light-emitting device region 82 form the same continuous film.

Thus, in semiconductor laser device 100, first electrode film 10 and second electrode film 11 in adjacent light-emitting device regions 8 are electrically connected to each other. In this way, the plurality of light-emitting device regions 8 included in semiconductor laser device 100 are electrically connected in series.

Semiconductor laser device 100 has separation region 15 between adjacent light-emitting device regions 8.

Separation region 15 is a region for separating respective n-type semiconductor layers 2 in adjacent light-emitting device regions 8. For example, separation region 15 is located between first light-emitting device region 81 and second light-emitting device region 82, and separates n-type semiconductor layer 2a in first light-emitting device region 81 and n-type semiconductor layer 2b in second light-emitting device region 82. In this embodiment, separation region 15 has groove portion 9 that is a groove provided in substrate 1. Hence, for example, in the case where substrate 1 has insulation property, respective n-type semiconductor layers 2 in adjacent light-emitting device regions 8 are electrically connected only via first electrode film 10 and second electrode film 11. In groove portion 9, insulating film 5 and an electrode film integrally formed with first electrode film 10a in first light-emitting device region 81 and second electrode film 11b in second light-emitting device region 82 are stacked in this order. In other words, insulating film 5 and the electrode film are formed across first light-emitting device region 81, separation region 15, and second light-emitting device region 82.

Semiconductor laser device 100 includes protrusion structure 18.

Protrusion structure 18 is a projection for making the height of semiconductor laser device 100 equal with respect to submount 12. The height (the length in the Z-axis direction in this embodiment) of protrusion structure 18 from the stack surface of substrate 1 is the same as the height of light-emitting device region 8 from the stack surface of substrate 1. For example, protrusion structure 18 is located at a side end (i.e. an end in the X-axis direction) with respect to the plurality of light-emitting device regions 8, in the arrangement direction of the plurality of light-emitting device regions 8 (the X-axis direction in this embodiment). In this embodiment, protrusion structure 18 is located at the X-axis positive side end in semiconductor laser device 100, adjacent to second light-emitting device region 82 which is located endmost of the plurality of light-emitting device regions 8 in the arrangement direction of the plurality of light-emitting device regions 8. Specifically, protrusion structure 18 is located adjacent to second light-emitting device region 82 and on the opposite side of second light-emitting device region 82 to first light-emitting device region 81, and protrudes from substrate 1.

Thus, semiconductor laser device 100 includes a plurality of (specifically, three) light-emitting device regions 8, and second light-emitting device region 82 is located endmost of the plurality of light-emitting device regions 8 in the arrangement direction of the plurality of light-emitting device regions 8. Protrusion structure 18 is located endmost in the arrangement direction of protrusion structure 18 and the plurality of light-emitting device regions 8.

The height of protrusion structure 18 from the stack surface of substrate 1 is, for example, approximately the same as the height of light-emitting device region 8 from the stack surface of substrate 1.

Protrusion structure 18 includes third electrode film 19 electrically connected to insulating film 5 and n-side electrode 6. Insulating film 5 formed on the surface of protrusion structure 18 is continuous with insulating film 5 formed from the upper surface of n-type semiconductor layer 2b in second light-emitting device region 82 through to separation region 15, and covers the side surface of protrusion structure 18 on the side opposite to second light-emitting device region 82. Third electrode film 19 located on the surface of protrusion structure 18 (the surface on the side opposite to substrate 1 in this embodiment) with insulating film 5 therebetween and n-type semiconductor layer 2b in second light-emitting device region 82 are electrically connected to each other. In this embodiment, third electrode film 19 and first electrode film 10 located in light-emitting device region 8 adjacent to protrusion structure 18 are formed as one electrode film. Specifically, third electrode film 19 is integrally formed with the electrode film in separation region 15 and first electrode film 10b in second light-emitting device region 82.

In this embodiment, stack structure 500 is formed in protrusion structure 18 as in light-emitting device region 8, for the below-described manufacturing method. Protrusion structure 18 may or may not have stack structure 500.

As illustrated in FIG. 2, submount 12 is a substrate having mounting surface 12a on which semiconductor laser device 100 is mounted. Specifically, semiconductor laser device 100 is junction-down mounted on submount 12. More specifically, semiconductor laser device 100 is junction-down mounted on mounting surface (mount surface) 12a of submount 12 on which metal films 13a, 13b, 13c, and 13d are formed, with joining materials 14a, 14b, 14c, and 14b therebetween.

In the following description, metal films 13a, 13b, 13c, and 13d are also collectively referred to as "metal film 13" unless they are distinguished, and joining materials 14a, 14b, 14c, and 14d are also collectively referred to as "joining material 14" unless they are distinguished.

The plurality of metal films 13 are formed on mounting surface 12a of submount 12. Semiconductor laser device 100 is junction-down mounted on mounting surface 12a of submount 12 so that second electrode film 11 and third electrode film 19 are connected to the plurality of metal films 13 formed on mounting surface 12a of submount 12 via joining materials 14.

Metal films 13 and joining materials 14 are located on mounting surface 12a of submount 12.

Metal films 13 are metal wiring patterns located on submount 12. For example, metal wires (not illustrated) for receiving power supply from outside are connected to bonding surfaces 12b of metal films 13a and 13d. Semiconductor laser device 100 is supplied with power via the metal wires.

Metal films 13a, 13b, 13c, and 13d are not in contact with one another, and are electrically independent of one another. For example, metal film 13a is connected to third light-emitting device region 83 via joining material 14a. Specifically, metal film 13a is electrically connected to third light-emitting device region 83 as a result of being joined to second electrode film 11c by joining material 14a, and is bonded to third light-emitting device region 83. Metal film 13b is connected to first light-emitting device region 81 via joining material 14b. Metal film 13c is connected to second light-emitting device region 82 via joining material 14c. Metal film 13d is connected to protrusion structure 18 as a result of joining material 14d and third electrode film 19 being joined to each other. Thus, the number of metal films 13 formed on submount 12 is greater than the number of light-emitting device regions 8 included in semiconductor laser device 100 by the number of protrusion structures 18. The plurality of light-emitting device regions 8 are, for example, each connected to different metal film 13.

For example, metal films 13a and 13d may be each connected to a via electrode that passes through submount 12 from mounting surface 12a of submount 12 on which semiconductor laser device 100 is mounted to the back surface opposite to mounting surface 12a, and connected to an electrode on the back surface. That is, metal films 13a and 13d may be electrodes not routed as wiring on the surface of submount 12. Only one of metal films 13a and 13d may be connected to the via electrode. For example, only metal film 13d may be connected to the via electrode.

For example, the number of metal films 13 is greater than the number of light-emitting device regions 8 included in semiconductor laser device 100 by 1. In this embodiment, the number of light-emitting device regions 8 included in semiconductor laser device 100 is 3, and the number of metal films 13 is 4. The plurality of light-emitting device regions 8 are, for example, each connected to different metal film 13. Metal film 13 not connected to any of the plurality of light-emitting device regions 8 is connected to protrusion structure 18 (specifically, third electrode film 19). In this embodiment, semiconductor laser device 100 has three light-emitting device regions 8, and four metal films 13 are formed on mounting surface 12a of submount 12.

Each joining material 14 is a member for connecting semiconductor laser device 100 and submount 12. More specifically, joining material 14 electrically connects metal film 13 to n-side electrode 6 or p-side electrode 7 and also bonds metal film 13 to n-side electrode 6 or p-side electrode 7.

For example, joining material 14 is solder.

[Effects, Etc.]

As described above, semiconductor laser apparatus 200 according to Embodiment 1 is a semiconductor laser apparatus including semiconductor laser device 100 for junction-down mounting that includes first light-emitting device region 81 and second light-emitting device region 82 formed separately on substrate 1. Semiconductor laser device 100 has stack structure 500 in which n-type semiconductor layer 2, active layer 3, and p-type semiconductor layer 4 are stacked in this order in each of first light-emitting device region 81 and second light-emitting device region 82. First light-emitting device region 81 has first electrode film 10 located on n-type semiconductor layer 2. Second light-emitting device region 82 has second electrode film 11 located on p-type semiconductor layer 4. First electrode film 10a and second electrode film 11b are electrically connected to each other.

With such a structure, the plurality of light-emitting device regions 8 are electrically connected in series. Therefore, the drive current of semiconductor laser apparatus 200 is reduced as compared with the case where the plurality of light-emitting device regions 8 are connected in parallel.

Semiconductor laser device 100 has the plurality of luminous points 28. This enables semiconductor laser apparatus 200 to emit laser light of high light output.

In semiconductor laser apparatus 200, semiconductor laser device 100 is junction-down mounted on submount 12. This improves heat dissipation as compared with the case where semiconductor laser device 100 is junction-up mounted.

In this embodiment, n-side electrode 6 in one of adjacent light-emitting device regions 8 and p-side electrode 7 in the other one of adjacent light-emitting device regions 8 are electrically connected by one metal film 13. Specifically, for example, first electrode film 10a located on n-type semiconductor layer 2a in first light-emitting device region 81, the electrode film in separation region 15, and second electrode film 11b located on p-type semiconductor layer 4 in second light-emitting device region 82 are the same continuous film.

Light-emitting device region 8 is, for example, a region that is defined by the maximum width of n-type semiconductor layer 2 in substrate 1 and stack structure 500, in a sectional view. Separation region 15 is, for example, a region at which n-type semiconductor layer 2 is separated and that is defined by the open width of groove portion 9 formed in substrate 1, in a sectional view. First electrode film 10 and second electrode film 11 in light-emitting device region 8 are, for example, electrode films located on the upper surface and side surface of stack structure 500, in a sectional view. The electrode film located on the bottom surface and side surface of groove portion 9 provided in substrate 1 is the electrode film in separation region 15. Second insulating film 5 located on upper surface and side surface of stack structure 500 is second insulating film 5 in light-emitting device region 8, in a sectional view. Second insulating film 5 located on the bottom surface and side surface of groove portion 9 provided in substrate 1 is second insulating film 5 in separation region 15. Light-emitting device region 8 and separation region 15 illustrated in FIG. 1 are regions in substrate 1 and stack structure 500. In the other drawings, too, the light-emitting device region and the separation region are regions in the substrate and the stack structure.

Conventionally, due to narrow spacing between adjacent metal films 13 formed on mounting surface 12a of submount 12, adjacent metal films 13 short out in the case where misalignment in mounting in the width direction of semiconductor laser device 100 (the X-axis direction in this embodiment) occurs.

Moreover, for example in the field of material processing where semiconductor laser apparatus 200 is used, demand for higher light output of laser light is growing recently from the viewpoint of improving the processing speed. To obtain light output of watts, the resonator length of laser light needs to be increased. In detail, the resonator length needs to be increased by increasing the dimension of semiconductor laser device 100 in the laser light emission direction (the Y-axis direction in this embodiment). An increase in resonator length further facilitates shortening of adjacent metal films 13 by joining material 14 due to misalignment in mounting.

In a conventional semiconductor laser apparatus having only single luminous point 28, it is difficult to obtain high light output of some tens to hundreds of watts.

In view of this, in semiconductor laser apparatus 200 according to the present disclosure, n-side electrode 6 and p-side electrode 7 in adjacent light-emitting device region 8 are electrically connected in semiconductor laser device 100.

Therefore, all light-emitting device regions 8 can be energized with no need to bring the part of the electrode film located in the plurality of light-emitting device regions 8 and covering n-side electrode 6 into contact with metal film 13 on submount 12.

Moreover, with such a structure, there is no need to directly connect both n-side electrode 6 and p-side electrode 7 to metal film 13 on submount 12, so that the spacing between metal film 13 can be widened. Hence, a structure in which adjacent metal films 13 are prevented from shorting out in the case of misalignment in mounting can be realized.

There is also no need to provide a joining member for compensating for the height difference between p-side electrode 7 and n-side electrode 6. Cost reduction can thus be achieved.

For example, no wire bonding is needed to electrically connect first electrode film 10a and second electrode film 11b. Hence, semiconductor laser apparatus 200 can be manufactured at lower costs than in the case where first electrode film 10a and second electrode film 11b are electrically connected by wire bonding.

For example, separation region 15 at which n-type semiconductor layer 2a in first light-emitting device region 81 and n-type semiconductor layer 2b in second light-emitting device region 82 are separated is located between first light-emitting device region 81 and second light-emitting device region 82.

With such a structure, current leakage to adjacent light-emitting device region 8 through n-type semiconductor layer 2 can be prevented.

For example, protrusion structure 18 protruding from substrate 1 is located adjacent to second light-emitting device region 82 and on the opposite side of second light-emitting device region 82 to first light-emitting device region 81. In this embodiment, semiconductor laser device 100 includes a plurality of (specifically, three) light-emitting device regions 8, and second light-emitting device region 82 is located endmost of the plurality of light-emitting device regions 8 in the arrangement direction of the plurality of light-emitting device regions 8. Protrusion structure 18 is located endmost in the arrangement direction of protrusion structure 18 and the plurality of light-emitting device regions 8. The height of protrusion structure 18 from substrate 1 (more specifically, the stack surface) is, for example, approximately the same as the height of second light-emitting device region 82 from substrate 1. Third electrode film 19 located on the surface of protrusion structure 18 (the surface on the side opposite to substrate 1 in this embodiment) and n-type semiconductor layer 2b in second light-emitting device region 82 are electrically connected to each other.

With such a structure, when mounting semiconductor laser device 100 on submount 12, an additional member such as an Au bump for compensating for the gap in the Z-axis direction is not needed in order to electrically connect n-side electrode 6 in second light-emitting device region 82 and metal film 13 on submount 12. This eases mounting.

For example, protrusion structure 18 is located adjacent to second light-emitting device region 82, only on the side opposite to first light-emitting device region 81. Specifically, for example, protrusion structure 18 is formed adjacent to second light-emitting device region 82 in semiconductor laser device 100, and located only on the opposite side of second light-emitting device region 82 to first light-emitting device region 81 in the arrangement direction of the plurality of light-emitting device regions 8.

For example, protrusion structure 18 may be located adjacent to both ends of the plurality of light-emitting device regions 8 in the arrangement direction of the plurality of light-emitting device regions 8. However, as Jong as the height of protrusion structure 18 from substrate 1 is approximately the same as the height of second light-emitting device region 82 from substrate 1, n-side electrode 6 in second light-emitting device region 82 and metal film 13 on submount 12 can be electrically connected when protrusion structure 18 is located adjacent to second light-emitting device region 82 and only on the opposite side of second light-emitting device region 82 to first light-emitting device region 81. Thus, the size of semiconductor laser device 100 can be reduced as compared with the case where protrusion structure 18 is located at both ends of the plurality of light-emitting device regions 8. This can simplify the structure of semiconductor laser device 100.

For example, semiconductor laser apparatus 200 further includes submount 12 having mounting surface 12a on which the plurality of metal films 13 (specifically, metal film 13b (first metal film) and metal film 13c (second metal film)) are formed. First light-emitting device region 81 and second light-emitting device region 82 in semiconductor laser device 100 are, for example, respectively joined to metal film 13b and metal film 13c. That is, for example, semiconductor laser device 100 is junction-down mounted on mounting surface 12a of submount 12, second electrode film 11a is joined to metal film 13b, and second electrode film 11b is joined to metal film 13c.

With such a structure, as a result of semiconductor laser device 100 being junction-down mounted on submount 12, heat generated from semiconductor laser device 100 during laser drive (during light emission) can be efficiently dissipated to submount 12. This stabilizes the optical characteristics (laser characteristics) of semiconductor laser apparatus 200. Moreover, failures and the like caused by heat generation in semiconductor laser device 100 in semiconductor laser apparatus 200 can be prevented. The reliability of semiconductor laser apparatus 200 can thus be improved.

For example, semiconductor laser device 100 includes the plurality of light-emitting device regions 8 including first light-emitting device region 81 and second light-emitting device region 82. For example, submount 12 includes the plurality of metal films 13 including metal film 13b and metal film 13c. The plurality of light-emitting device regions 8 are connected to respective metal films 13 from among the plurality of metal films 13. For example, when the number of light-emitting device regions 8 is n (where n is a natural number of 2 or more), the number of metal films 13 is n+1.

Light-emitting device regions 8 and protrusion structure 18 in semiconductor laser device 100 are in contact with submount 12. Accordingly, as a result of the number of metal films 13 formed on submount 12 being greater than the number of light-emitting device regions 8 included in semiconductor laser device 100 by 1, the plurality of light-emitting device regions 8 and protrusion structure 18 can be each connected to different metal film 13.

For example, polished surface 26 is exposed on the surface of substrate 1 opposite to the surface on which first light-emitting device region 81 and second light-emitting device region 82 are formed.

With such a structure, for example, the use of a transparent substrate such as gallium nitride as substrate 1 eases visual observation of the light emission state in active layer 3.

For example, the thickness of first electrode film 10 is 0.5 μm or more.

With such a structure, the drive voltage of semiconductor laser device 100 can be further reduced. Consequently, heat generation in first electrode film 10 can be reduced. This improves or stabilizes the laser characteristics of semiconductor laser device 100. In addition, blowout caused by heat generation in metal film 13 can be prevented.

For example, the thickness of substrate 1 is 80 μm or more and 400 μm or less.

With such a structure, warpage of semiconductor laser device 100 can be reduced, so that the thickness of joining material 14 between each light-emitting device region 8 and submount 12 can be made uniform. This makes heat dissipation in each light-emitting device region 8 uniform, with it being possible to make the laser characteristics of each light-emitting device region 8 uniform.

Moreover, the difference in height between luminous points 28 with respect to mounting surface 12a of submount 12 can be reduced. Consequently, for example, each of a plurality of laser light beams emitted from semiconductor laser apparatus 200 can be easily coupled to an optical member such as a lens (not illustrated).

[Variation]

A variation of the semiconductor laser apparatus according to Embodiment 1 will be described below. In the variation described below, the differences from the structural elements included in semiconductor laser apparatus 200 according to Embodiment 1 will be mainly described while simplifying or omitting the description of the same structural elements as in semiconductor laser apparatus 200 as appropriate.

[Variation 1]

Figure 3:
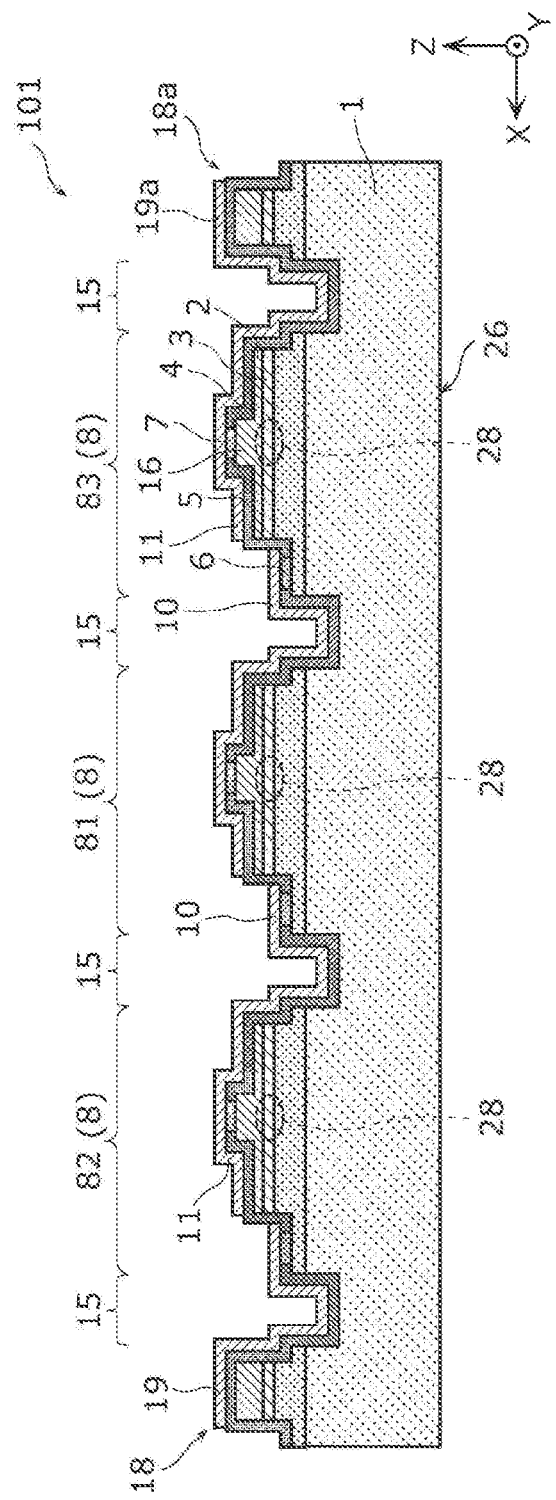
FIG. 3 is a sectional diagram illustrating a semiconductor laser device according to Variation 1 of Embodiment 1.

FIG. 3 is a sectional diagram illustrating semiconductor laser device 101 according to Variation 1 of Embodiment 1. A semiconductor laser apparatus according to Variation 1 of Embodiment 1 differs from semiconductor laser apparatus 200 according to Embodiment 1 only in the structure of semiconductor laser device 100.

Specifically, as illustrated in FIG. 3, semiconductor laser device 101 differs from semiconductor laser device 100 in that protrusion structure 18a is included. More specifically, semiconductor laser device 101 includes two protrusion structures 18 and 18a on both sides in a direction orthogonal to the laser light emission direction in a top view. In this embodiment, semiconductor laser device 101 includes protrusion structure 18 at one end on the X-axis positive side, and protrusion structure 18a on the X-axis negative side. Protrusion structure 18a includes insulating film 5 and third electrode film 19a, as in protrusion structure 18. Insulating film 5 formed on the surface of protrusion structure 18a is continuous with insulating film 5 formed from the upper surface of p-type semiconductor layer 4 in third light-emitting device region 83 through to separation region 15, and covers the side surface of protrusion structure 18a on the side opposite to third light-emitting device region 83. Third electrode film 19a formed on the surface of protrusion structure 18a with insulating film 5 therebetween is continuous with second electrode film 11c in third light-emitting device region 83. Third electrode film 19a is connected to a metal film (not illustrated) formed on submount 12 (for example, see FIG. 2). In this case, the number of metal films 13 (for example, see FIG. 2) formed on submount 12 is the sum (five in this embodiment) of the number of light-emitting device regions and the number of protrusion structures 18 and 18a. In other words, when the number of light-emitting device regions is n, the number of metal films 13 is n+2. Alternatively, the metal film connected to third light-emitting device region 83 and the metal film connected to protrusion structure adjacent to third light-emitting device region 83 may be one continuous metal film. In third light-emitting device region 83, second electrode film 11c connected to p-side electrode 7 is located closer to protrusion structure 18a than first electrode film 10c connected to n-side electrode 6 is.

With such a structure, when semiconductor laser device 101 is junction-down mounted on submount 12, the heights of both ends of semiconductor laser device 101 can be easily made equal by two protrusion structures 18 and 18a, so that tilting can be avoided. Hence, misalignment in the height direction between the plurality of luminous points 28 can be prevented.

Embodiment 2

A semiconductor laser apparatus according to Embodiment 2 will be described below. In the description of the semiconductor laser apparatus according to Embodiment 2, the differences from semiconductor laser apparatus 200 according to Embodiment 1 will be mainly described while giving, to the same structural elements as in semiconductor laser apparatus 200 according to Embodiment 1, the same reference marks and simplifying or omitting their description as appropriate.

[Structure]

Figure 4:
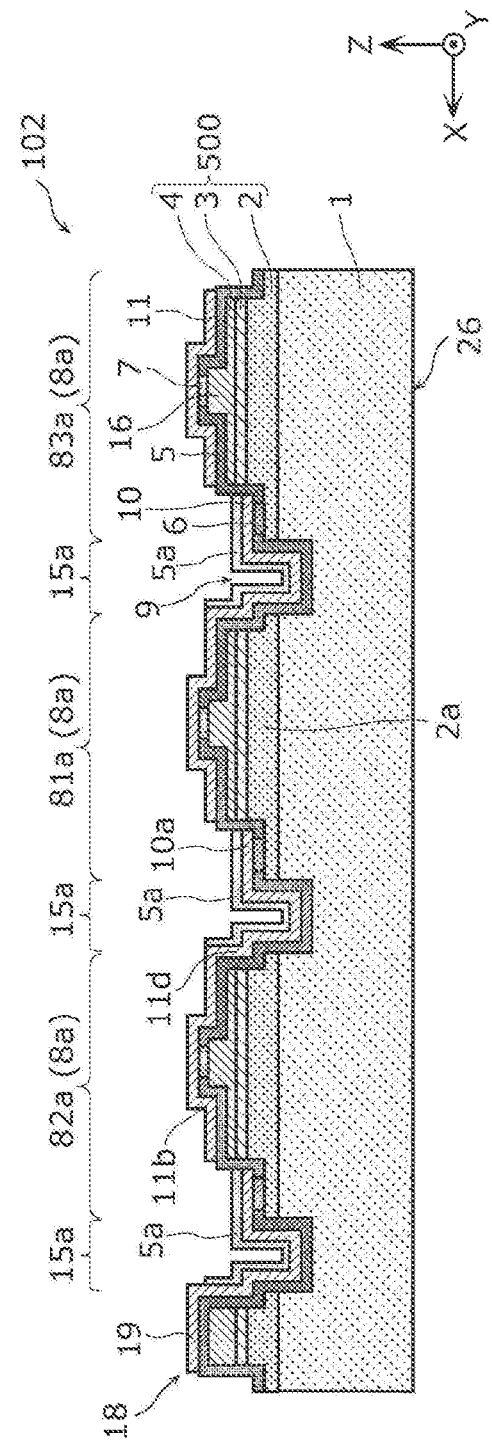
FIG. 4 is a sectional diagram illustrating a semiconductor laser device according to Embodiment 2.
Figure 5:
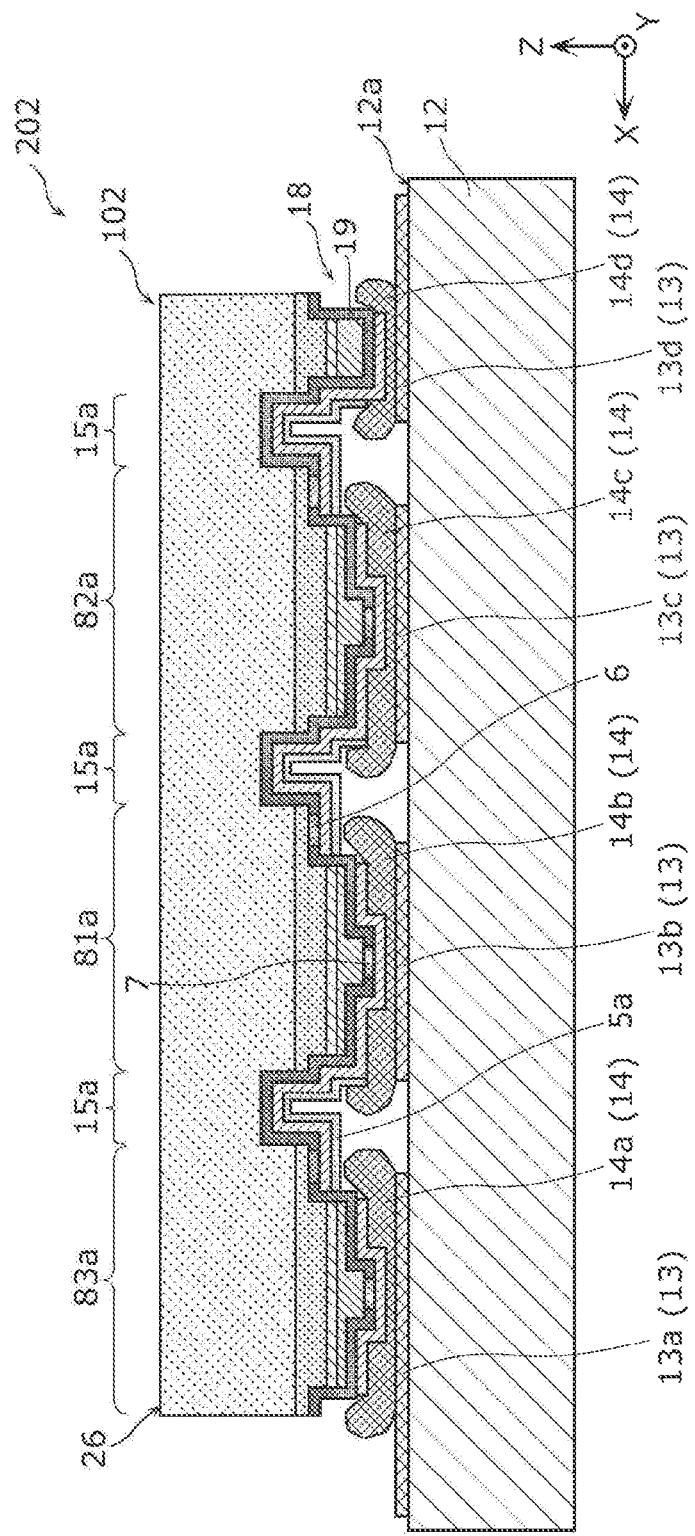
FIG. 5 is a sectional diagram illustrating a semiconductor laser apparatus according to Embodiment 2.

FIG. 4 is a sectional diagram illustrating semiconductor laser device 102 according to Embodiment 2. FIG. 5 is a sectional diagram illustrating semiconductor laser apparatus 202 according to Embodiment 2.

In the following description, a plurality of light-emitting device regions 81a, 82a, and 83a included in semiconductor laser device 102 are also collectively referred to as "light-emitting device region 8a" unless they are distinguished.

As illustrated in FIG. 4 and FIG. 5, semiconductor laser device 102 included in semiconductor laser apparatus 202 further includes insulating film (first insulating film) 5a, in addition to the structure of semiconductor laser device 100 illustrated in FIG. 1 and FIG. 2. Specifically, the plurality of light-emitting device regions 8a differ from light-emitting device regions 8 in that they each further include insulating film 5a. Separation region 15a differs from separation region 15 in that insulating film 5a is formed continuously from light-emitting device region 8a.

Insulating film 5a is a film having insulation property and located on first electrode film 10 in each of the plurality of light-emitting device regions 8a. In this embodiment, insulating film 5a continuously covers insulating film 5 located on the side surface of stack structure 500 in first light-emitting device region 81a on the n-side electrode 6 side, first electrode film 10a in first light-emitting device region 81a, the electrode film in separation region 15, and part of second electrode film 11b in second light-emitting device region 82. More specifically, insulating film 5a continuously covers the part from first electrode film 10a in first light-emitting device region 81a through to side surface portion 11d of second electrode film 11b in second light-emitting device region 82a. In first light-emitting device region 81a, insulating film 5a completely covers first electrode film 10a and is in contact with insulating film 5 on the side surface of the semiconductor layers including active layer 3 between n-side electrode 6 and p-side electrode 7. Insulating film 5a does not cover the upper surface of second electrode film 11b in second light-emitting device region 82 and the upper surface of second electrode film 11a in first light-emitting device region 81.

Moreover, insulating film 5a continuously covers insulating film 5 located on the side surface of stack structure 500 in second light-emitting device region 82a on the n-side electrode 6 side, first electrode film 10 in second light-emitting device region 82a, the electrode film in separation region 15, and a side surface portion of third electrode film 19 on the second light-emitting device region 82a side. Insulating film 5a does not cover the upper surface of third electrode film 19 of protrusion structure 18.

[Effects, Etc.]

As described above, in semiconductor laser apparatus 202 according to Embodiment 2, insulating film 5a is located on first electrode film 10a in first light-emitting device region 81a. Insulating film 5a is located to overlap first electrode film 10a located in separation region 15a and n-type semiconductor layer 2a in first light-emitting device region 81a in a top view.

With such a structure, even in the case where joining material 14 moves toward n-side electrode 6 when semiconductor laser device 102 is junction-down mounted on submount 12, joining material 14 and n-side electrode 6 can be prevented from coming into contact with each other and being electrically connected, as illustrated in FIG. 5.

[Variation]

A variation of the semiconductor laser apparatus according to Embodiment 2 will be described below. In the variation described below, the differences from the structural elements included in semiconductor laser apparatus 202 according to Embodiment 2 will be mainly described while simplifying or omitting the description of the same structural elements as in semiconductor laser apparatus 202 as appropriate.

[Variation 1]

Figure 6:
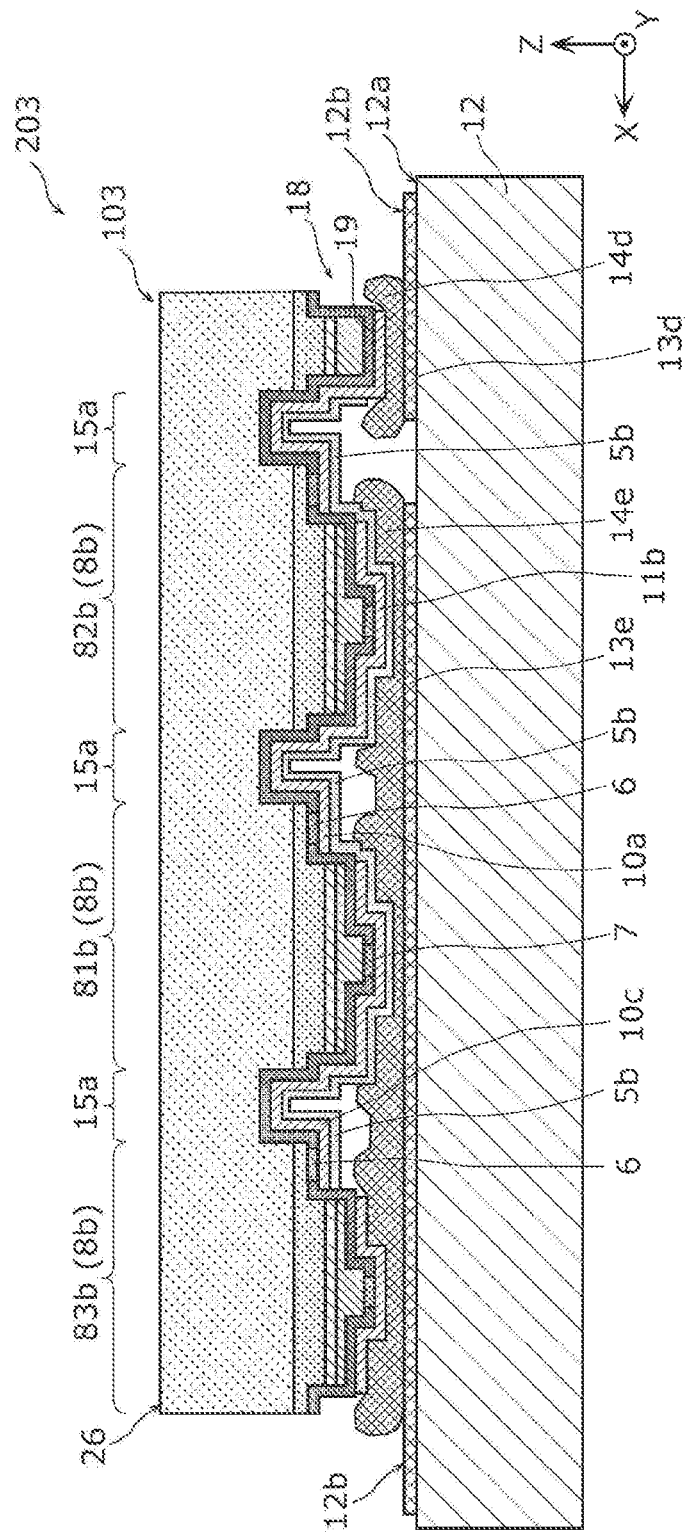
FIG. 6 is a sectional diagram illustrating a semiconductor laser apparatus according to Variation 1 of Embodiment 2.

FIG. 6 is a sectional diagram illustrating semiconductor laser apparatus 203 according to Variation 1 of Embodiment 2.

In the following description, a plurality of light-emitting device regions 81b, 82b, and 83b included in semiconductor laser device 103 are also collectively referred to as "light-emitting device region 8b" unless they are distinguished.

As illustrated in FIG. 6, semiconductor laser device 103 includes insulating film (first insulating film) 5b.

Insulating film 5b is a film having insulation property and located on first electrode film 10 in first light-emitting device region 81b.

In Variation 1, insulating film 5b continuously covers insulating film 5 located on the side surface of stack structure 500 in third light-emitting device region 83b on the n-side electrode 6 side, first electrode film 10c in third light-emitting device region 83b, separation region 15, and the whole of second electrode film 11b in second light-emitting device region 82b, unlike insulating film 5a. More specifically, insulating film 5b continuously covers the whole of first electrode film 10a in first light-emitting device region 81b and second electrode film 11b in second light-emitting device region 82b completely.

Moreover, in Variation 1, insulating film 5b continuously covers first electrode film 10c in contact with n-side electrode 6 in light-emitting device region 8b (third light-emitting device region 83b in this embodiment) that is connected to submount 12 and located at one side end in the arrangement direction of the plurality of light-emitting device regions 8b and to which power is applied from outside, through to part of third electrode film 19 in protrusion structure 18 that is located at the other side end in the arrangement direction of the plurality of light-emitting device regions 8b to which power is applied from outside. In third light-emitting device region 83b located at one side end in the arrangement direction of the plurality of light-emitting device regions 8b, insulating film 5b completely covers first electrode film 10c and is also in contact with insulating film 5 on the side surface of the semiconductor layers including active layer 3 between n-side electrode 6 and p-side electrode 7.

With such a structure, even in the case where joining material 14e moves toward n-side electrode 6 when semiconductor laser device 103 is junction-down mounted on submount 12, joining material 14e and n-side electrode 6 can be prevented from coming into contact with each other and being electrically connected, as illustrated in FIG. 6.

In addition, only one p-side electrode 7 from among respective p-side electrodes 7 in the plurality of light-emitting device regions 8b is electrically connected to metal film 13e. Accordingly, for example, metal film 13e located below the plurality of light-emitting device regions 8b may be formed continuously, i.e. as one metal film 13e, on mounting surface 12a of submount 12, like metal film 13e formed on mounting surface 12a of submount 12 as illustrated in FIG. 6.

Joining material 14e need not be separate for each light-emitting device region 8b, for example, unlike joining materials 14a to 14c illustrated in FIG. 5. As illustrated in FIG. 6, the plurality of light-emitting device regions 8b may be connected to submount 12 by one joining material 14e.

Embodiment 3

A semiconductor laser apparatus according to Embodiment 3 will be described below. In the description of the semiconductor laser apparatus according to Embodiment 3, the differences from semiconductor laser apparatus 200 according to Embodiment 1 will be mainly described while giving, to the same structural elements as in semiconductor laser apparatus 200 according to Embodiment 1, the same reference marks and simplifying or omitting their description as appropriate.

[Structure]

Figure 7:
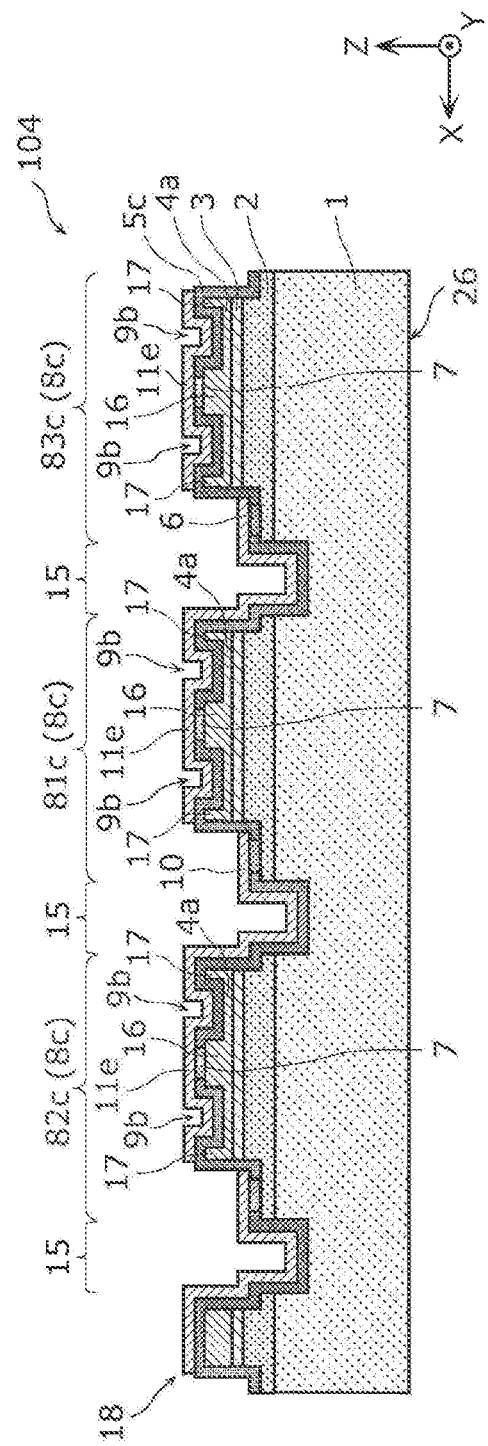
FIG. 7 is a sectional diagram illustrating a semiconductor laser device according to Embodiment 3.
Figure 8:
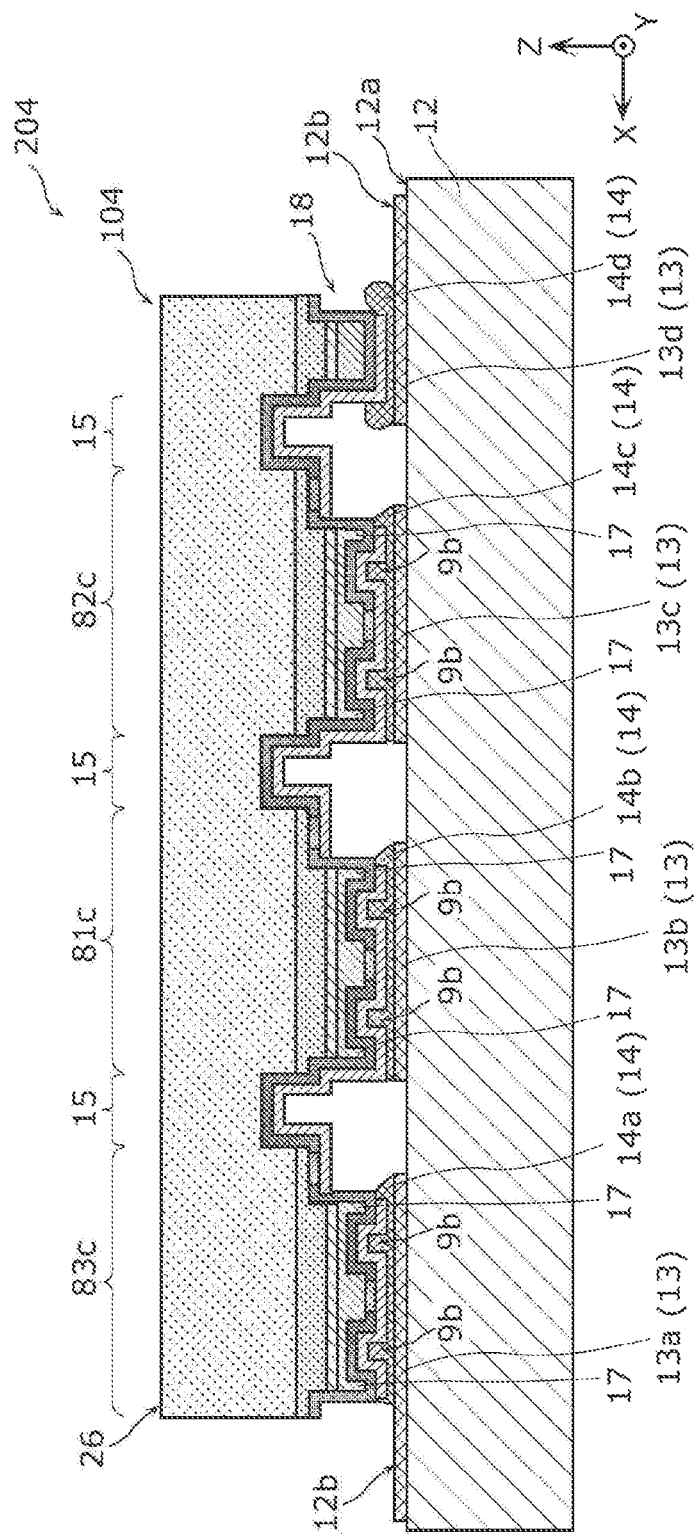
FIG. 8 is a sectional diagram illustrating a semiconductor laser apparatus according to Embodiment 3.

FIG. 7 is a sectional diagram illustrating semiconductor laser device 104 according to Embodiment 3. FIG. 8 is a sectional diagram illustrating semiconductor laser apparatus 204 according to Embodiment 3.

In the following description, a plurality of light-emitting device regions 81c, 82c, and 83c included in semiconductor laser device 104 are also collectively referred to as "light-emitting device region 8c" unless they are distinguished.

Semiconductor laser device 104 differs from semiconductor laser device 100 according to Embodiment 1 in the shape of p-type semiconductor layer 4a.

P-type semiconductor layer 4a includes protrusion portion 17 protruding upward. In the case where semiconductor laser device 104 is junction-down mounted on submount 12, protrusion portion 17 protrudes toward submount 12. In this embodiment, two protrusion portions 17 are formed at both ends of p-type semiconductor layer 4a in one light-emitting device region 8c.

Protrusion portion 17 in p-type semiconductor layer 4a protrudes in a direction opposite to substrate 1. Protrusion portion 17 extends in the resonance direction of semiconductor laser device 104 (the Y-axis direction in this embodiment).

Two protrusion portions 17 are formed with ridge portion 16 therebetween, in a sectional view of semiconductor laser device 104 in a direction orthogonal to the Y-axis direction. In other words, two protrusion portions 17 are formed with ridge portion 16 therebetween in a top view.

Insulating film (second insulating film) 5c is a film having insulation property and covering p-type semiconductor layer 4a without covering p-side electrode 7. Insulating film 5c is formed along the shape of p-type semiconductor layer 4a.

Second electrode film 11e is an electrode formed in contact with p-side electrode 7. Second electrode film 11e is formed on insulating film 5c along the shape of insulating film 5c, i.e. along the shape of p-type semiconductor layer 4a.

Consequently, groove portion 9b recessed to the substrate 1 side is formed in second electrode film 11e. That is, as a result of providing protrusion portion 17, a space formed by groove portion 9b is provided between ridge portion 16 and protrusion portion 17.

[Effects, Etc.]

As described above, in semiconductor laser device 104 according to Embodiment 3, ridge portion 16 is located in p-type semiconductor layer 4a in first light-emitting device region 81c, and two protrusion portions 17 are located away from and lateral to ridge portion 16, specifically, located to have ridge portion 16 therebetween in a top view, in first light-emitting device region 81c.

As a result of providing protrusion portion 17, a space formed by groove portion 9b is provided between ridge portion 16 and protrusion portion 17. Accordingly, in the case where semiconductor laser device 104 is junction-down mounted on submount 12, part of joining material 14 moves to the space between ridge portion 16 and protrusion portion 17. Thus, in the case where semiconductor laser device 104 is junction-down mounted on submount 12, joining material 14 is kept from moving toward first electrode film 10. Joining material 14 is therefore prevented from coming into contact with first electrode film 10 when semiconductor laser device 104 is mounted on submount 12.

[Variations]

Variations of the semiconductor laser apparatus according to Embodiment 3 will be described below. In the variations described below, the differences from the structural elements included in semiconductor laser apparatus 204 according to Embodiment 3 will be mainly described while simplifying or omitting the description of the same structural elements as in semiconductor laser apparatus 204 as appropriate.

[Variation 1]

Figure 9:
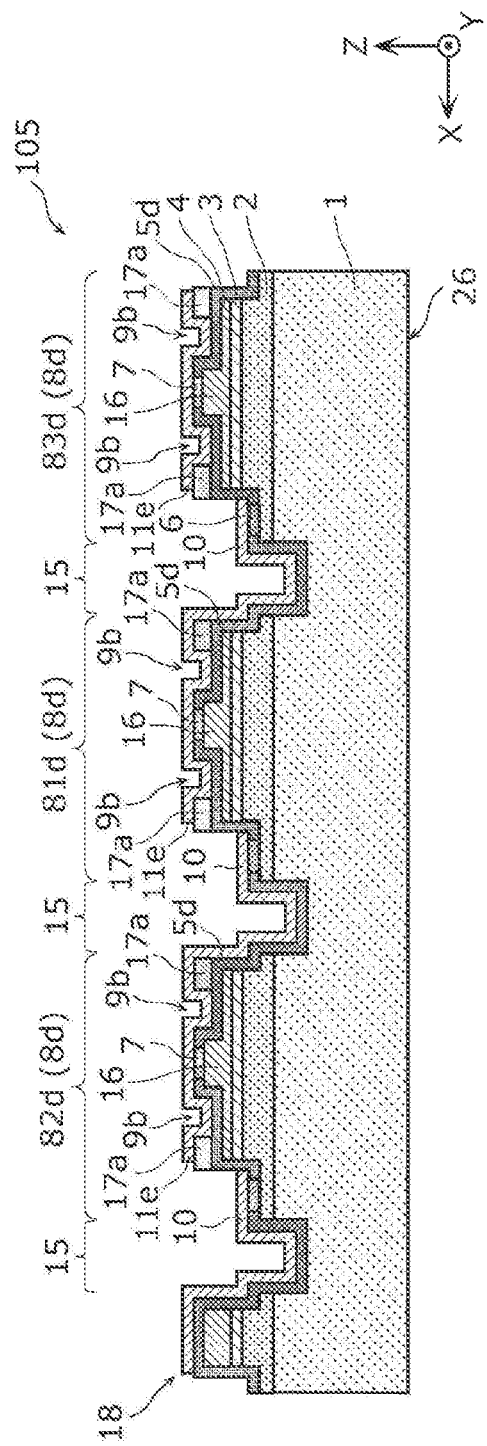
FIG. 9 is a sectional diagram illustrating a semiconductor laser device according to Variation 1 of Embodiment 3.
Figure 10:
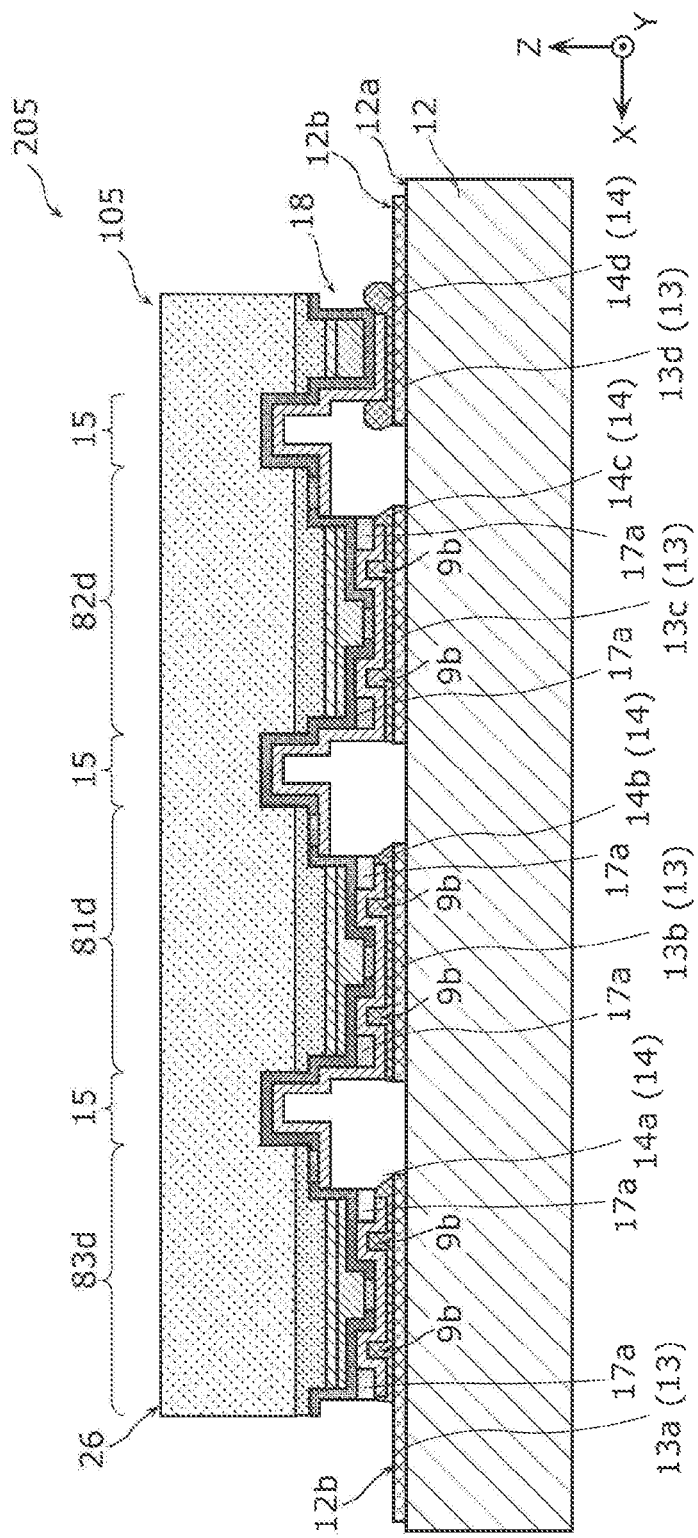
FIG. 10 a sectional diagram illustrating a semiconductor laser apparatus according to Variation 1 of Embodiment 3.

FIG. 9 is a sectional diagram illustrating semiconductor laser device 105 according to Variation 1 of Embodiment 3. FIG. 10 is a sectional diagram illustrating semiconductor laser apparatus 205 according to Variation 1 of Embodiment 3.

In the following description, a plurality of light-emitting device regions 81d, 82d, and 83d included in semiconductor laser device 105 are also collectively referred to as "light-emitting device region 8d" unless they are distinguished.

In semiconductor laser device 105 according to Variation 1 of Embodiment 3, for example, protrusion portion 17a is formed on insulating film (second insulating film) 5d at both ends of p-type semiconductor layer 4a, as illustrated in FIG. 9.

With such a structure, groove portion 9b recessed to the substrate 1 side is formed in second electrode film 11e in semiconductor laser device 105, as in second electrode film 11e in semiconductor laser device 104 according to Embodiment 3.

As a result of groove portion 9b recessed to the substrate 1 side being formed in second electrode film 11e, joining material 14 is prevented from coming into contact with first electrode film 10 when semiconductor laser device 105 is mounted on submount 12.

Here, a recess may be directly formed in second electrode film 11e or part of second electrode film 11e may be increased in thickness to form protrusion portions on second electrode film 11e, as long as groove portion 9b recessed to the substrate 1 side is formed in second electrode film 11e.

[Variation 2]

Figure 11:
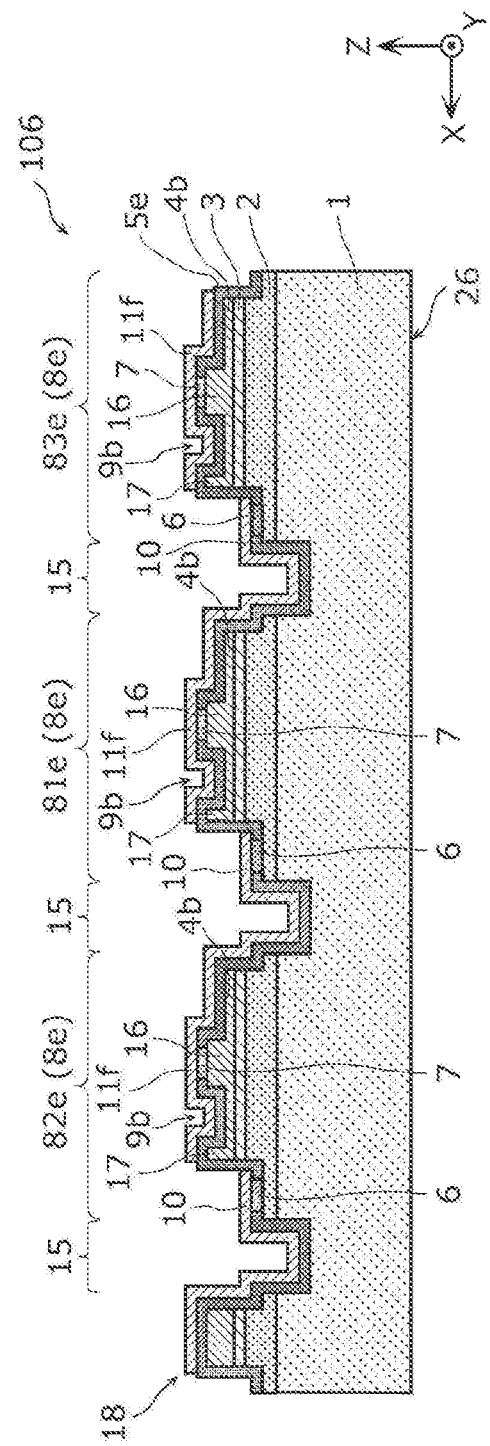
FIG. 11 is a sectional diagram illustrating a semiconductor laser device according to Variation 2 of Embodiment 3.
Figure 12:
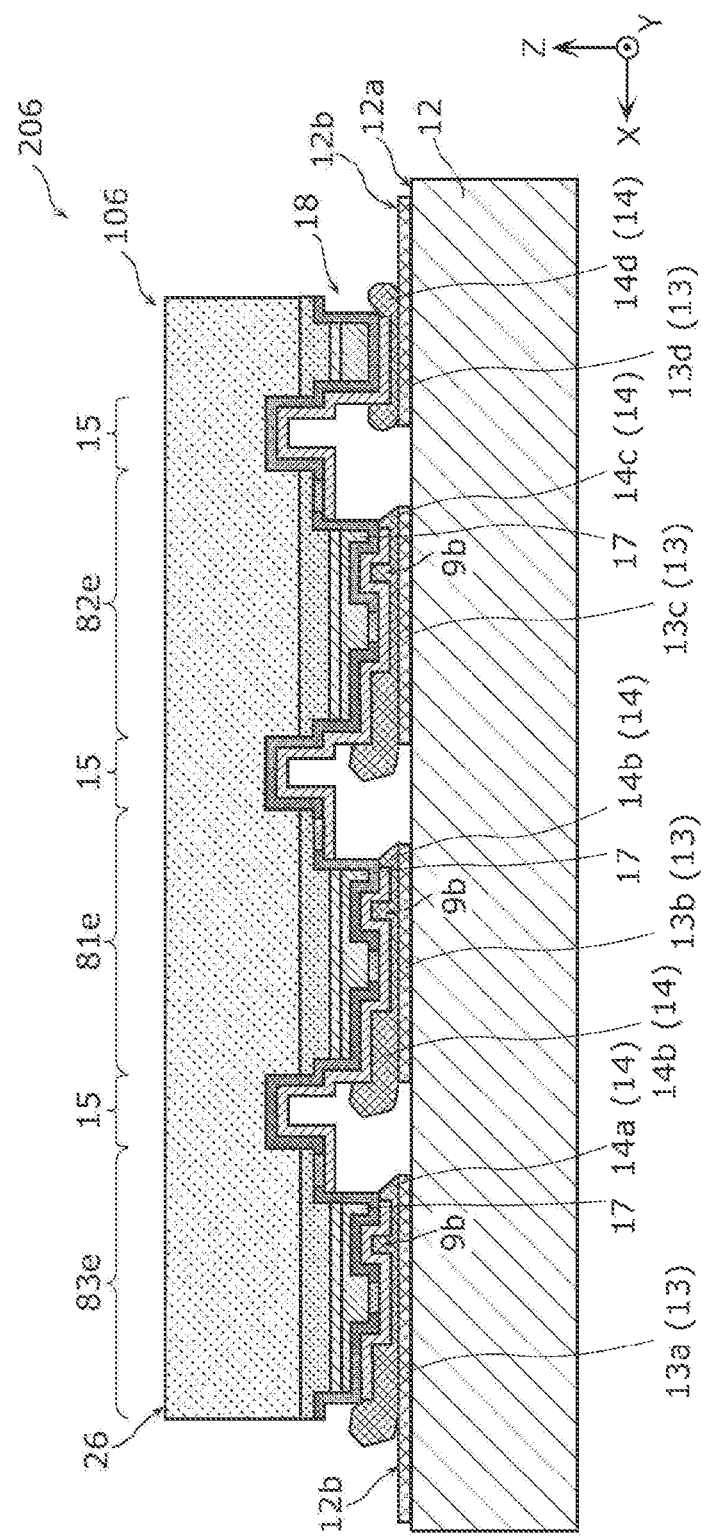
FIG. 12 is a sectional diagram illustrating a semiconductor laser apparatus according to Variation 2 of Embodiment 3.

FIG. 11 is a sectional diagram illustrating semiconductor laser device 106 according to Variation 2 of Embodiment 3. FIG. 12 is a sectional diagram illustrating semiconductor laser apparatus 206 according to Variation 2 of Embodiment 3.

In the following description, a plurality of light-emitting device regions 81e, 82e, and 83e included in semiconductor laser device 106 are also collectively referred to as "light-emitting device region 8e" unless they are distinguished.

In semiconductor laser device 106 according to Variation 2 of Embodiment 3, protrusion portion 17 is formed only on one side of p-type semiconductor layer 4b.

Specifically, in first light-emitting device region 81e, protrusion portion 17 is located between second electrode film 11f and first electrode film 10. In other words, protrusion portion 17 is located between n-side electrode 6 and p-side electrode 7 in light-emitting device region 8e in a top view.

Thus, first light-emitting device region 81e includes n-side electrode 6 located on n-type semiconductor layer 2 and p-side electrode 7 located on p-type semiconductor layer 4b. In first light-emitting device region 81e, protrusion portion 17 is located between n-side electrode 6 and p-side electrode 7.

As a result of groove portion 9b recessed to the substrate 1 side being formed in second electrode film 11e, joining material 14 is prevented from coming into contact with first electrode film 10 when semiconductor laser device 106 is mounted on submount 12. In particular, as a result of protrusion portion 17 being located between second electrode film 11f and first electrode film 10 in Variation 2, joining material 14 is prevented from coming into contact with first electrode film 10 when semiconductor laser device 106 is mounted on submount 12.

[Variation 3]

Figure 13:
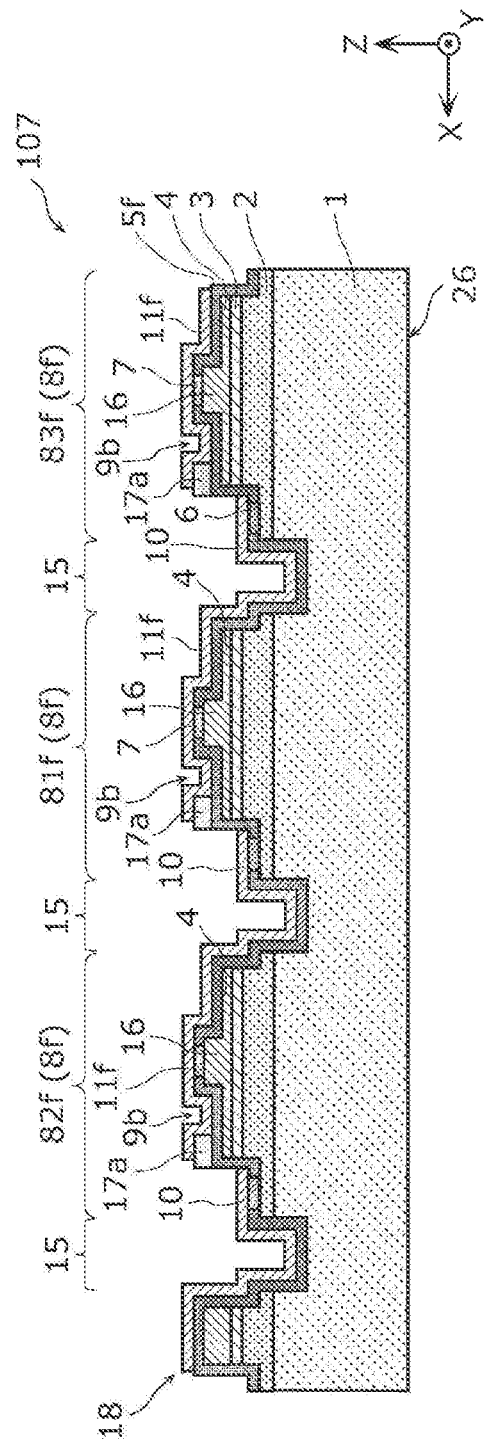
FIG. 13 is a sectional diagram illustrating a semiconductor laser device according to Variation 3 of Embodiment 3.
Figure 14:
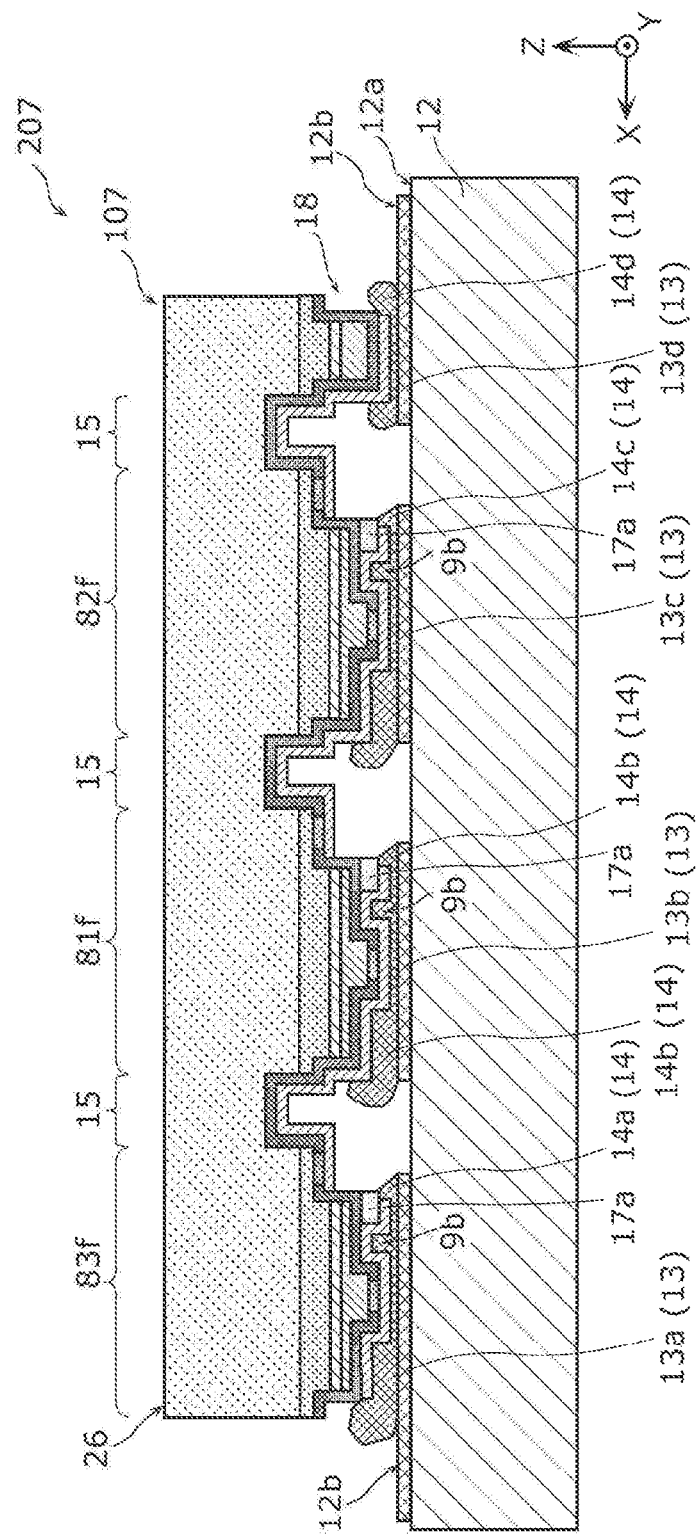
FIG. 14 is a sectional diagram illustrating a semiconductor laser apparatus according to Variation 3 of Embodiment 3.

FIG. 13 is a sectional diagram illustrating semiconductor laser device 107 according to Variation 3 of Embodiment 3. FIG. 14 is a sectional diagram illustrating semiconductor laser apparatus 207 according to Variation 3 of Embodiment 3.

In the following description, a plurality of light-emitting device regions 81f, 82f, and 83f included in semiconductor laser device 107 are also collectively referred to as "light-emitting device region 8f" unless they are distinguished.

In semiconductor laser device 107 according to Variation 3 of Embodiment 3, protrusion portion 17a is formed only on one side of insulating film (second insulating film) 5f. Specifically, in first light-emitting device region 81f, protrusion portion 17a is located between second electrode film 11f and first electrode film 10, as in Variation 2. In other words, protrusion portion 17a is located between n-side electrode 6 and p-side electrode 7 in light-emitting device region 8f in a top view.

As a result of groove portion 9b recessed to the substrate 1 side being formed in second electrode film 11f, joining material 14 is prevented from coming into contact with first electrode film 10 when semiconductor laser device 107 is mounted on submount 12. In particular, as a result of protrusion portion 17a being located between second electrode film 11f and first electrode film 10, joining material 14 is prevented from coming into contact with first electrode film 10 when semiconductor laser device 107 is mounted on submount 12.

Embodiment 4

A semiconductor laser apparatus according to Embodiment 4 will be described below. In the description of the semiconductor laser apparatus according to Embodiment 4, the differences from semiconductor laser apparatus 200 according to Embodiment 1 will be mainly described while giving, to the same structural elements as in semiconductor laser apparatus 200 according to Embodiment 1, the same reference marks and simplifying or omitting their description as appropriate.

[Structure]

Figure 15:
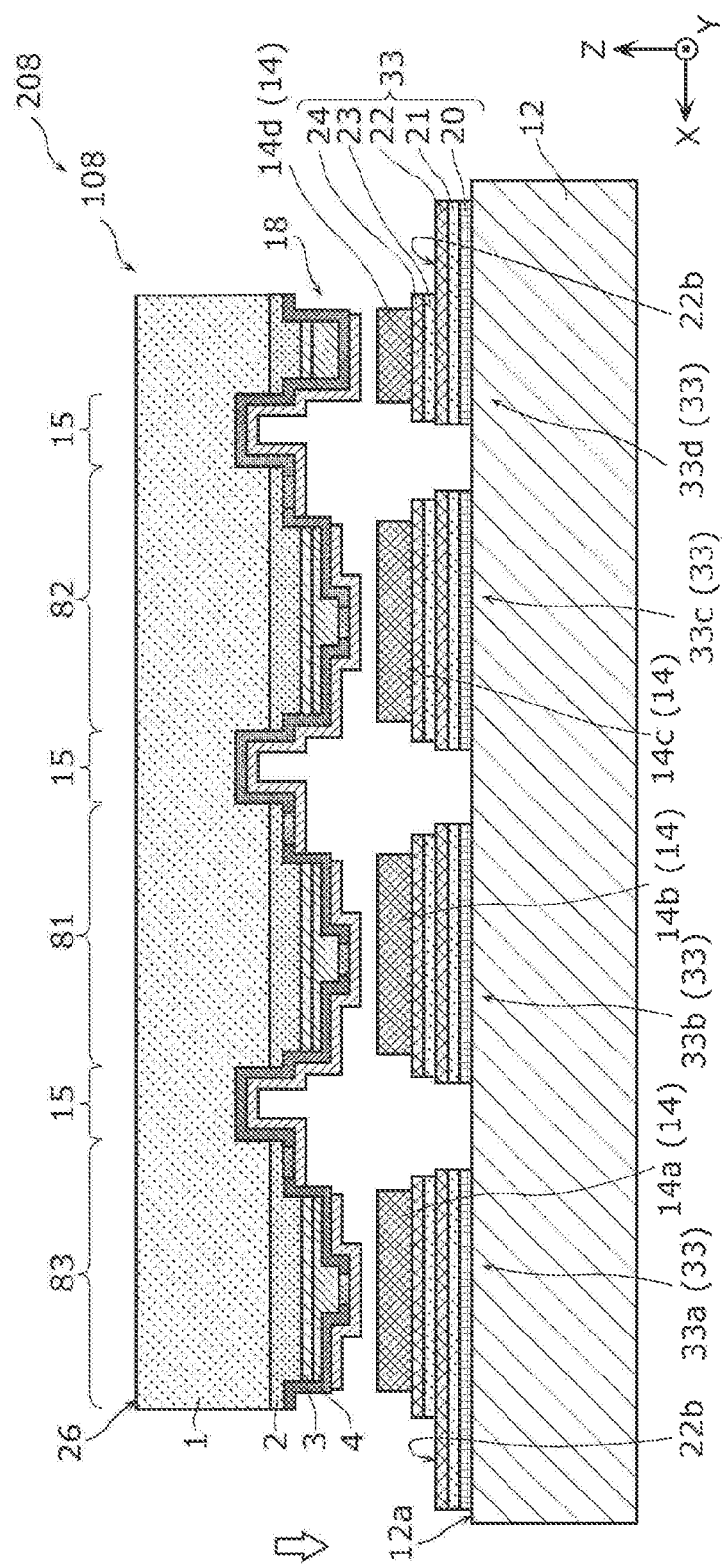
FIG. 15 is a sectional diagram illustrating how a semiconductor laser device is junction-down mounted on a submount in a semiconductor laser apparatus according to Embodiment 4.
Figure 16:
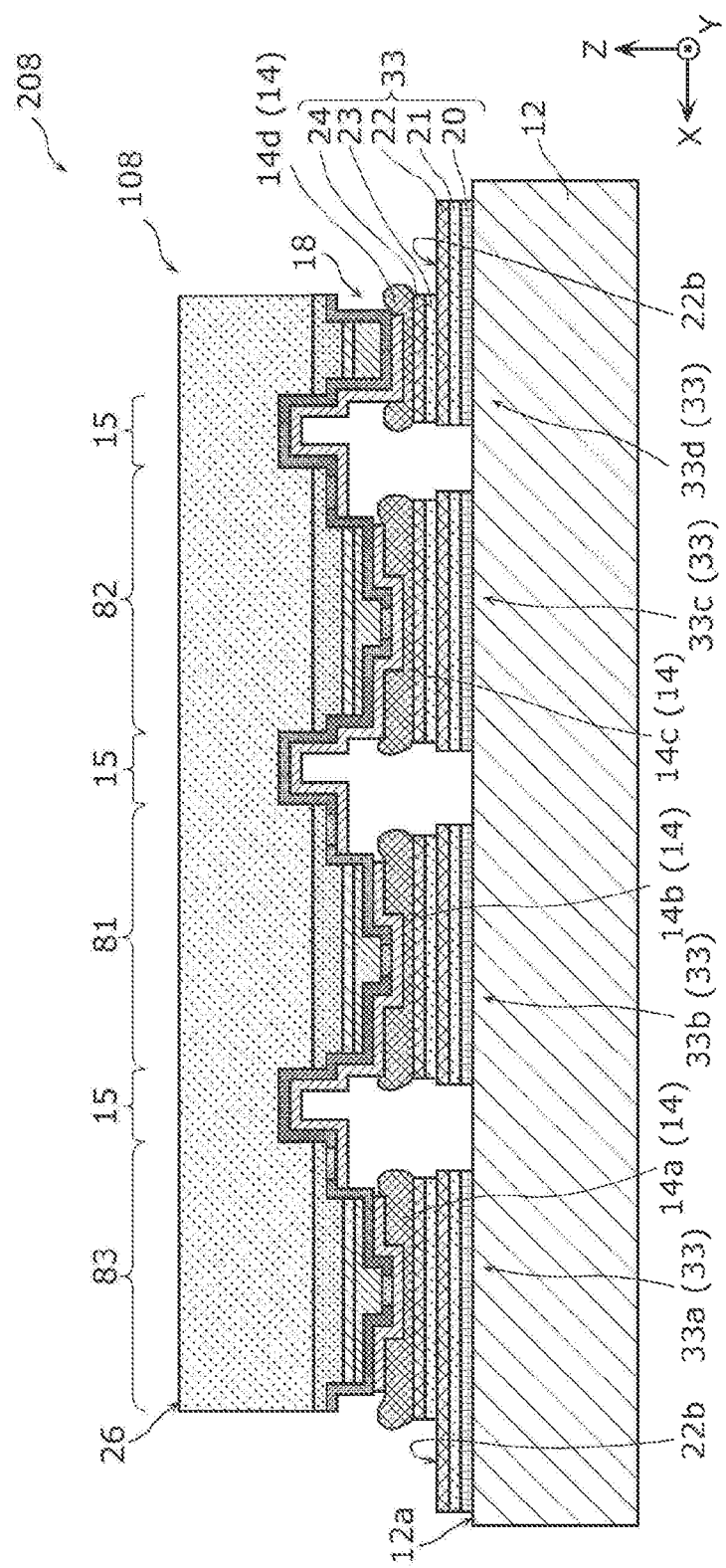
FIG. 16 is a sectional diagram illustrating the semiconductor laser apparatus according to Embodiment 4.
Figure 17:
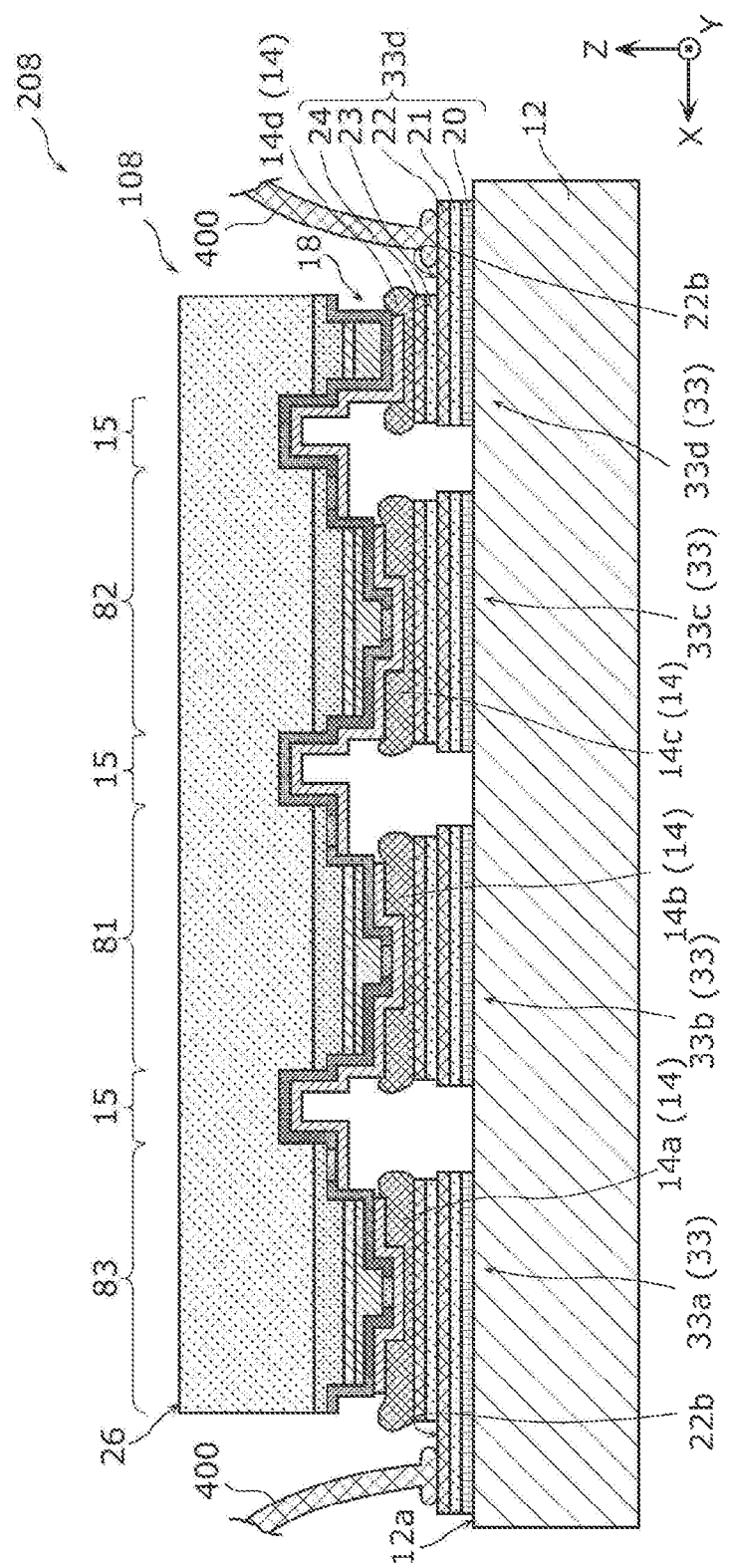
FIG. 17 is a sectional diagram illustrating a state in which wires are connected to the semiconductor laser apparatus according to Embodiment 4.

FIG. 15 is a sectional diagram illustrating how semiconductor laser device 108 is junction-down mounted on submount 12 in semiconductor laser apparatus 208 according to Embodiment 4. FIG. 16 is a sectional diagram illustrating semiconductor laser apparatus 208 according to Embodiment 4. FIG. 17 is a sectional diagram illustrating a state in which wires 400 are connected to semiconductor laser apparatus 208 according to Embodiment 4.

Semiconductor laser apparatus 208 according to Embodiment 4 differs from semiconductor laser apparatus 200 according to Embodiment 1 in the structure of metal films 33a, 33b, 33c, and 33d formed on mounting surface 12a of submount 12.

Metal films (metal film patterns) 33a, 33b, 33c, and 33d are electrode patterns formed on mounting surface 12a of submount 12, as with metal films 13 illustrated in FIG. 2 as an example.

In the following description, metal films 33a, 33b, 33c, and 33d are also collectively referred to as "metal film 33" unless they are distinguished.

The plurality of metal films 33 are formed on mounting surface 12a of submount 12. Each metal film 33 has a plurality of metal layers, unlike metal film 13. Specifically, metal film 33 includes adhesion layer 20, first barrier layer 21, first contact layer 22, second barrier layer 23, and second contact layer 24. More specifically, in each of the plurality of metal films 33, adhesion layer 20 made of Ti and having a film thickness of 0.1 μm, first barrier layer 21 made of Pt and having a film thickness of 0.2 μm, first contact layer 22 made of Au and having a film thickness of 0.5 μm, second barrier layer 23 made of Pt and having a film thickness of 0.3 μm, and second contact layer 24 made of Au and having a film thickness of 0.3 μm are stacked in this order from the mounting surface 12a side.

Adhesion layer 20 is a layer for easing connection of first barrier layer 21 to submount 12. For example, adhesion layer 20 is a metal layer containing Ti.

First barrier layer 21 is a layer for suppressing diffusion of metal when semiconductor laser device 108 is junction-down mounted on submount 12. For example, first barrier layer 21 is a metal layer containing Pt.

First contact layer 22 is a layer for easing connection of conductive wire 400 on bonding surface 22b. For example, first contact layer 22 is a metal layer containing Au.

Second barrier layer 23 is a layer for suppressing contact of joining material 14 with first contact layer 22 when semiconductor laser device 108 is junction-down mounted on submount 12. For example, second barrier layer 23 is a metal layer containing Pt.

Second contact layer 24 is a layer for easing connection of joining material 14. For example, second contact layer 24 is a metal layer containing Au.

In a sectional view (i.e. sectional view in FIG. 15) as seen from the end surface of first light-emitting device region 81 (i.e. the light emission surface of semiconductor laser device 108), one of the plurality of metal films 33 connected to p-type semiconductor layer 4 in first light-emitting device region 81 includes second barrier layer 23 and second contact layer 24 that are greater in width than p-type semiconductor layer 4, and adhesion layer 20, first barrier layer 21, and first contact layer 22 that are greater in width than second barrier layer 23 and second contact layer 24. Herein, "width" denotes the length in the X-axis direction, and "both ends" denote the respective ends in the X-axis positive direction and the X-axis negative direction.

Moreover, in a sectional view as seen from the end surface of light-emitting device region 8, both ends of each of second barrier layer 23 and second contact layer 24 are located outside both ends of p-type semiconductor layer 4.

Both ends of each of adhesion layer 20, first barrier layer 21, and first contact layer 22 are located outside both ends of each of second barrier layer 23 and second contact layer 24.

[Effects, Etc.]

As described above, in semiconductor laser apparatus 208 according to Embodiment 4, the plurality of metal films 33 each include the metal stack film in which adhesion layer 20, first barrier layer 21, first contact layer 22, second barrier layer 23, and second contact layer 24 are stacked in this order from the mounting surface 12a side. In a sectional view of first light-emitting device region 81 as seen from the end surface of first light-emitting device region 81 (laser emission end surface), one of the plurality of metal films 33 connected to p-type semiconductor layer 4 in first light-emitting device region 81 includes second barrier layer 23 and second contact layer 24 greater in width than p-type semiconductor layer 4, and adhesion layer 20, first barrier layer 21, and first contact layer 22 greater in width than second barrier layer 23 and second contact layer 24. Both ends of each of second barrier layer 23 and second contact layer 24 are located outside the respective ends of p-type semiconductor layer 4. Both ends of each of adhesion layer 20, first barrier layer 21, and first contact layer 22 are located coincident with or outside the respective ends of each of second barrier layer 23 and second contact layer 24.

With such a structure, joining material 14 located outermost does not extend beyond second barrier layer 23, so that wire 400 can be bonded to bonding surface 22b of first contact layer 22 without increasing the widths of submount 12, adhesion layer 20, first barrier layer 21, and first contact layer 22. The costs of submount 12 can thus be reduced.

Embodiment 5

A semiconductor laser apparatus according to Embodiment 5 will be described below. In the description of the semiconductor laser apparatus according to Embodiment 5, the differences from semiconductor laser apparatus 200 according to Embodiment 1 will be mainly described while giving, to the same structural elements as in semiconductor laser apparatus 200 according to Embodiment 1, the same reference marks and simplifying or omitting their description as appropriate.

[Structure]

Figure 18:
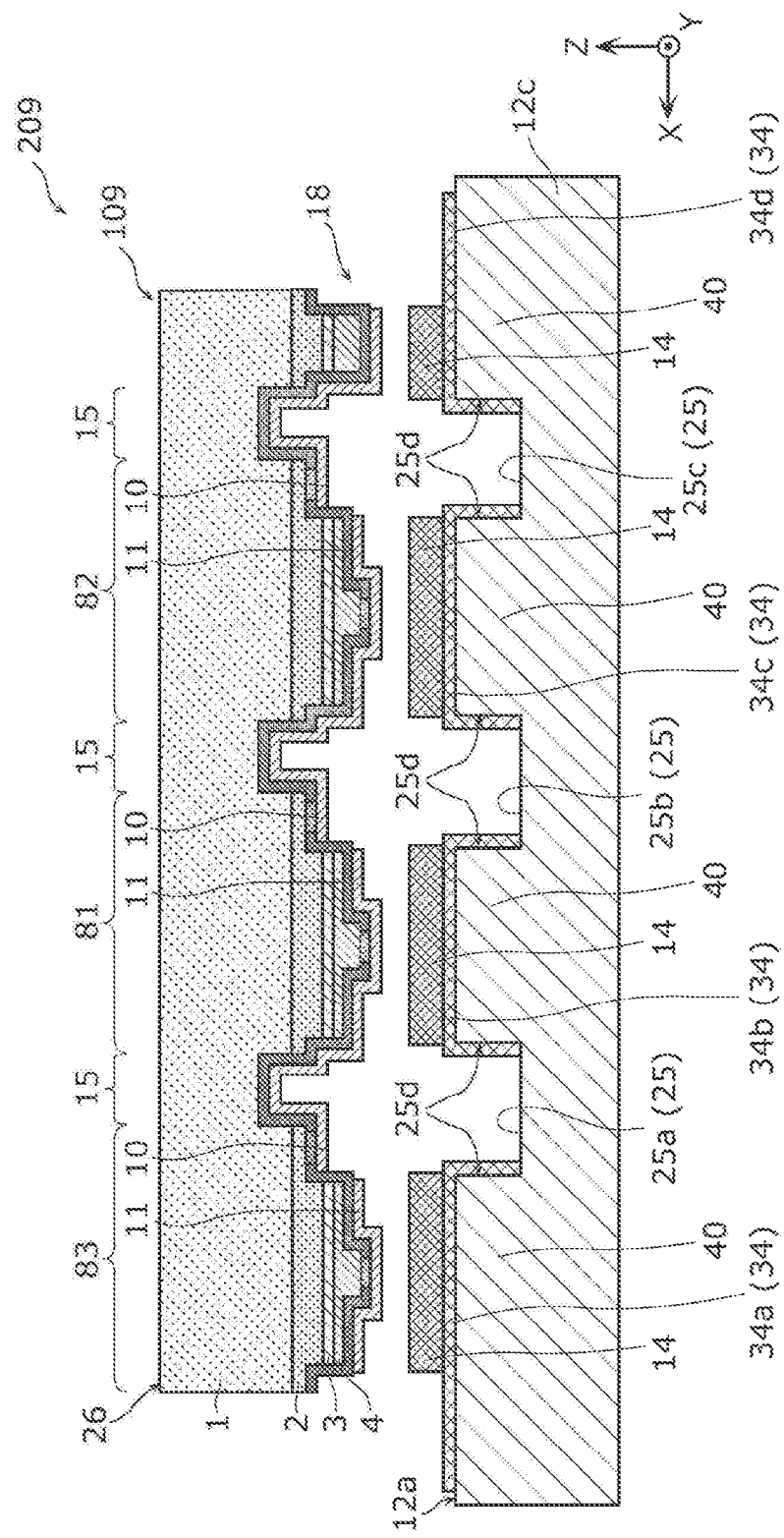
FIG. 18 is a sectional diagram illustrating how a semiconductor laser device is junction-down mounted on a submount in a semiconductor laser apparatus according to Embodiment 5.
Figure 19:
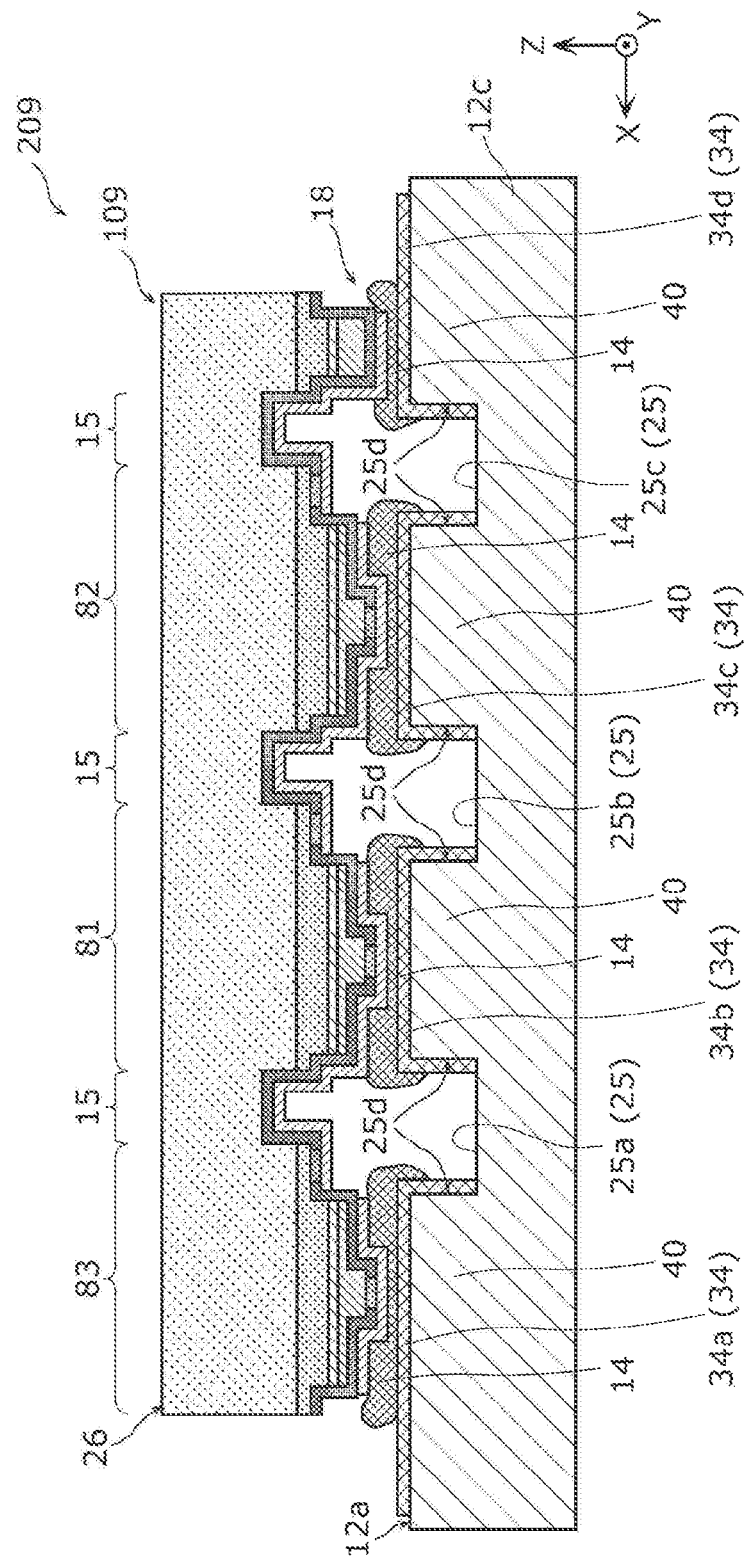
FIG. 19 is a sectional diagram illustrating the semiconductor laser apparatus according to Embodiment 5.

FIG. 18 is a sectional diagram illustrating how semiconductor laser device 109 is junction-down mounted on submount 12c in semiconductor laser apparatus 209 according to Embodiment 5. FIG. 19 is a sectional diagram illustrating semiconductor laser apparatus 209 according to Embodiment 5.

Semiconductor laser apparatus 209 includes semiconductor laser device 109, submount 12c, metal films 34a, 34b, 34c, and 34d, and joining material 14.

In the following description, metal films 34a, 34b, 34c, and 34d are also collectively referred to as "metal film 34" unless they are distinguished.

Submount 12c differs from submount 12 in semiconductor laser apparatus 200 according to Embodiment 1 in that it includes recessed portions 25a, 25b, and 25c.

In the following description, recessed portions 25a, 25b, and 25c are also collectively referred to as "recessed portion 25" unless they are distinguished.

Recessed portion 25 is a depression formed in mounting surface 12a of submount 12c. Recessed portion 25 is provided at a position facing first electrode film 10 located on n-type semiconductor layer 2 in first light-emitting device region 81 Recessed portion 25 is also provided at a position facing separation region 15. Specifically, semiconductor laser device 109 is junction-down mounted on submount 12c so that first electrode film 10 and separation region 15 are situated above recessed portions 25.

Metal film 34 is provided on the upper surface of projected portion 40 that protrudes toward semiconductor laser device 109 with respect to recessed portion 25. Part of metal film 34 covers side surface 25d of recessed portion 25. In this embodiment, metal film 34 extends along side surface 25d of recessed portion 25 and reaches the bottom of recessed portion 25 at its end.

[Effects, Etc.]

As described above, in semiconductor laser apparatus 209 according to Embodiment 5, mounting surface 12a has recessed portion 25 at a position facing first electrode film 10 located on n-type semiconductor layer 2 of first light-emitting device region 81. Metal film 34 is formed on side surface 25d of recessed portion 25.

With such a structure, metal film 34 is formed on side surface 25d that forms recessed portion 25. Accordingly, when semiconductor laser device 109 is junction-down mounted on submount 12c, joining material 14 squeezing out from projected portion 40 moves into recessed portion 25, so that joining material 14 can be prevented from moving toward semiconductor laser device 109. Thus, shorting of p-side and n-side in light-emitting device region 8 caused by joining material 14 can be suppressed.

Each metal film 34 may cover the bottom of recessed portion 25, as long as metal films 34 are separated and insulated from each other.

Embodiment 6

A semiconductor laser apparatus according to Embodiment 6 will be described below. In the description of the semiconductor laser apparatus according to Embodiment 6, the differences from semiconductor laser apparatus 200 according to Embodiment 1 will be mainly described while giving, to the same structural elements as in semiconductor laser apparatus 200 according to Embodiment 1, the same reference marks and simplifying or omitting their description as appropriate.

[Structure]

Figure 20:
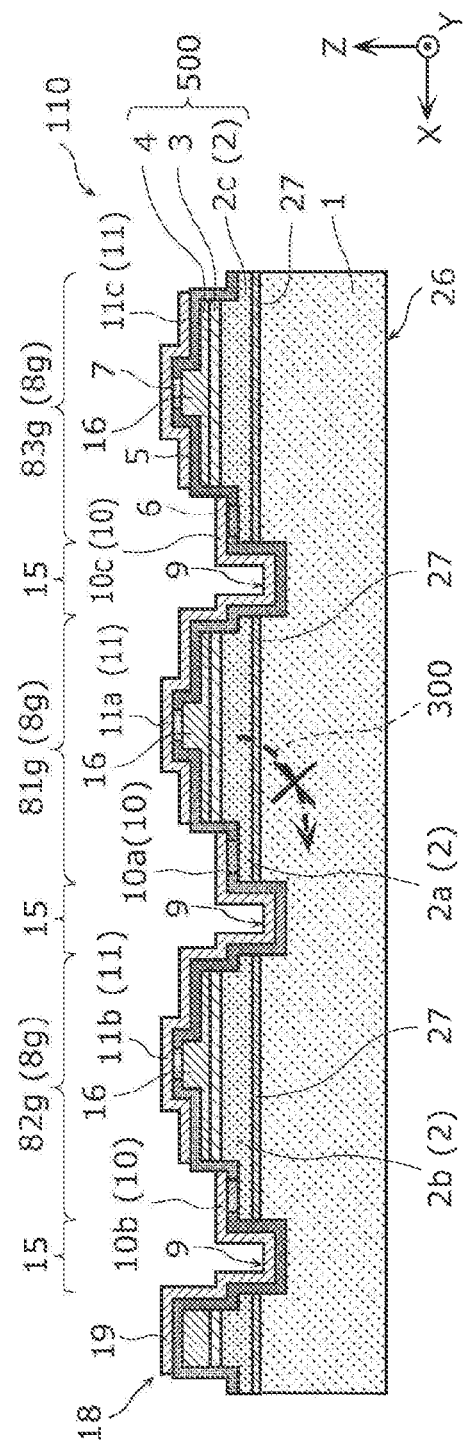
FIG. 20 is a sectional diagram illustrating a semiconductor laser device according to Embodiment 6.
Figure 21:
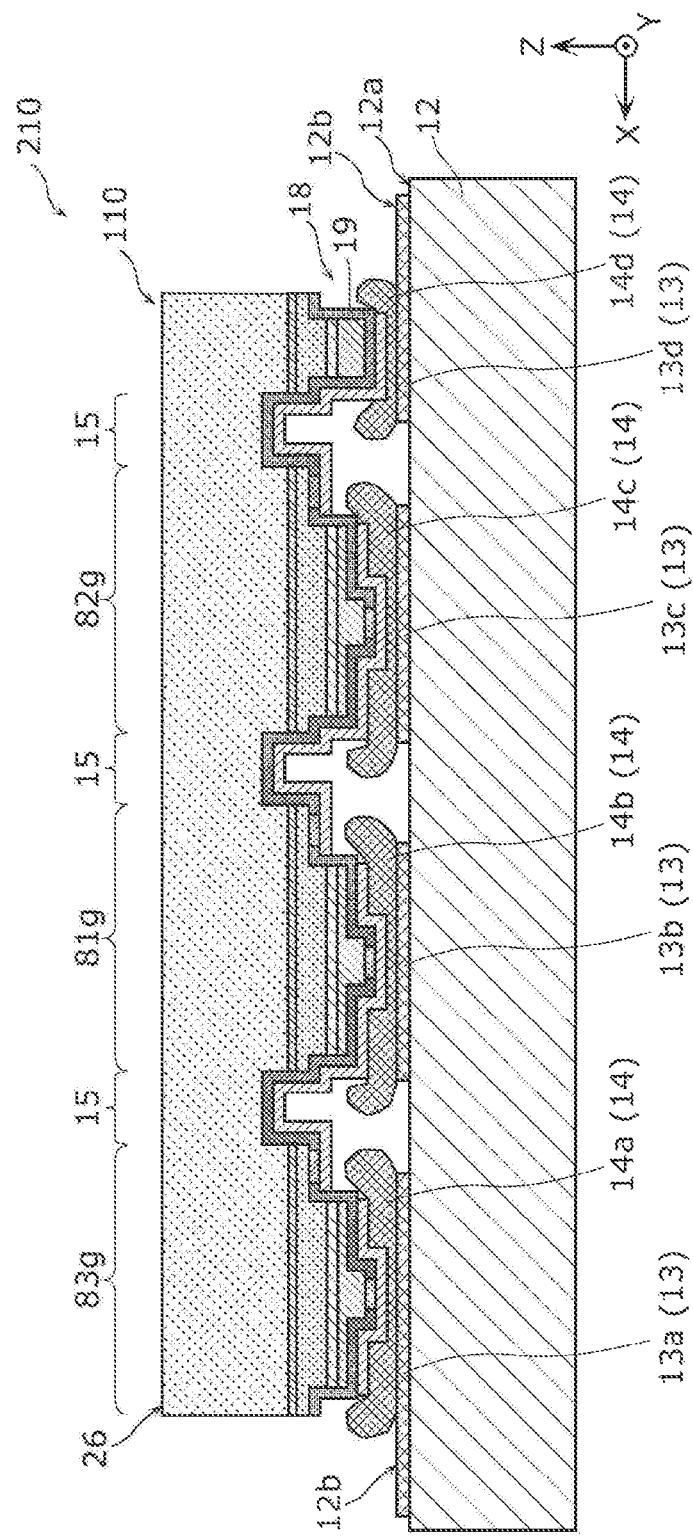
FIG. 21 is a sectional diagram illustrating a semiconductor laser apparatus according to Embodiment 6.

FIG. 20 is a sectional diagram illustrating semiconductor laser device 110 according to Embodiment 6. FIG. 21 is a sectional diagram illustrating semiconductor laser apparatus 210 according to Embodiment 6.

Semiconductor laser device 110 according to Embodiment 6 further includes current stop layer 27 in addition to the structure of semiconductor laser device 100 according to Embodiment 1. Specifically, a plurality of light-emitting device regions 81g, 82g, and 83g included in semiconductor laser device 110 each include current stop layer 27.

In the following description, the plurality of light-emitting device regions 81g, 82g, and 83g included in semiconductor laser device 110 are also collectively referred to as "light-emitting device region 8g" unless they are distinguished.

Current stop layer 27 is a p-type semiconductor layer located on substrate 1. N-type semiconductor layer 2 is located on current stop layer 27. Thus, in semiconductor laser device 110, current stop layer 27 is located between n-type semiconductor layer 2 in light-emitting device region 8g and substrate 1. Specifically, substrate 1 is an n-type GaN substrate with an n-type impurity (Si or oxygen) concentration of $1\times10^{17}$ $cm^{-3}$ to $2\times10^{18}$ $cm^{-3}$. Current stop layer 27 has a thickness of 3 μm and is made of p-AlGaN with a p-type impurity (e.g. Mg) concentration of $1\times10^{17}$ $cm^{-3}$ to $2\times10^{19}$ $cm^{-3}$. N-type semiconductor layer 2 is made of n-AlGaN with an n-type impurity (e.g. Si) concentration of $1\times10^{17}$ $cm^{-3}$ to $2\times10^{18}$ $cm^{-3}$.

Respective current stop layers 27 in adjacent light-emitting device regions 8g of the plurality of light-emitting device regions 8g are separated by separation region 15.

[Effects, Etc.]

As described above, in semiconductor laser device 110 included in semiconductor laser apparatus 210 according to Embodiment 6, separation region 15 at which n-type semiconductor layer 2a in first light-emitting device region 81g and n-type semiconductor layer 2b in second light-emitting device region 82g are separated is located between first light-emitting device region 81g and second light-emitting device region 82g. In separation region 15, groove portion 9 is provided in substrate 1. Moreover, current stop layer 27 is located between n-type semiconductor layer 2a in first light-emitting device region 81g and substrate 1.

More specifically, semiconductor laser device 110 according to Embodiment 6 is a semiconductor laser device having stack structure 500 in which n-type semiconductor layer 2, active layer 3, and p-type semiconductor layer 4 are stacked in this order on substrate 1. Semiconductor laser device 110 includes first light-emitting device region 81g and second light-emitting device region 82g formed separately and each including stack structure 500, first electrode film 10a located on n-type semiconductor layer 2a in first light-emitting device region 81g, and second electrode film 11b located on p-type semiconductor layer 4 in second light-emitting device region 82g. First electrode film 10a located on n-type semiconductor layer 2a in first light-emitting device region 81g and second electrode film 11b located on p-type semiconductor layer 4 in second light-emitting device region 82g are electrically connected to each other. Separation region 15 that separates n-type semiconductor layer 2a in first light-emitting device region 81g and n-type semiconductor layer 2b in second light-emitting device region 82g is located between first light-emitting device region 81g and second light-emitting device region 82g. In separation region 15, groove portion 9 is provided in substrate 1. Moreover, current stop layer 27 is located between n-type semiconductor layer 2a in first light-emitting device region 81g and substrate 1.

With such a structure, leakage of current 300 to adjacent light-emitting device region 8g through substrate 1 can be prevented by current stop layer 27.

For example, an insulating film of $SiO_2$ or the like having electrical insulation property may be provided instead of current stop layer 27. A p-type semiconductor layer has higher thermal conductivity than an insulating film. Hence, using not an insulating film but a p-type semiconductor layer improves dissipation of heat generated in active layer 3 toward substrate 1. The laser characteristics of semiconductor laser device 110 can be stabilized, or failures and the like caused by heat generated in semiconductor laser device 110 can be prevented.

Embodiment 7

A semiconductor laser apparatus according to Embodiment 7 will be described below, in the description of the semiconductor laser apparatus according to Embodiment 7, the differences from semiconductor laser apparatus 200 according to Embodiment 1 will be mainly described while giving, to the same structural elements as in semiconductor laser apparatus 200 according to Embodiment 1, the same reference marks and simplifying or omitting their description as appropriate.

[Structure]

Figure 22:
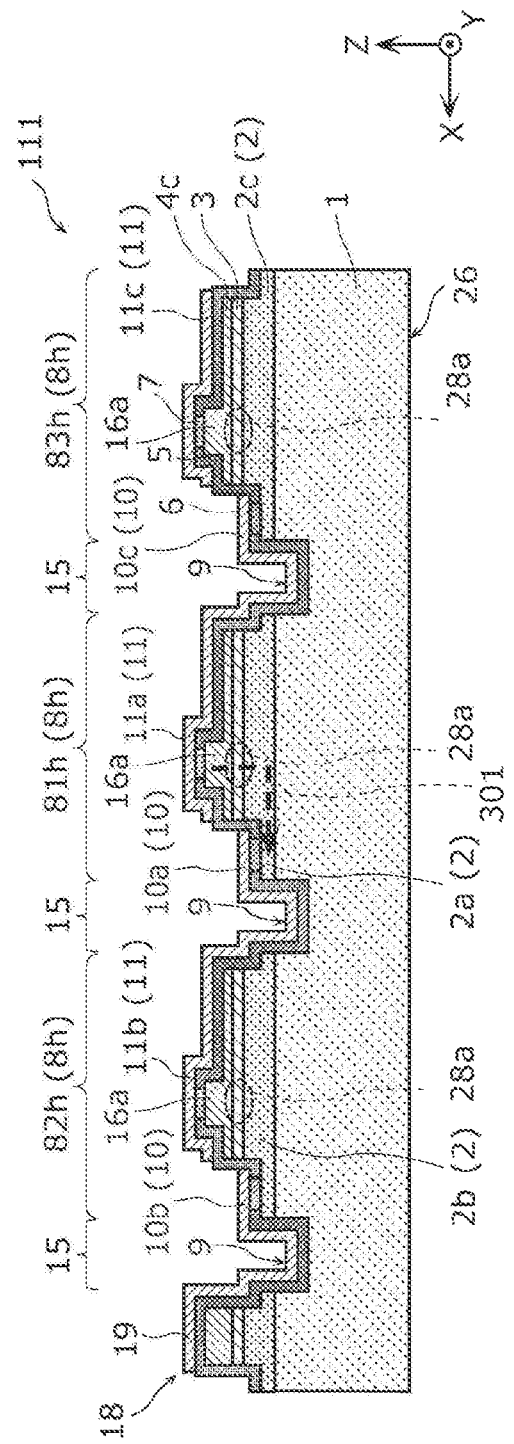
FIG. 22 is a sectional diagram illustrating a semiconductor laser device according to Embodiment 7.
Figure 23:
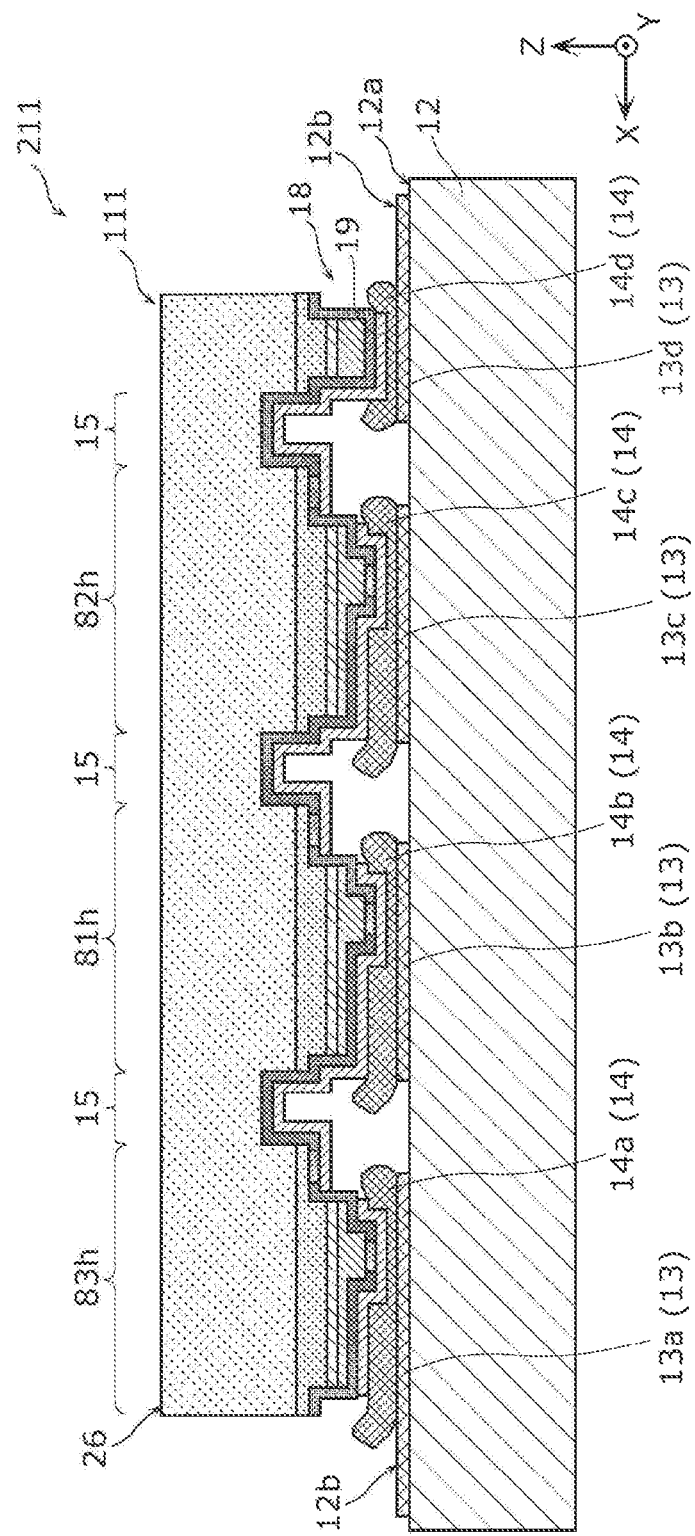
FIG. 23 is a sectional diagram illustrating a semiconductor laser apparatus according to Embodiment 7.

FIG. 22 is a sectional diagram illustrating semiconductor laser device 111 according to Embodiment 7. FIG. 23 is a sectional diagram illustrating semiconductor laser apparatus 211 according to Embodiment 7.

Semiconductor laser device 111 included in semiconductor laser apparatus 211 according to Embodiment 7 includes a plurality of light-emitting device regions 81h, 82h, and 83h. The plurality of light-emitting device regions 81h, 82h, and 83h differ from light-emitting device regions 8 in semiconductor laser device 100 according to Embodiment 1 in the position of luminous point 28a. That is, semiconductor laser device 111 according to Embodiment 7 differs from semiconductor laser device 100 according to Embodiment 1 in the position of luminous point 28a.

In the following description, the plurality of light-emitting device regions 81h, 82h, and 83h included in semiconductor laser device 111 are also collectively referred to as "light-emitting device region 8h" unless they are distinguished.

Luminous point 28a in each of the plurality of light-emitting device regions 8h is located closer to first electrode film 10 than the center of p-type semiconductor layer 4c in the width direction (X-axis direction in this embodiment) is, in light-emitting device region 8h. For example, luminous point 28a in first light-emitting device region 81h is located closer to first electrode film 10a than the center of p-type semiconductor layer 4a in the width direction is, in first light-emitting device region 81h.

Specifically, the center of ridge portion 16a with a width of 5 μm to 50 μm (e.g. 30 μm) in each of the plurality of light-emitting device regions 8h is 50 μm closer to n-side electrode 6 than the center of p-type semiconductor layer 4c with a width of 200 μm in the width direction is, in light-emitting device region 8h.

[Effects, Etc.]

As described above, luminous point 28a in first light-emitting device region 81h in semiconductor laser device 111 included in semiconductor laser apparatus 211 according to Embodiment 7 is closer to first electrode film 10a than the center of p-type semiconductor layer 4c in the width direction is, in first light-emitting device region 81h.

With such a structure, for example, the path of current 301 flowing through n-type semiconductor layer 2 can be shortened as compared with semiconductor laser device 100 included in semiconductor laser apparatus 200 according to Embodiment 1, as indicated by the dashed arrow in FIG. 22. The operating voltage of semiconductor laser device 111 is thus reduced. Consequently, the amount of heat generated in semiconductor laser device 111 is reduced. The laser characteristics of semiconductor laser device 111 can be stabilized, or failures and the like caused by heat generated in semiconductor laser device 111 can be prevented.

Embodiment 8

A semiconductor laser apparatus according to Embodiment 8 will be described below. In the description of the semiconductor laser apparatus according to Embodiment 8, the differences from semiconductor laser apparatus 200 according to Embodiment 1 will be mainly described while giving, to the same structural elements as in semiconductor laser apparatus 200 according to Embodiment 1, the same reference marks and simplifying or omitting their description as appropriate.

[Structure]

Figure 24:
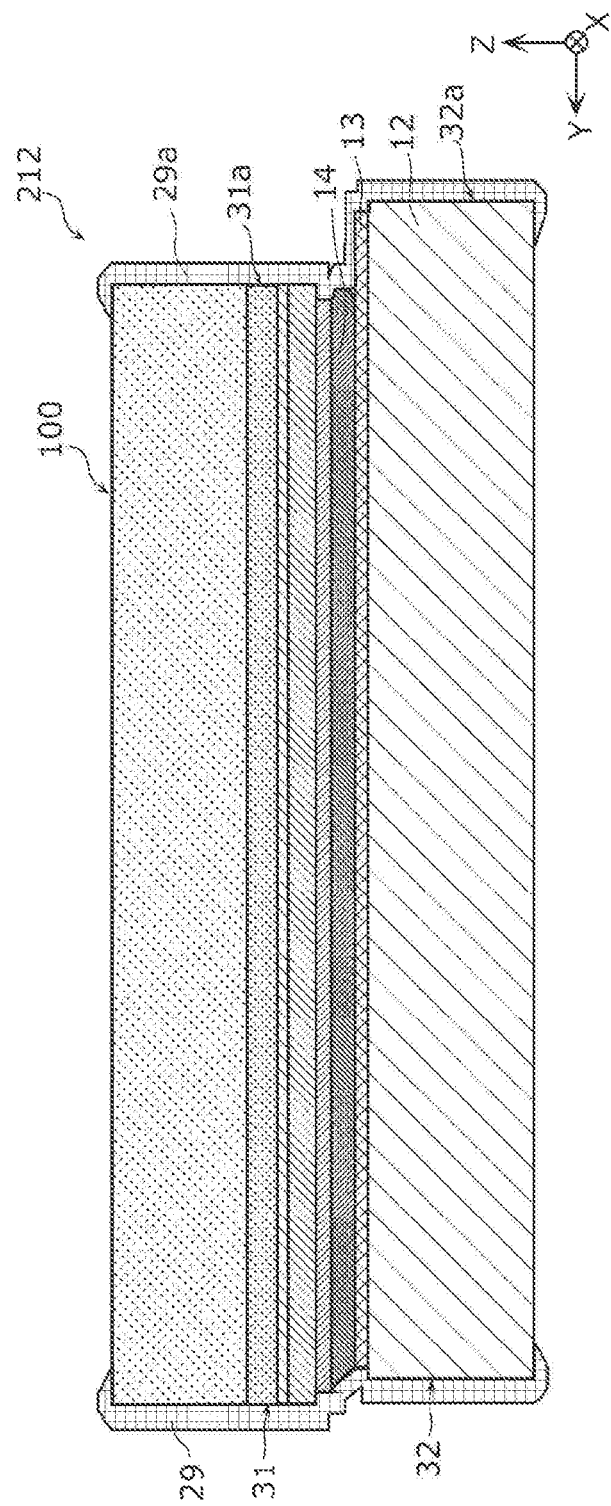
FIG. 24 is a sectional diagram illustrating a semiconductor laser apparatus according to Embodiment 8.

FIG. 24 is a sectional diagram illustrating semiconductor laser apparatus 212 according to Embodiment 8.

Semiconductor laser apparatus 212 further includes protective films 29 and 29a that protect the end surfaces of semiconductor laser device 100, in addition to the structure of semiconductor laser apparatus 200 according to Embodiment 1.

Protective films 29 and 29a are films for protecting end surface (emission end surface) 31 and end surface 31a of semiconductor laser device 100. In semiconductor laser device 100, laser light is emitted as a result of resonance between end surface 31 for emitting laser light and end surface 31a opposite to end surface 31.

Protective film 29 is, for example, a multilayer film having low reflectance. Protective film 29a is, for example, a multilayer film having high reflectance.

Semiconductor laser device 100 is located on submount 12 with joining material 14 therebetween so that emission end surface 31 of semiconductor laser device 100 will protrude from end surface 32 of submount 12 by about 10 μm. Protective films 29 and 29a in semiconductor laser apparatus 212 are continuously provided from end surfaces 31 and 31a to end surfaces 32 and 32a of submount 12. More specifically, protective films 29 and 29a are provided in contact with end surfaces 31 and 31a of semiconductor laser device 100, end surfaces 32 and 32a of submount 12, metal film 13 located between semiconductor laser device 100 and submount 12, and joining material 14 located between semiconductor laser device 100 and submount 12. Accordingly, the side surface of joining material 14 on the end surface 31 side is an inclined surface. The side surface of protective film 29 formed on the inclined surface of joining material 14 is also an inclined surface.

End surface 32 of submount 12 is a surface parallel to end surface 31 of semiconductor laser device 100 and located on the same side as end surface 31 of semiconductor laser device 100. End surface 32 of submount 12a is a surface parallel to end surface 31a of semiconductor laser device 100 and located on the same side as end surface 31a of semiconductor laser device 100.

[Effects, Etc.]

As described above, in semiconductor laser device 100 included in semiconductor laser apparatus 212 according to Embodiment 8, protective film 29 is formed across the laser light emission end surface (end surface 31) of semiconductor laser device 100 and end surface 32 of submount 12 parallel to end surface 31.

Moreover, for example, protective film 29 is formed on joining material 14 between semiconductor laser device 100 and submount 12.

In a semiconductor laser apparatus according to a comparative example, a protective film typically covers end surfaces 31 and 31a and does not cover end surfaces 32 and 32a of submount 12. Typically, the protective film is formed before junction-down mounting semiconductor laser device 100 on submount 12. The semiconductor laser apparatus according to the comparative example therefore has a structure in which the protective film covers end surfaces 31 and 31a and does not cover end surfaces 32 and 32a of submount 12.

In the case where the semiconductor laser device is a laser array as in semiconductor laser device 100, the protective film tends to intrude to the surface on the mounting surface 12a side in semiconductor laser device 100 due to, for example, warpage of semiconductor laser device 100. In the case where the protective film intrudes to the surface on the mounting surface 12a side in semiconductor laser device 100, it is difficult to bond joining material 14 and semiconductor laser device 100 when junction-down mounting semiconductor laser device 100. The unbonded part in which joining material 14 and semiconductor laser device 100 are not bonded has poor heat dissipation. This degrades the laser characteristics of semiconductor laser device 100.

In view of this, in semiconductor laser apparatus 212, protective films 29 and 29a are formed after junction-down mounting semiconductor laser device 100 on submount 12, to form protective film 29 across end surface 31 of semiconductor laser device 100 and end surface 32 of submount 12 parallel to end surface 31. In this way, the reduction in the joining area of semiconductor laser device 100 and submount 12 caused by protective films 29 and 29a can be prevented. This stabilizes the laser characteristics of semiconductor laser device 100.

Embodiment 9

A semiconductor laser apparatus according to Embodiment 9 will be described below.

The semiconductor laser apparatus according to Embodiment 9 has a structure in which semiconductor laser apparatus 200 according to Embodiment 1 further includes insulating film 5a included in semiconductor laser apparatus 202 according to Embodiment 2, current stop layer 27 included in semiconductor laser apparatus 210 according to Embodiment 6, and protective films 29 and 29a included in semiconductor laser apparatus 212 according to Embodiment 8.

A manufacturing method for the semiconductor laser apparatus according to Embodiment 9 will be described in detail below. In the following description, structural elements that are substantially same as those in semiconductor laser apparatuses 200 and 202 to 212 are given the same reference marks, and their description may be omitted or simplified.

[Manufacturing Method]

A manufacturing method for semiconductor laser apparatus 214 according to Embodiment 9 will be described below, with reference to FIG. 25A to FIG. 25N and FIG. 26.

Figure 25A:
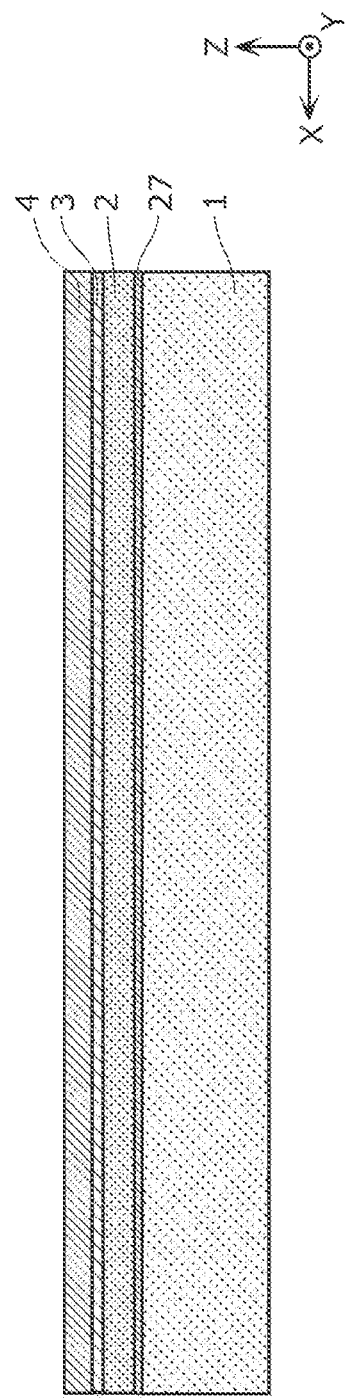
FIG. 25A is a sectional diagram explaining a manufacturing method for a semiconductor laser apparatus according to Embodiment 9.
Figure 25B:
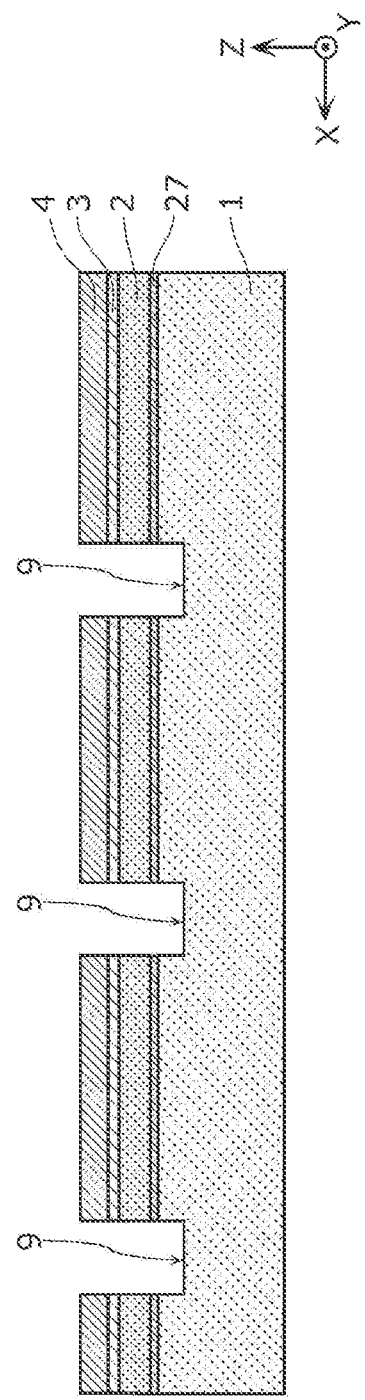
FIG. 25B is a sectional diagram explaining the manufacturing method for the semiconductor laser apparatus according to Embodiment 9.
Figure 25C:
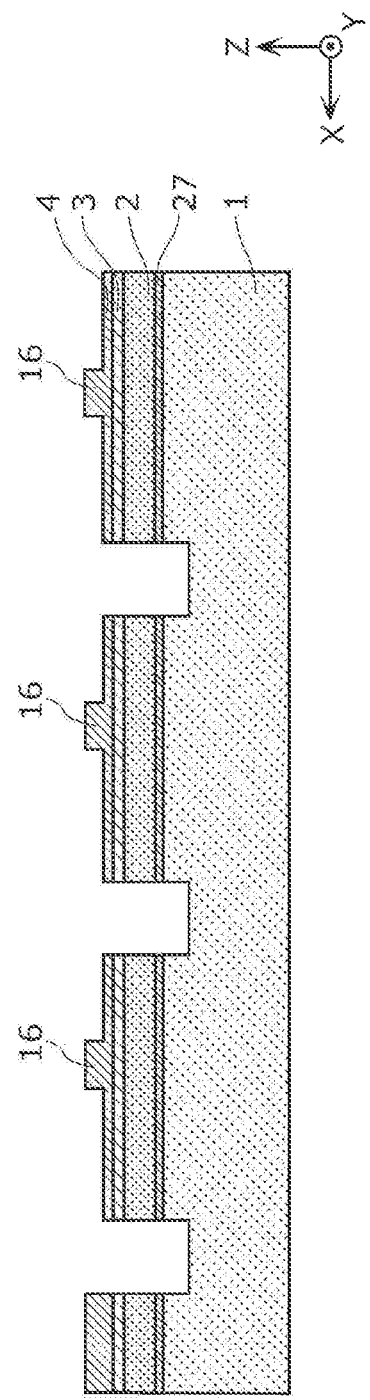
FIG. 25C is a sectional diagram explaining the manufacturing method for the semiconductor laser apparatus according to Embodiment 9.
Figure 25D:
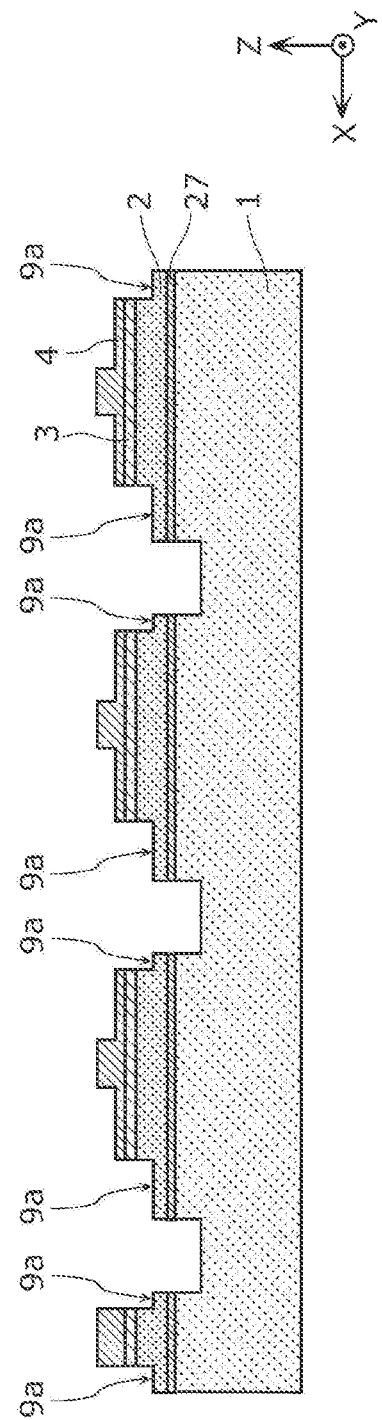
FIG. 25D is a sectional diagram explaining the manufacturing method for the semiconductor laser apparatus according to Embodiment 9.
Figure 25E:
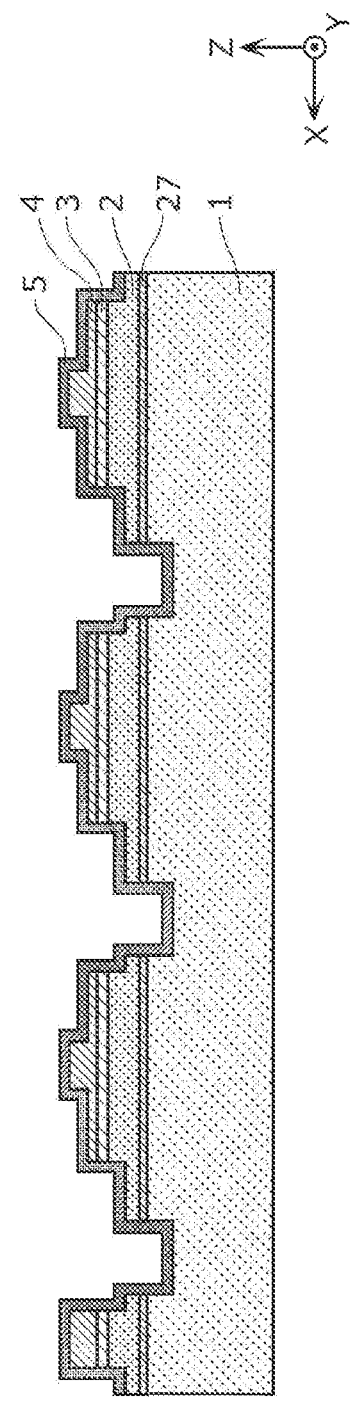
FIG. 25E is a sectional diagram explaining the manufacturing method for the semiconductor laser apparatus according to Embodiment 9.
Figure 25F:
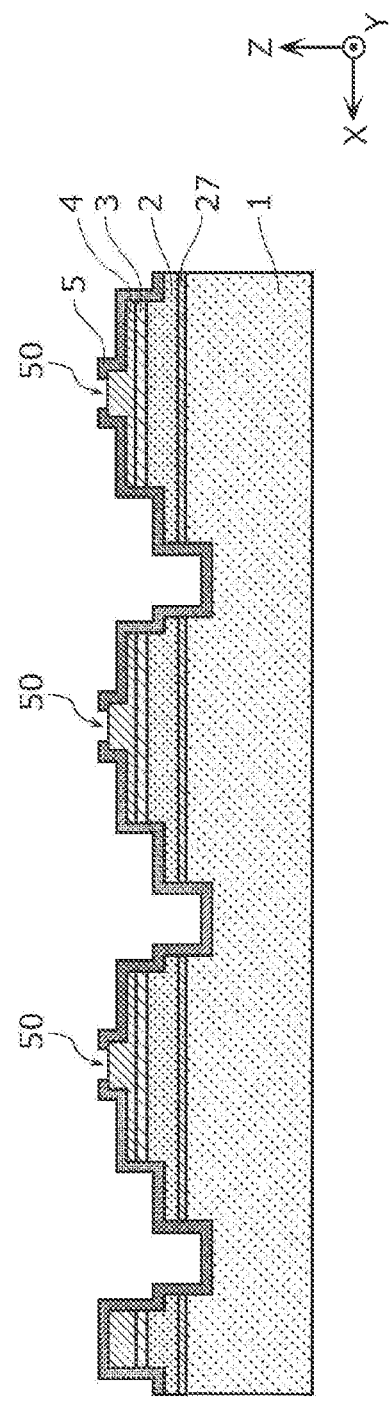
FIG. 25F is a sectional diagram explaining the manufacturing method for the semiconductor laser apparatus according to Embodiment 9.
Figure 25G:
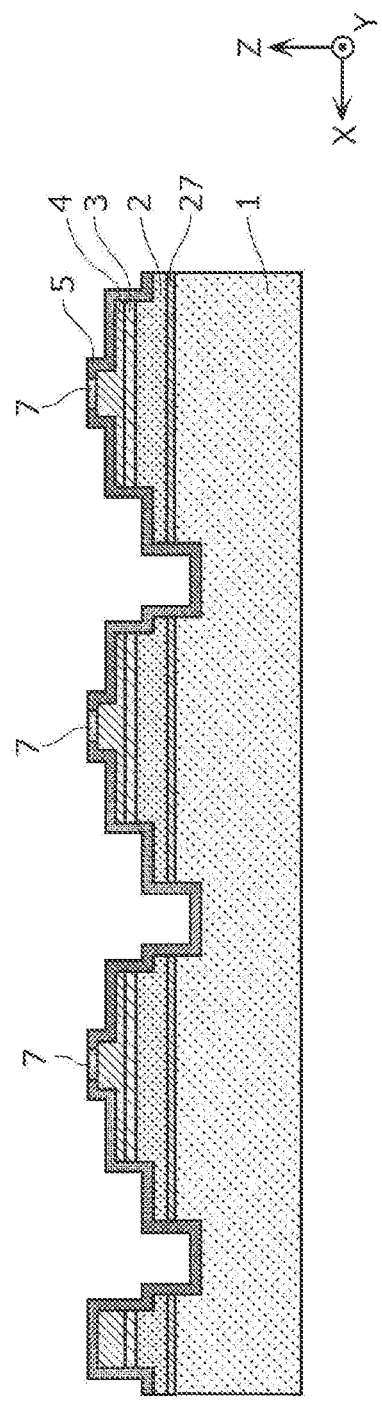
FIG. 25G is a sectional diagram explaining the manufacturing method for the semiconductor laser apparatus according to Embodiment 9.
Figure 25H:
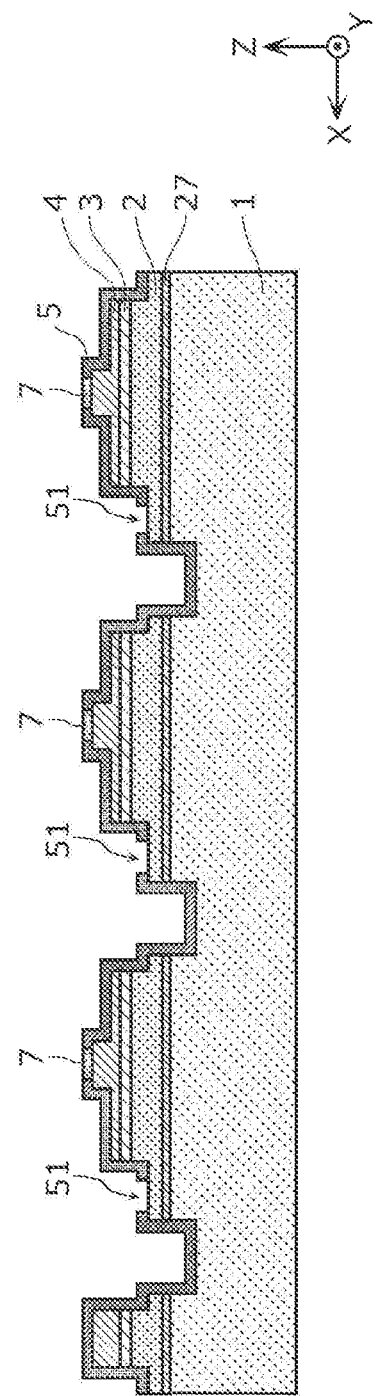
FIG. 25H is a sectional diagram explaining the manufacturing method for the semiconductor laser apparatus according to Embodiment 9.
Figure 25I:
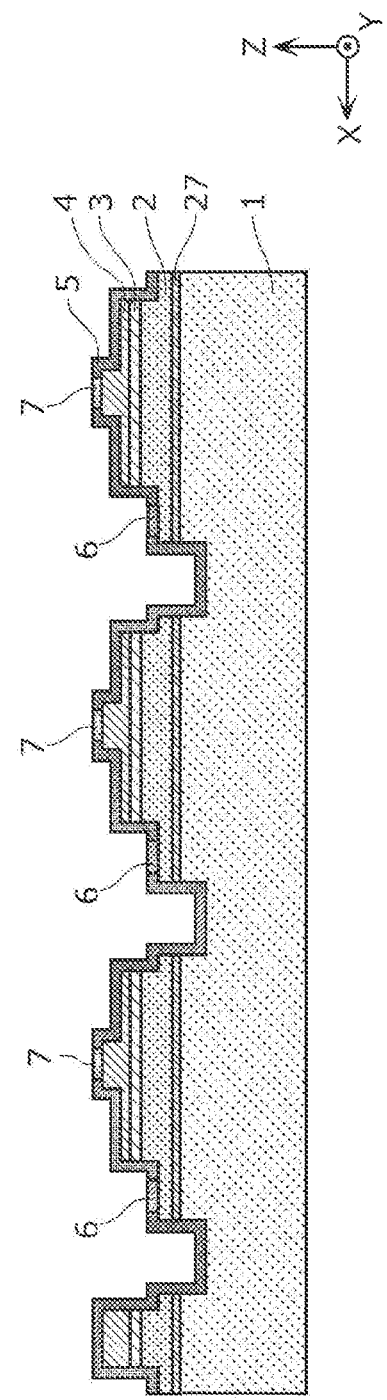
FIG. 25I is a sectional diagram explaining the manufacturing method for the semiconductor laser apparatus according to Embodiment 9.
Figure 25J:
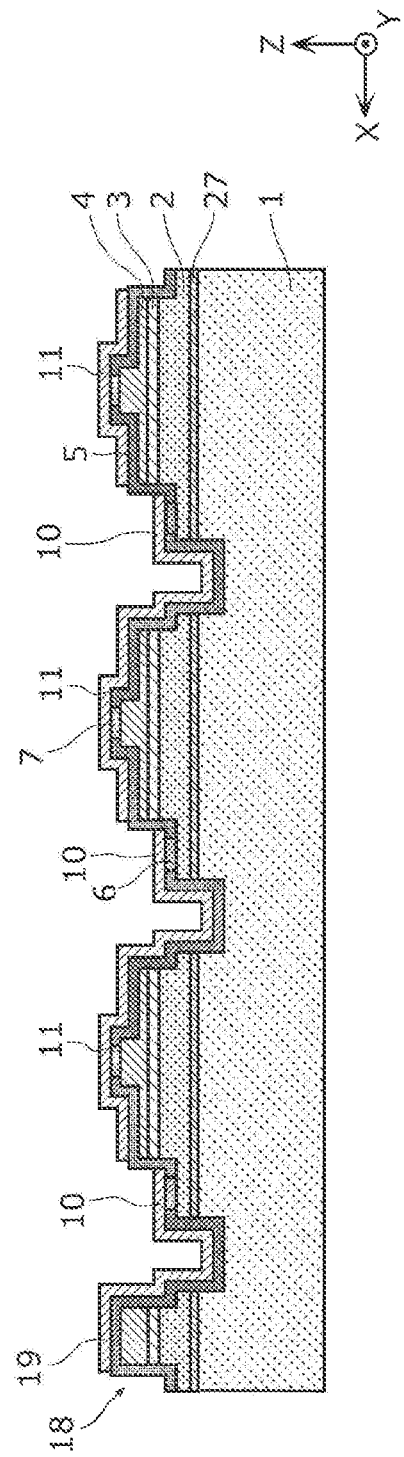
FIG. 25J is a sectional diagram explaining the manufacturing method for the semiconductor laser apparatus according to Embodiment 9.
Figure 25K:
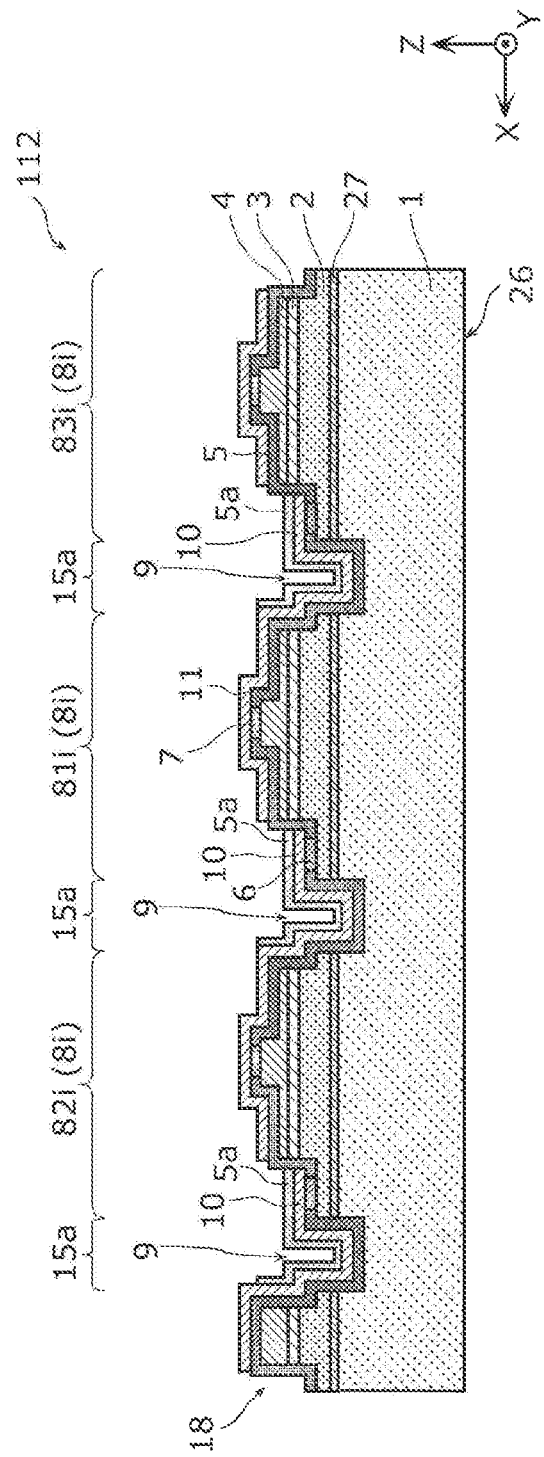
FIG. 25K is a sectional diagram explaining the manufacturing method for the semiconductor laser apparatus according to Embodiment 9.
Figure 25L:
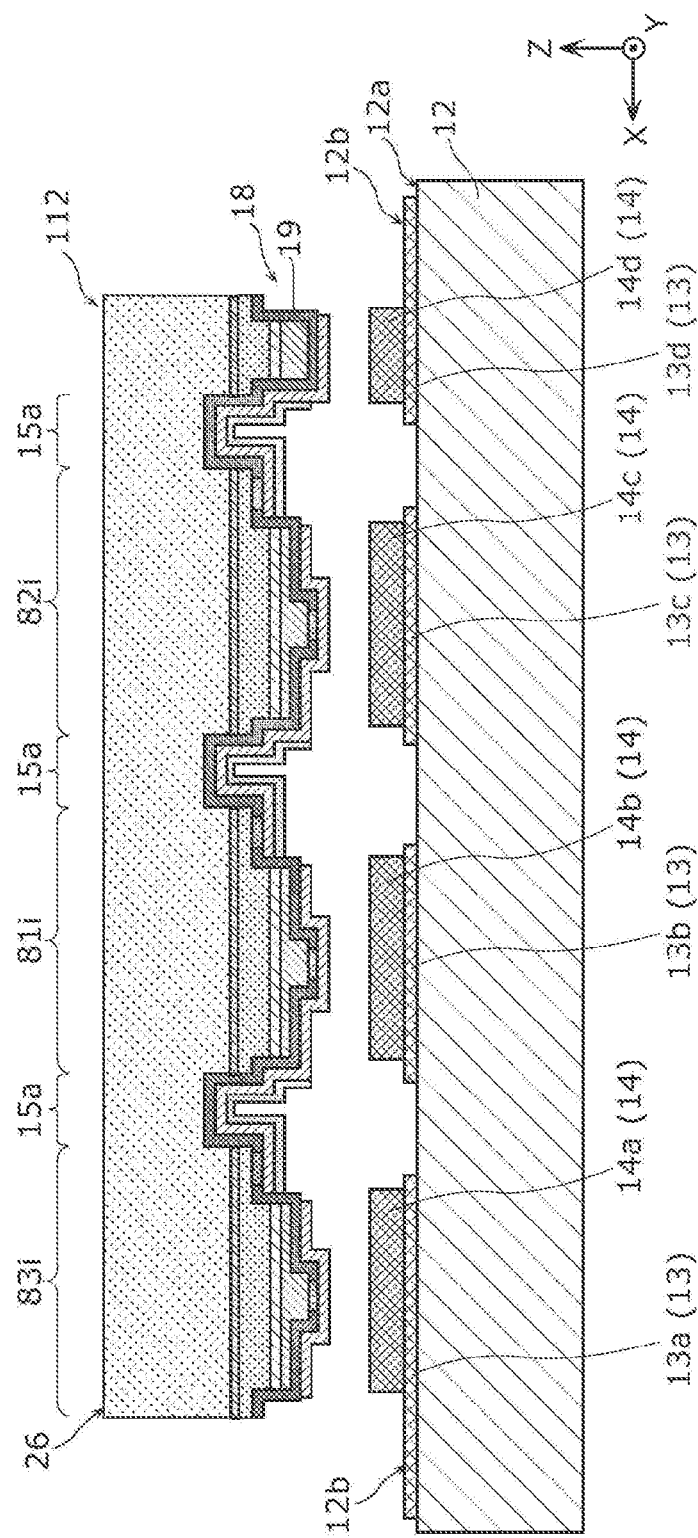
FIG. 25L is a sectional diagram explaining the manufacturing method for the semiconductor laser apparatus according to Embodiment 9.
Figure 25M:
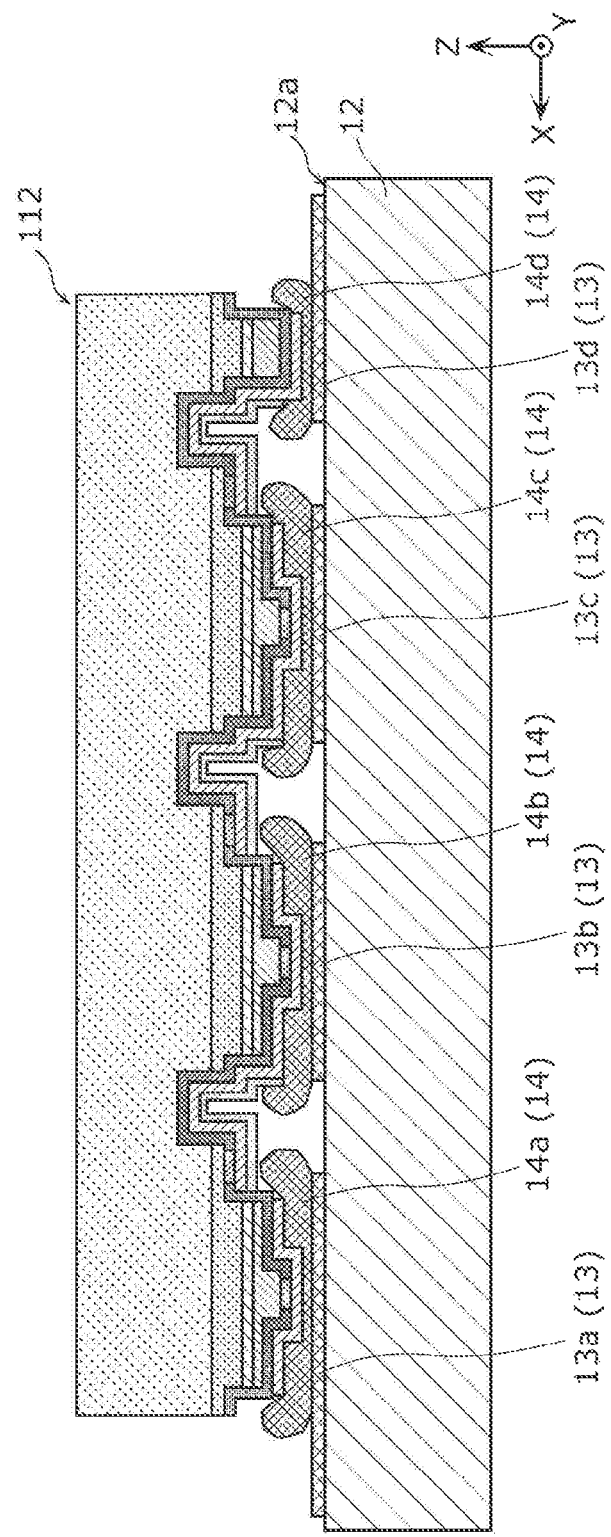
FIG. 25M is a sectional diagram explaining the manufacturing method for the semiconductor laser apparatus according to Embodiment 9.
Figure 25N:
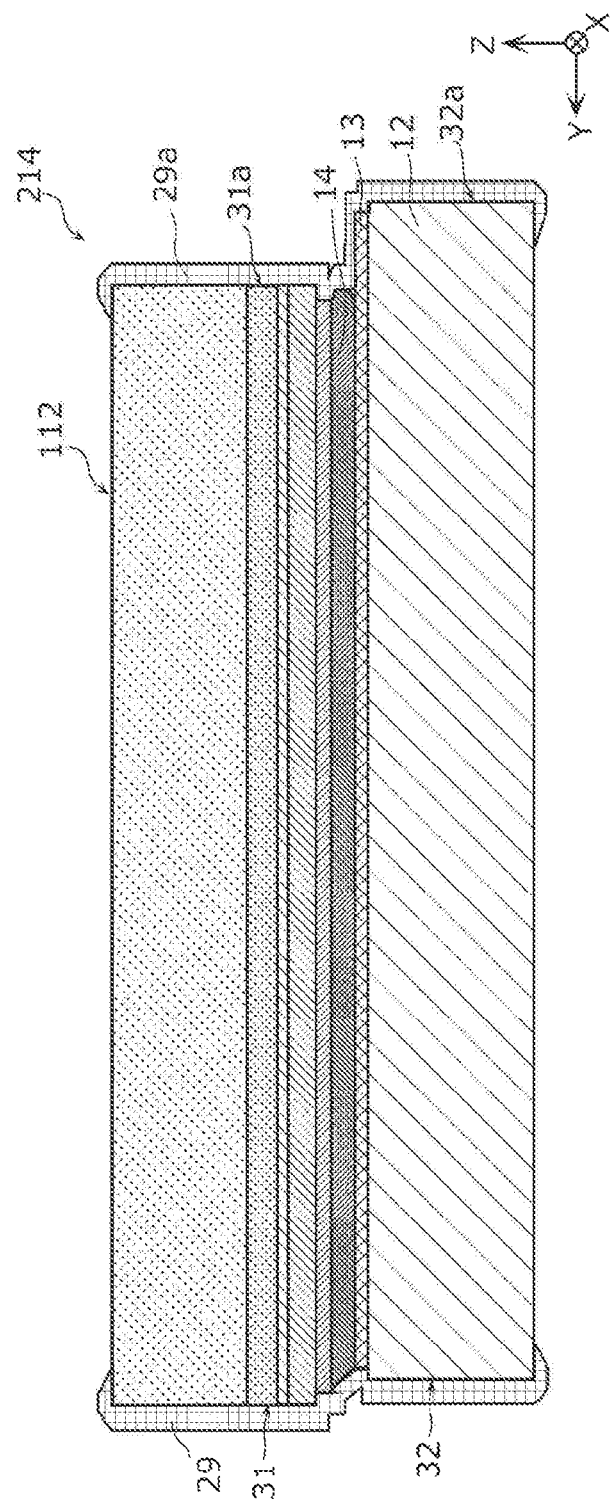
FIG. 25N is a sectional diagram explaining the manufacturing method for the semiconductor laser apparatus according to Embodiment 9.

FIG. 25A to FIG. 25N are each a sectional diagram explaining the manufacturing method for semiconductor laser apparatus 214 according to Embodiment 9. FIG. 26 is a table illustrating the composition of each structural element included in a semiconductor laser apparatus according to the present disclosure. FIG. 26 illustrates examples of materials used in each of the following two cases: when a GaAs material is employed in semiconductor laser device 112; and when a GaN material is employed in semiconductor laser device 112. A GaAs material is employed in the case of emitting infrared laser light from semiconductor laser device 112, and a GaN material is employed in the case of emitting blue laser light from semiconductor laser device 112.

First, current stop layer 27, n-type semiconductor layer 2, active layer 3, and p-type semiconductor layer 4 are formed on substrate 1, as illustrated in FIG. 25A.

For substrate 1, an insulating substrate of n-GaAs, n-GaN, sapphire, or the like, insulating substrate of nitride semiconductor, and the like may be used.

For n-type semiconductor layer 2, n-GaAs, n-AlGaInP, n-AlGaAs, n-GaInP, n-AlGaN, n-GaN, and the like may be used.

Active layer 3 is a layer composed of an undoped barrier layer and an undoped well layer. For active layer 3, AlGaAs, InGaAs, GaAsP, GaAs, InGaN, GaN, and the like may be used.

For p-type semiconductor layer 4, p-AlGaAs, p-AlGaInP, p-GaInP, p-AlGaN, p-GaN, and the like may be used.

For current stop layer 27, p-AlGaInP, p-AlGaN, and the like may be used. For current stop layer 27, not a p-type semiconductor layer but an undoped semiconductor layer may be used.

In the case where an insulating substrate is used as substrate 1, current stop layer 27 may be omitted.

The thickness of substrate 1 is, for example, 80 µm or more, in terms of suppressing warpage of the semiconductor laser device (see FIG. 25K).

Next, groove portion 9 that is a groove reaching substrate 1 is formed by etching to separate the semiconductor stack film (current stop layer 27, n-type semiconductor layer 2, active layer 3, and p-type semiconductor layer 4), as illustrated in FIG. 25B. In this way, the regions corresponding to a plurality of light-emitting device regions 81i, 82i, and 83i are formed as illustrated in FIG. 25K.

In the following description, the plurality of light-emitting device regions 81i, 82i, and 83i included in semiconductor laser device 112 are also collectively referred to as "light-emitting device region 8i" unless they are distinguished.

For example, the width of one light-emitting device region 8i is set to 100 µm or more. At an end of substrate 1 in the width direction, there is a region in which the width of the semiconductor stack film (current stop layer 27, n-type semiconductor layer 2, active layer 3, and p-type semiconductor layer 4) separated by groove portion 9 is narrower than the width of each of the other semiconductor stack films. In this embodiment, this narrow region is the semiconductor stack film located closest to the X-axis positive side in FIG. 25B. The narrow region is formed as protrusion structure 18.

The side wall of groove portion 9 may have an inclined part. This facilitates the formation of insulating film 5 and metal film 13 described later.

Next, p-type semiconductor layer 4 is etched to form ridge portion 16 in p-type semiconductor layer 4, as illustrated in FIG. 25C.

The width of ridge portion 16 is, for example, about 3 µm to 300 µm.

Next, p-type semiconductor layer 4 to n-type semiconductor layer 2 are partially etched to expose n-type semiconductor layer 2 partially, as illustrated in FIG. 25D. In other words, notched portion 9a is formed so that n-type semiconductor layer 2 will not overlap p-type semiconductor layer 4 in a top view.

In the position corresponding to each light-emitting device region 8i, notched portion 9a is formed at both ends in the width direction. In the position corresponding to each light-emitting device region 8i, for example, the width by which n-type semiconductor layer 2 is exposed (i.e. the width of notched portion 9a) is wider than ridge portion 16 at one end and narrower than ridge portion 16 at the other end.

In the position corresponding to each light-emitting device region 8i, the position of ridge portion 16 may be closer to the side where the exposure width of n-type semiconductor layer 2 is wider, than the center of p-type semiconductor layer 4 in the width direction is. This shortens the energization path as in semiconductor laser device 111 included in semiconductor laser apparatus 211 according to Embodiment 7, with it being possible to reduce voltage.

Next, insulating film 5 is formed on the whole surface of the region serving as light-emitting device region 8i, separation region 15a, and protrusion structure 18 illustrated in FIG. 25K, as illustrated in FIG. 25E.

For insulating film 5, $SiO_2$, SiN, $TiO_2$, $ZrO_2$, $Al_2O_3$, $Nb_2O_5$, $Ta_2O_5$, and the like may be used.

The thickness of insulating film 5 is, for example, 50 nm or more.

Next, insulating film 5 is partially etched on ridge portion 16 to form opening 50 and expose p-type semiconductor layer 4 from insulating film 5, as illustrated in FIG. 25F.

Next, p-side electrode 7 is formed at the position where opening 50 is formed in FIG. 25F, as illustrated in FIG. 25G. P-side electrode 7 is, for example, composed of a plurality of layers selected from Ti, Pt, Au, Pd, Ni, and Mg. Specifically, p-side electrode 7 is formed by stacking Pd with a thickness of 40 nm and Pt with a thickness of 40 nm in this order from the p-type semiconductor layer 4 side.

Next, insulating film 5 formed on n-type semiconductor layer 2 is partially etched to form opening 51 and expose n-type semiconductor layer 2 from insulating film 5, as illustrated in FIG. 25H.

Next, n-side electrode 6 is formed at the position where opening 51 is formed in FIG. 25H, as illustrated in FIG. 25I. N-side electrode 6 is, for example, composed of a plurality of layers selected from Ti, Pt, Al, Mo, Au, Ge, and Ni. Specifically, n-side electrode 6 is formed by stacking Ti with a film thickness of 10 nm, Pt with a film thickness of 40 nm, and Au with a film thickness of 0.5 µm in this order from the n-type semiconductor layer 2 side.

Next, first electrode film 10 is formed on n-side electrode 6, and second electrode film 11 is formed on p-side electrode 7, as illustrated in FIG. 25J. In addition, third electrode film 19 is formed on insulating film 5 located at the X-axis positive end, to form protrusion structure 18.

In one light-emitting device region 8i of the plurality of light-emitting device regions 8i, first electrode film 10 and second electrode film 11 are not in contact with each other, and first electrode film 10 is formed over p-side electrode 7 in adjacent light-emitting device region 8i so as to be electrically connected to p-side electrode 7 in adjacent light-emitting device region 8i. Specifically, for example, first electrode film 10a located in first light-emitting device region 81 and second electrode film 11a located in second light-emitting device region 82 are continuously formed as one electrode film, as illustrated in FIG. 1.

For first electrode film 10 and second electrode film 11, Ti, Pt, Au, and the like may be used. Specifically, Ti with a film thickness of 10 nm as an adhesion layer, Pt with a film thickness of 0.24 µm as a barrier layer, and Au with a film thickness of 1.4 µm are formed in this order on insulating film 5, n-side electrode 6, and p-side electrode 8. Alternatively, first electrode film 10 may be formed by stacking Ti with a film thickness of 10 nm, Pt with a film thickness of 40 nm, Au with a film thickness of 0.7 µm as a first Au layer, Pt with a film thickness of 0.2 µm, and Au with a film thickness of 0.7 µm as a second Au layer in this order from the n-side electrode 6 side. Second electrode film 11 has the same stack structure as first electrode film 10.

With such a stack structure, the Pt layer with a film thickness of 0.2 µm (or 0.24 µm) can suppress diffusion of Sn from joining material 14 made of AuSn to the first Au layer in first electrode film 10 and second electrode film 11. This allows the Au layer in first electrode film 10 and second electrode film 11 to remain sufficiently in semiconductor laser apparatus 208 obtained by joining semiconductor laser device 112 to submount 12. Hence, heat dissipation and therefore reliability can be improved.

The thickness of first electrode film 10 and the thickness of second electrode film 11 are, for example, 0.5 µm or more.

Next, insulating film 5a is formed so as to cover part of first electrode film 10, as illustrated in FIG. 25K. Semiconductor laser device 112 including the plurality of light-emitting device regions 8i is thus formed.

The thickness of insulating film 5a is, for example, 50 nm or more.

Next, submount 12 having mounting surface 12a on which the plurality of metal films 13 and joining material 14 on each of the plurality of metal films 13 are formed is prepared, and semiconductor laser device 112 is junction-down mounted on mounting surface 12a of submount 12, as illustrated in FIG. 25L and FIG. 25M.

For submount 12, AlN, SiC, diamond, and the like may be used.

Each metal film 13 formed on submount 12 is, for example, a stack film of Ti, Pt, Au, and the like. Specifically, for example, metal film 13 may be metal film 33 included in semiconductor laser apparatus 208 according to Embodiment 4.

Joining material 14 such as solder is formed on metal film 13. Joining material 14 is, for example, AuSn.

Next, protective films 29 and 29a are formed on end surfaces 31 and 31a of semiconductor laser device 112 in the resonator length direction (the Y-axis direction in this embodiment) using electron cyclotron resonance (ECR) sputtering, as illustrated in FIG. 25N.

Protective films 29 and 29a can be formed by a plurality of layers selected from $Al_2O_3$, $SiO_2$, $Ta_2O_5$, $Si_3N_4$, AlN, AlON, and SiN.

Semiconductor laser apparatus 214 is manufactured as a result of the above-described process.

Embodiment 10

A semiconductor laser apparatus according to Embodiment 10 will be described below. In the description of the semiconductor laser apparatus according to Embodiment 10, the differences from semiconductor laser apparatus 200 according to Embodiment 1 will be mainly described while giving, to the same structural elements as in semiconductor laser apparatus 200 according to Embodiment 1, the same reference marks and simplifying or omitting their description as appropriate.

Figure 27A:
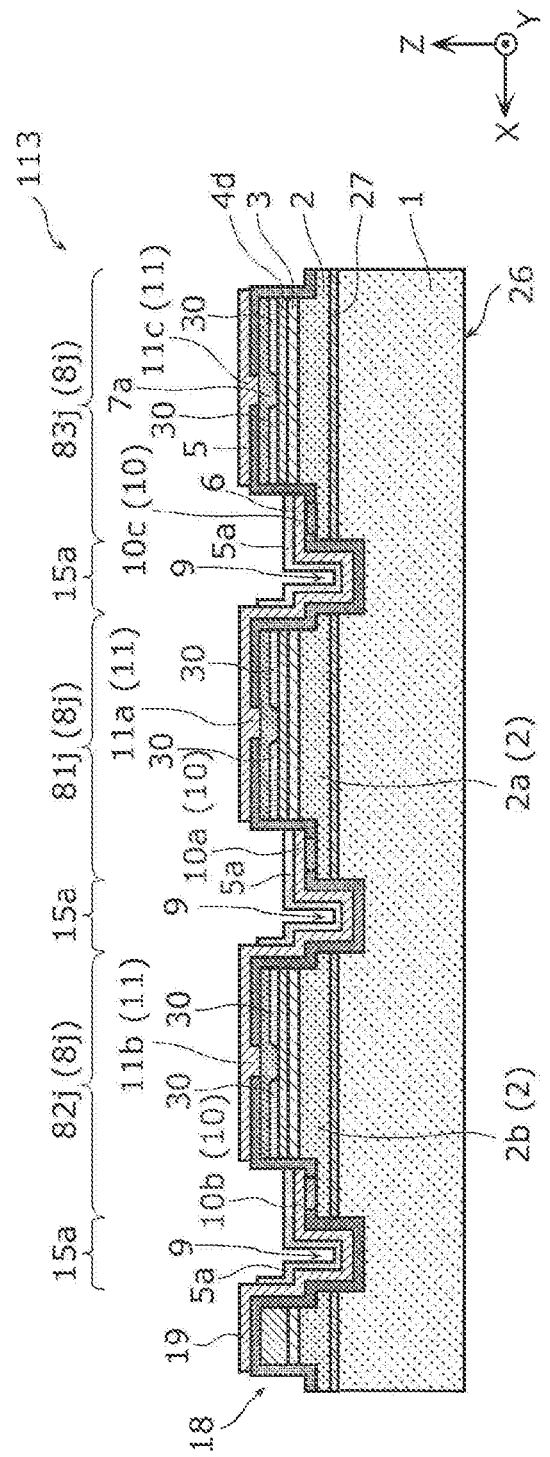
FIG. 27A is a sectional diagram illustrating a semiconductor laser device according to Embodiment 10.
Figure 27B:
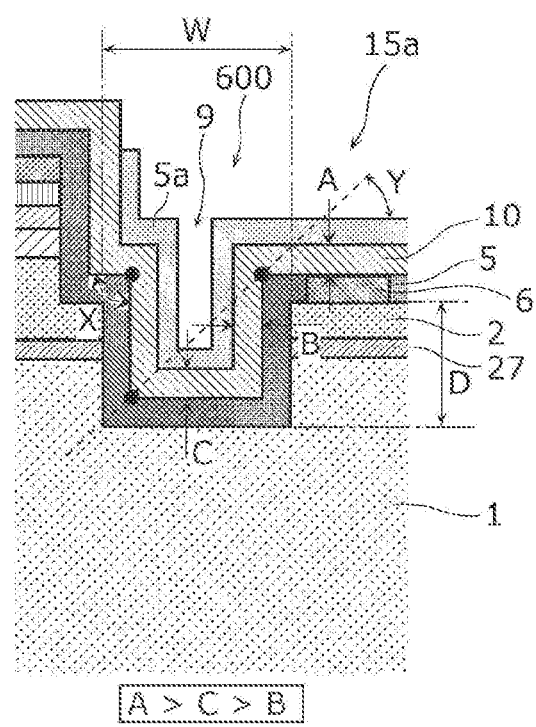
FIG. 27B is a partially enlarged sectional diagram of a separation region illustrated in FIG. 27A.
Figure 28:
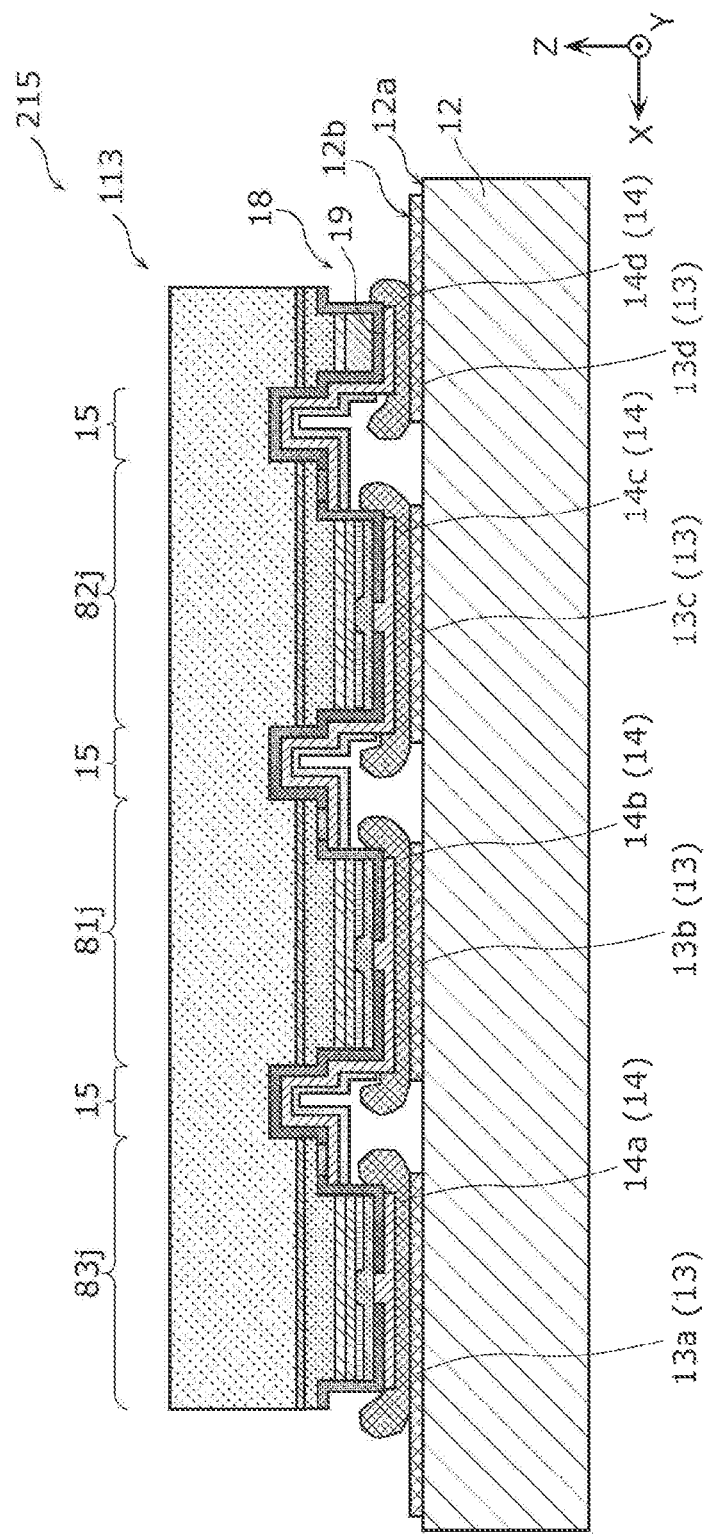
FIG. 28 is a sectional diagram illustrating a semiconductor laser apparatus according to Embodiment 10.

FIG. 27A is a sectional diagram illustrating semiconductor laser device 113 according to Embodiment 10. FIG. 27B is an enlarged diagram of separation region 15a and its vicinity in the sectional diagram in FIG. 27A. FIG. 28 is a sectional diagram illustrating semiconductor laser apparatus 215 according to Embodiment 10.

Semiconductor laser device 113 included in semiconductor laser apparatus 215 according to Embodiment 10 includes a plurality of light-emitting device regions 81j, 82j, and 83j. The plurality of light-emitting device regions 81j, 82j, and 83j differ from light-emitting device regions 8 included in semiconductor laser device 100 according to Embodiment 1 in that p-type semiconductor layer 4d has no ridge portion and current block layer 30 is formed on p-type semiconductor layer 4d.

In the following description, the plurality of light-emitting device regions 81j, 82j, and 83j included in semiconductor laser device 113 are also collectively referred to as "light-emitting device region 8j" unless they are distinguished.

Current block layer 30 is a layer for narrowing the current injection path. Current block layer 30 is, for example, an insulating film of $SiO_2$ or the like.

P-side electrode 7a is in contact with p-type semiconductor layer 4d and covers current block layer 30.

As described above, semiconductor laser device 100 included in semiconductor laser apparatus 200 according to Embodiment 1 is a ridge waveguide-type semiconductor laser device in which the plurality of light-emitting device regions 8 each have ridge portion 16. Alternatively, the semiconductor laser device may be an embedded waveguide-type semiconductor laser device in which the plurality of light-emitting device regions 8j each have current block layer 30 embedded in the semiconductor stack film, as in semiconductor laser device 113 included in semiconductor laser apparatus 215 according to Embodiment 10.

With such a structure, too, the same advantageous effects as semiconductor laser apparatus 200 can be achieved.

In semiconductor laser device 113 included in semiconductor laser apparatus 215 according to Embodiment 10, the film thickness of n-type semiconductor layer 2 may be 3 μm or more and 50 μm or less. Separation region 15a has a shape that differs depending on the film thickness of n-type semiconductor layer 2. The shape of separation region 15a will be described in detail below, with reference to FIG. 27A and FIG. 27B.

In separation region 15a, groove portion 9 of substrate 1 and a separation portion of current stop layer 27 and a separation portion of n-type semiconductor layer 2 that are open continuously from groove portion 9 constitute separation groove 600. The separation portion of n-type semiconductor layer 2 in separation groove 600 has its side surfaces on the extension line of the side surfaces of groove portion 9, and does not include the part sandwiched by the side surfaces not on the extension line of the side surfaces of groove portion 9.

Depth D of separation groove 600 is the distance from a surface parallel to the upper surface of substrate 1 in a level difference part formed in n-type semiconductor layer 2 to the bottom surface of groove portion 9 of substrate 1. Open width W of separation groove 600 matches the width of the uppermost part of the separation portion of n-type semiconductor layer 2 (i.e. the width of separation groove 600 farthest from substrate 1).

In separation region 15a, insulating film (second insulating film) 5, electrode film 10, and insulating film (first insulating film) 5a are stacked in this order from the separation groove 600 side, on the bottom surface and side surfaces of separation groove 600. Of insulating film 5, electrode film 10, and insulating film 5a stacked in separation groove 600, the part formed on the bottom surface and side surfaces of groove portion 9 of substrate 1 is included in separation region 15a, and the part formed on the upper surface and side surfaces of stack structure 500 is included in light-emitting device region 8j.

For example, in the case where the film thickness of n-type semiconductor layer 2 is 3 μm, depth D is 3.2 μm or more and 4.2 μm or less, and open width W is approximately 10 μm. In separation region 15a located between light-emitting device region 82j and light-emitting device region 81j, angle X of the upper corner of separation groove 600 on the light-emitting device region 82j side (on the side of the light-emitting device region closer to p-side electrode 7a than to n-side electrode 6 from among the adjacent light-emitting device regions) in insulating film 5 formed in separation groove 600 in a sectional view is 90°. Angle X is the angle between the side surface of separation groove 600 and the upper surface of the level difference part formed in the n-type semiconductor layer. In this case, the film thickness of electrode film 10 located between insulating film 5 and insulating film 5a is 3 μm (film thickness A in FIG. 27B) on n-side electrode 6 on the light-emitting device region 81j side (on the side of the light-emitting device region closer to n-side electrode 6 than to p-side electrode 7a from among the adjacent light-emitting device regions), 2.25 μm (film thickness B in FIG. 27B) on the side surface of separation groove 600, and 2.37 μm (film thickness C in FIG. 27B) on the bottom surface of separation groove 600. Film thickness B of electrode film 10 on the side surface of separation groove 600 and film thickness C of electrode film 10 on the bottom surface of separation groove 600 are respectively 75% and 79% of film thickness A of electrode film 10 on n-side electrode 6.

For example, in the case where the film thickness of n-type semiconductor layer 2 is 20 μm, depth D is approximately 21 μm, and open width W is approximately 20 μm. Angle X of the upper corner of separation groove 600 on the light-emitting device region 82j side is 90°. In this case, the film thickness of electrode film 10 located between insulating film 5 and insulating film 5a is 3 μm (film thickness A in FIG. 27B) on n-side electrode 6 on the light-emitting device region 81j side, 2.25 μm (film thickness B in FIG. 27B) on the side surface of separation groove 600, and 2.37 μm (film thickness C in FIG. 27B) on the bottom surface of separation groove 600. Film thickness B of electrode film 10 on the side surface of separation groove 60 and film thickness C of electrode film 10 on the bottom surface of separation groove 60 are respectively 75% and 79% of film thickness A of electrode film 10 on n-side electrode 6.

Regardless of the film thickness of n-type semiconductor layer 2, in insulating film 5 formed in separation groove 600, angle Y between a straight line (straight line designated by the dashed line in FIG. 27B) connecting the lower corner on the light-emitting device region 82j side in separation groove 600 and the upper corner of light-emitting device region 81j and the bottom surface of separation groove 600 may be 70° or less. As a result of angle Y being 70° or less, the coatability of electrode film 10 inside separation groove 600 can be improved.

[Variation]

A variation of the semiconductor laser apparatus according to Embodiment 10 will be described below. In the variation described below, the differences from the structural elements included in semiconductor laser apparatus 215 according to Embodiment 10 will be mainly described while simplifying or omitting the description of the same structural elements as appropriate.

[Variation 1]

Figure 30A:
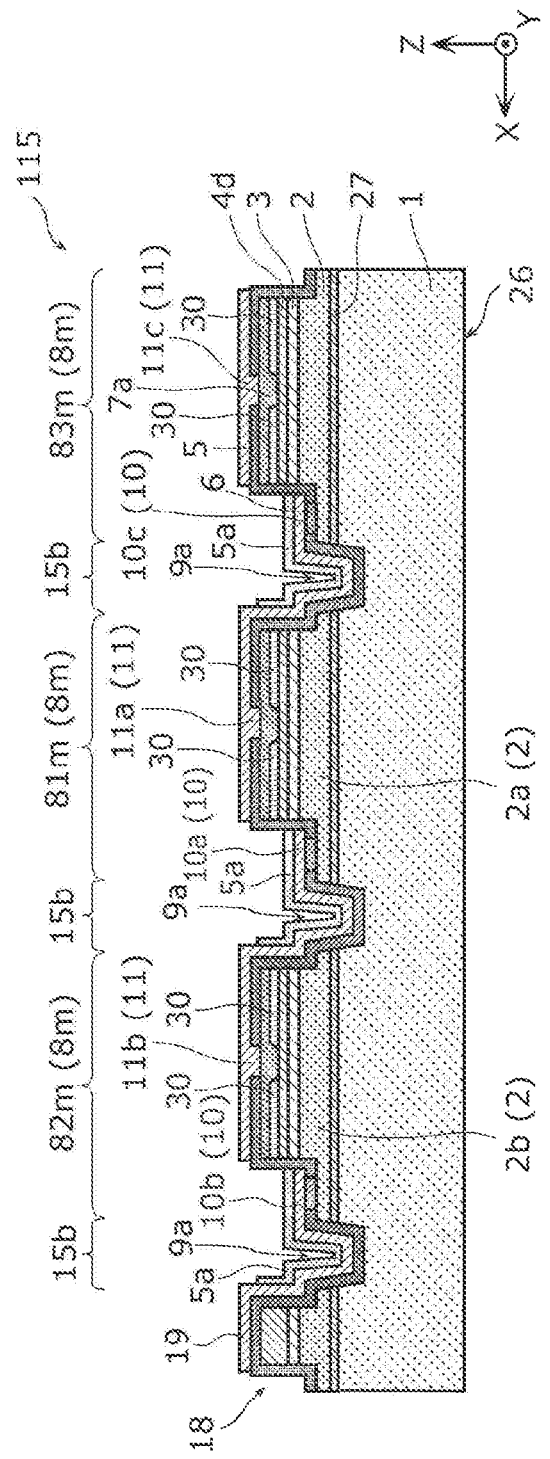
FIG. 30A is a sectional diagram illustrating a semiconductor laser device according to Variation 1 of Embodiment 10.
Figure 30B:
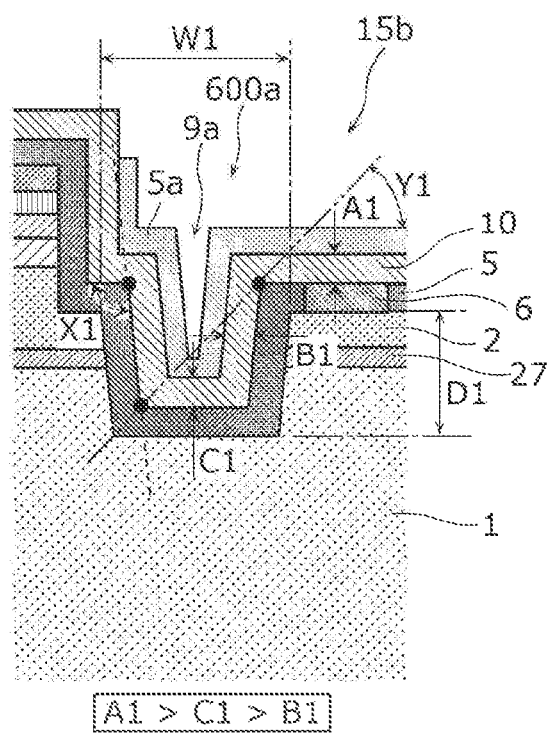
FIG. 30B is a partially enlarged sectional diagram of a separation region illustrated in FIG. 30A.
Figure 31:
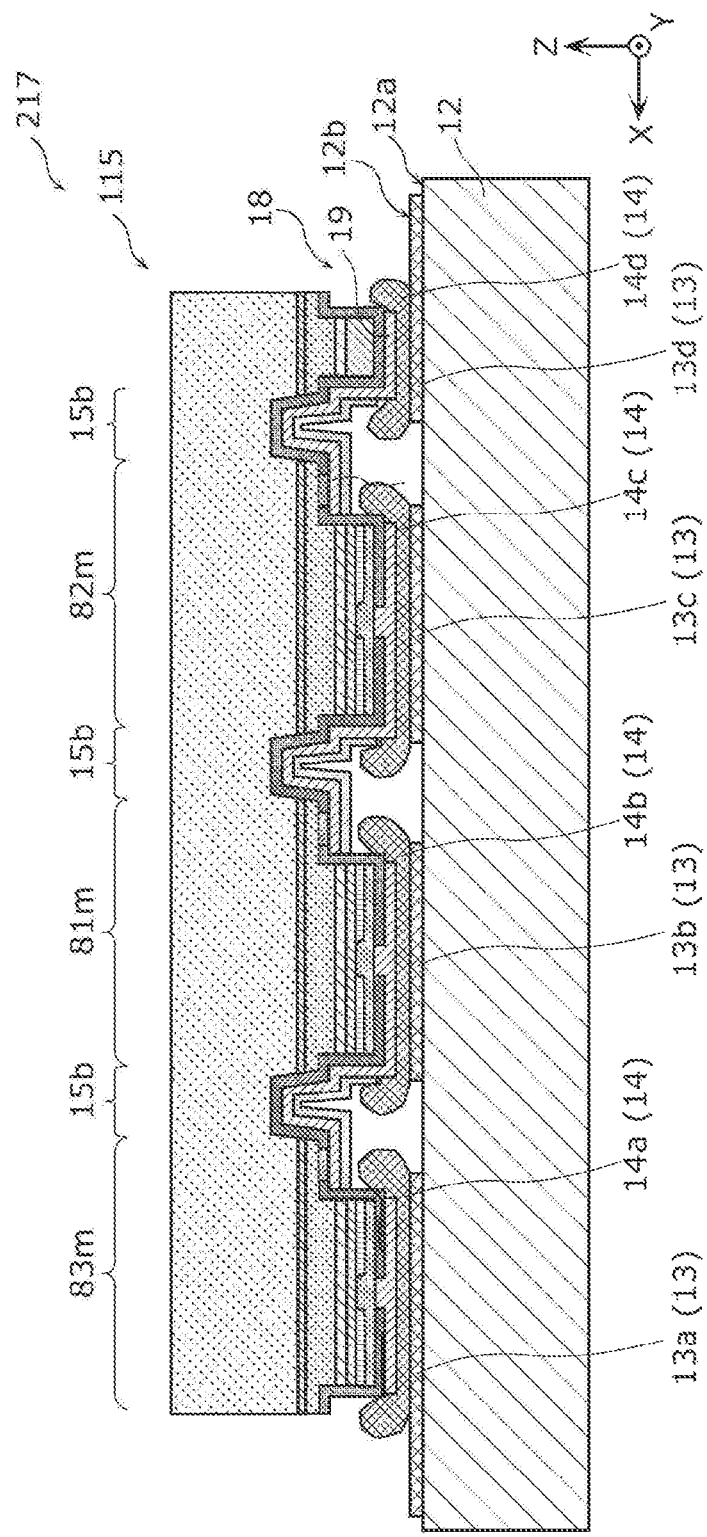
FIG. 31 is a sectional diagram illustrating a semiconductor laser apparatus according to Variation 1 of Embodiment 10.

FIG. 30A is a sectional diagram illustrating semiconductor laser device 115 according to Variation 1 of Embodiment 10. FIG. 30B is an enlarged diagram of separation region 15b and its vicinity in the sectional diagram in FIG. 30A. FIG. 31 is a sectional diagram illustrating semiconductor laser apparatus 217 according to Variation 1 of Embodiment 10.

Semiconductor laser apparatus 217 according to Variation 1 of Embodiment 10 differs from semiconductor laser apparatus 215 according to Embodiment 10 only in the structure of semiconductor laser device 115.

In the following description, a plurality of light-emitting device regions 81m, 82m, and 83m included in semiconductor laser device 115 are also collectively referred to as "light-emitting device region 8m" unless they are distinguished.

In Variation 1, separation groove 600a in separation region 15b has open width W1 that is wider than the bottom width, unlike separation groove 600 in separation region 15a. The side surface on the light-emitting device region 82m side in separation groove 600a in separation region 15b interposed between light-emitting device region 81m and light-emitting device region 82m is inclined toward p-side electrode 7a in light-emitting device region 82m on the open side, and the side surface on the light-emitting device region 81m side is inclined toward n-side electrode 6 in light-emitting device region 81m on the open side. In the case where semiconductor laser apparatus 217 is composed of a zinc blende structure such as AlGaAs, GaInAs, or GaInP, the inclined side surface has plane orientation close to (111) plane.

When the film thickness of n-type semiconductor layer 2 is greater, separation groove 600a is deeper. In the case where the side surface of separation groove 600a is perpendicular to the bottom surface of separation groove 600a, when separation groove 600a is deeper, film thickness 81 of electrode film 10 formed on the side surface of separation groove 600a is thinner. As a result of the side surface of separation groove 600a being inclined as in this variation, the difference between film thickness C1 of electrode film 10 on the bottom of separation groove 600a and film thickness B1 of electrode film 10 on the side surface of separation groove 600a can be reduced.

In separation region 15b located between light-emitting device region 82m and light-emitting device region 81m, angle X1 of the upper corner of separation groove 600a on the light-emitting device region 82m side (on the side of the light-emitting device region closer to p-side electrode 7a than to n-side electrode 6 from among the adjacent light-emitting device regions) in insulating film 5 formed in separation groove 600a in a sectional view is greater than 90°. Angle X1 may be 110° or more. Regardless of the film thickness of n-type semiconductor layer 2, in insulating film 5 formed in separation groove 600a, angle Y1 between a straight line (designated by the dashed-two dotted line in FIG. 30B) connecting the lower corner on the light-emitting device region 82m side in separation groove 600a and the upper corner of light-emitting device region 81m and the bottom surface of separation groove 600a may be 70° or less. As a result of angle X1 being 110° or more and angle Y1 being 70° or less, the coatability of electrode film 10 inside separation groove 600a can be improved.

In semiconductor laser device 115 included in semiconductor laser apparatus 217 according to Variation 1, the film thickness of n-type semiconductor layer 2 may be 3 μm or more and 50 μm or less.

For example, in the case where the film thickness of n-type semiconductor layer 2 is 3 μm, depth D1 is 3.2 μm or more and 4.2 μm or less, and open width W1 is approximately 10 μm. In separation region 15b located between light-emitting device region 82m and light-emitting device region 81m, angle X1 is 130°. In this case, the film thickness of electrode film 10 located between insulating film 5 and insulating film 5a is 3 μm (film thickness A1 in FIG. 30B) on n-side electrode 6 on the light-emitting device region 81m side (on the side of the light-emitting device region closer to n-side electrode 6 than to p-side electrode 7a from among the adjacent light-emitting device regions), 2.34 μm (film thickness B1 in FIG. 30B) on the side surface of separation groove 600a, and 2.37 μm (film thickness C1 in FIG. 30B) on the bottom surface of separation groove 600a. Film thickness B1 of electrode film 10 on the side surface of separation groove 600a and film thickness C1 of electrode film 10 on the bottom surface of separation groove 600a are respectively 78% and 79% of film thickness A1 of electrode film 10 on n-side electrode 6.

For example, in the case where the film thickness of n-type semiconductor layer 2 is 20 μm, depth D1 is approximately 21 μm, and open width W1 is approximately 38 μm. Angle X of the upper corner of separation groove 600a on the light-emitting device region 82m side is 130°. In this case, the film thickness of electrode film 10 located between insulating film 5 and insulating film 5a is 3 μm (film thickness A1 in FIG. 30B) on n-side electrode 6 on the light-emitting device region 81m side, 2.34 μm (film thickness B1 in FIG. 30B) on the side surface of separation groove 600a, and 2.37 μm (film thickness C1 in FIG. 30B) on the bottom surface of separation groove 600a. Film thickness B1 of electrode film 10 on the side surface of separation groove 60a and film thickness C1 of electrode film 10 on the bottom surface of separation groove 60a are respectively 78% and 79% of film thickness A1 of electrode film 10 on n-side electrode 6.

For example, in the case where n-side electrode 6 is located only on one side of the opening of current block layer 30 in each light-emitting device region 8j in Embodiment 10 or in each light-emitting device region 8m in Variation 1, particularly in the case where the film thickness of n-side semiconductor layer 2 is as thin as 3 μm, current injected into semiconductor laser apparatus 215 or semiconductor laser apparatus 217 is biased to the n-side electrode 6 side in each light-emitting device region 8j or each light-emitting device region 8m, as a result of which the light distribution becomes asymmetric and the half-width of a far field pattern (FFP) increases.

Table 1 shows the characteristics in the case of using a GaAs layer as n-type semiconductor layer 2 in a GaAs semiconductor laser device. Calculation was performed with the width of the p-type semiconductor layer and the active layer being set to 90 μm and the width of the current injection region (the open width of current block layer 30) being set to 80 μm. The current density ununiformity is the difference between the maximum value and the minimum value of the current density in the waveguide. In the case where the film thickness of n-type semiconductor layer 2 is 3 μm, the current density ununiformity is 121 A/cm$^2$, and the FFP half-width is 5.2°. In the case where the film thickness of n-type semiconductor layer 2 is 20 μm, the current density ununiformity is 47 A/cm$^2$, and the FFP half-width is 4.7°.

TABLE 1

| GaAs film thickness (μm) | Current density ununiformity (A/cm$^2$) | FFP half-width (°) |
|---|---|---|
| 3 | 121 | 5.2 |
| 20 | 47 | 4.7 |

In the case of an upper and lower electrode structure in which n-side electrode 6 in the semiconductor laser device is located on the surface of substrate 1 opposite to the surface on which the light-emitting device regions are formed, the current density in the waveguide is uniform. In this case, the FFP half-width is 4.7°. This demonstrates that, in the case where the film thickness of n-type semiconductor layer 2 is 20 μm in Embodiment 10 and Variation 1, the ununiformity in current distribution in the waveguide is improved, and as a result the FFP half-width in Embodiment 10 and Variation 1 is equal to the FFP half-width in the case where the current density is uniform. Therefore, the film thickness of n-type semiconductor layer 2 is preferably 20 μm or more. In terms of the film formation time required in the crystal growth process for n-type semiconductor layer 2, the film thickness of n-type semiconductor layer 2 is preferably 25 μm or less. Further, if depth D1 of separation groove 600a is 25 μm or less, open width W1 can be limited to 50 μm or less.

Thus, by increasing the film thickness of n-type semiconductor layer 2, bias of current in light-emitting device region 8j and light-emitting device region 8m can be suppressed to thus improve the light distribution symmetry.

In the case where the thickness of substrate 1 is less than the thickness of n-type semiconductor layer 2, the thickness from the bottom surface of groove portion 9 formed in substrate 1 to the surface of substrate 1 opposite to the surface on which light-emitting device region 8j or light-emitting device region 8m is formed is thin, and the strength of semiconductor laser device 113 or semiconductor laser device 115 decreases, so that an anomaly tends to occur in the cleavage process or the mounting process. For example, in the cleavage process, the cleavage surface tends to be misaligned from a predetermined position in the groove portion. In the mounting process, cracking tends to occur in the groove portion. Accordingly, in the case where the film thickness of n-type semiconductor layer 2 is 20 μm or more, the thickness of substrate 1 may be thicker than the film thickness of n-type semiconductor layer 2. For example, in the case where the film thickness of n-type semiconductor layer 2 is 20 μm, the film thickness of substrate 1 is 80 μm. In each of semiconductor laser devices 113 and 115 included in semiconductor laser apparatuses 215 and 217 according to Embodiment 10 and Variation 1 respectively, the film thickness of n-type semiconductor layer 2 may be 20 μm or more and 50 μm or less.

As a result of the film thickness of substrate 1 being greater than the film thickness of n-type semiconductor layer 2, the strength of each of semiconductor laser devices 113 and 115 can be ensured, and anomalies in the manufacturing process can be prevented.

Embodiment 11

A semiconductor laser apparatus according to Embodiment 11 will be described below. In the description of the semiconductor laser apparatus according to Embodiment 11, the differences from semiconductor laser apparatus 200 according to Embodiment 1 will be mainly described while giving, to the same structural elements as in semiconductor laser apparatus 200 according to Embodiment 1, the same reference marks and simplifying or omitting their description as appropriate.

Figure 29:
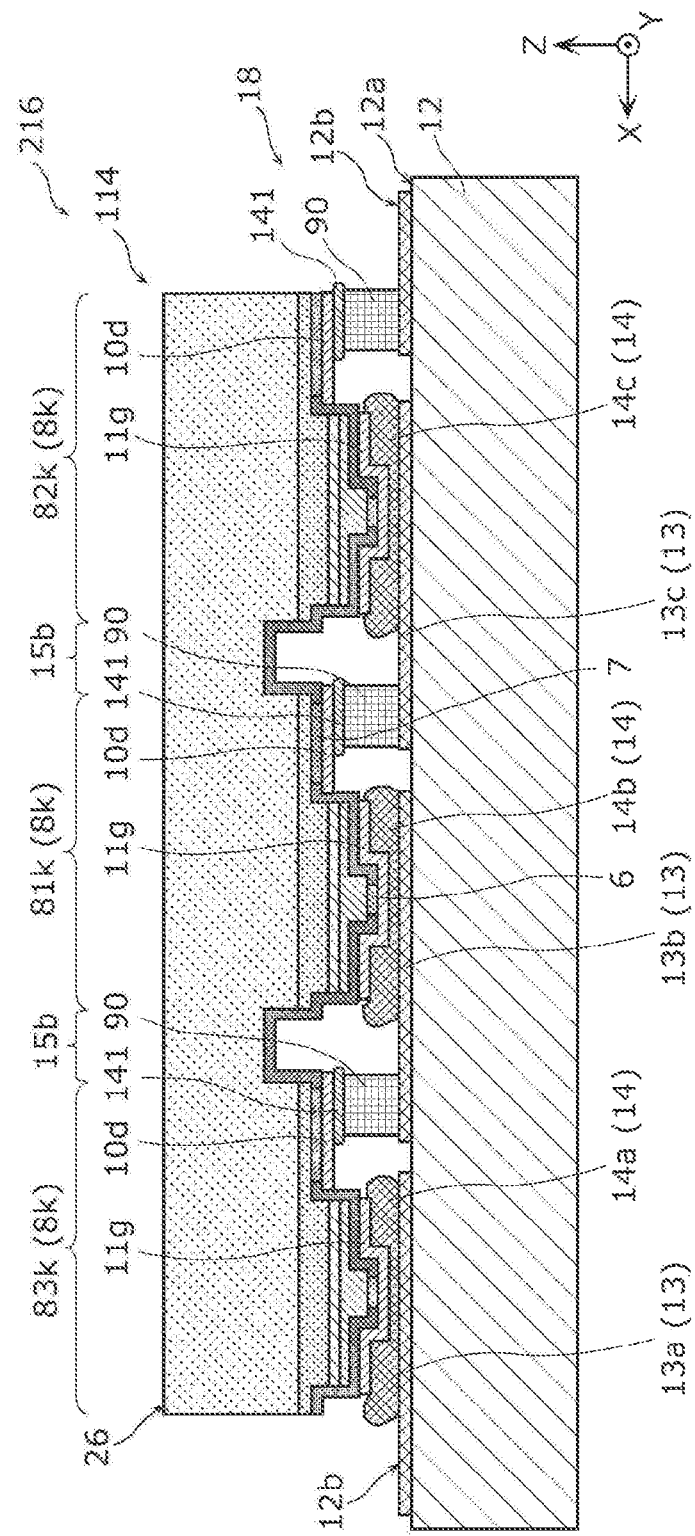
FIG. 29 is a sectional diagram illustrating a semiconductor laser apparatus according to Embodiment 11.

FIG. 29 is a sectional diagram illustrating semiconductor laser apparatus 216 according to Embodiment 11.

Semiconductor laser device 114 included in semiconductor laser apparatus 216 according to Embodiment 11 includes a plurality of light-emitting device regions 81k, 82k, and 83k. The plurality of light-emitting device regions 81k, 82k, and 83k differ from light-emitting device regions 8 included in semiconductor laser device 100 according to Embodiment 1 in that first electrode film 10d and second electrode film 11g do not constitute one electrode film but are formed individually. Specifically, for example, first electrode film 10d in first light-emitting device region 81k and second electrode film 11g in second light-emitting device region 82k are electrically connected via joining material 141, joining member 90, metal film 13c, and joining material 14c.

In the following description, the plurality of light-emitting device regions 81k, 82k, and 83k included in semiconductor laser device 114 also collectively referred to as "light-emitting device region 8k" unless they are distinguished.

Joining material 141 and joining member 90 are members for connecting semiconductor laser device 100 and submount 12, as with joining material 14 included in semiconductor laser apparatus 200 according to Embodiment 1. Joining member 90 is columnar in order to connect first electrode film 10d and metal film 13.

As described above, semiconductor laser apparatus 216 includes joining member 90 that compensates for the difference in height between p-side electrode 7 and n-side electrode 6, on the n-side electrode 6 side. Light-emitting device regions 8k are electrically connected by metal film 13 provided on submount 12. Semiconductor laser device 114 is junction-down mounted via joining material 141 and joining member 90.

With such a structure, the same advantageous effects as semiconductor laser apparatus 200 according to Embodiment 1 can be achieved.

Other Embodiments

While the semiconductor laser apparatuses and semiconductor laser devices according to the embodiments and variations of the present disclosure have been described above, the present disclosure is not limited to such embodiments and variations. Other modifications obtained by applying various changes conceivable by a person skilled in the art to the embodiments and variations and any combinations of the structural elements in different embodiments without departing from the scope of the present disclosure are also included in the scope of one or more aspects.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

A semiconductor laser apparatus according to the present disclosure can be used as a semiconductor laser apparatus including a semiconductor laser device, and is usable, for example, in a light source of a laser machining apparatus for working members using laser light.

The invention claimed is:

1. A semiconductor laser apparatus, comprising:
a semiconductor laser device for junction-down mounting that includes a first light-emitting device region and a second light-emitting device region formed separately on a substrate, wherein:
the first light-emitting device region and the second light-emitting device region in the semiconductor laser device each have a stack structure in which a one-conductivity-type semiconductor layer of one conductivity type, an active layer, and an other-conductivity-type semiconductor layer of an other conductivity type different from the one conductivity type are stacked in stated order,
the first light-emitting device region includes a first electrode film located on the one-conductivity-type semiconductor layer,
the second light-emitting device region includes a second electrode film located on the other-conductivity-type semiconductor layer,
the first electrode film and the second electrode film are electrically connected to each other,
the first light-emitting device region includes a one-conductivity-type semiconductor layer-side electrode located on the one-conductivity-type semiconductor layer, and an other-conductivity-type semiconductor layer-side electrode located on the other-conductivity-type semiconductor layer,
in the first light-emitting device region, a first protrusion portion protruding in a direction opposite to the substrate is located between the one-conductivity-type semiconductor layer-side electrode and the other-conductivity-type semiconductor layer-side electrode, and
the other-conductivity-type semiconductor layer in the first light-emitting device region includes the first protrusion portion located between the one-conductivity-type semiconductor layer-side electrode and the other-conductivity-type semiconductor layer-side electrode.

2. The semiconductor laser apparatus according to claim 1, wherein a separation region is located between the first light-emitting device region and the second light-emitting device region, the separation region being a region at which the one-conductivity-type semiconductor layer in the first light-emitting device region and the one-conductivity-type semiconductor layer in the second light-emitting device region are separated.

3. The semiconductor laser apparatus according to claim 1, wherein:
the other-conductivity-type semiconductor layer has a first end at which the first protrusion portion is located, and a second end opposite to the first end,
a second protrusion portion protruding in a direction opposite to the substrate is located at the second end of the other-conductivity-type semiconductor layer, and
the first end and the second end are arranged in an arrangement direction of the first light-emitting device region and the second light-emitting device region.

4. The semiconductor laser apparatus according to claim 1, wherein the first protrusion portion is composed of at least two layers of insulating films.

5. The semiconductor laser apparatus according to claim 1, wherein
the semiconductor laser device includes a plurality of light-emitting device regions including the first light-emitting device region and the second light-emitting device region,
the second light-emitting device region is located endmost in an arrangement direction in which the plurality of light-emitting device regions are arranged,
a protrusion structure protruding from the substrate is located adjacent to the second light-emitting device region and on an opposite side of the second light-emitting device region to the first light-emitting device region,
a height of the protrusion structure from the substrate is approximately same as a height of the second light-emitting device region from the substrate, and
a third electrode film located on a surface of the protrusion structure and the one-conductivity-type semiconductor layer in the second light-emitting device region are electrically connected to each other.

6. The semiconductor laser apparatus according to claim 1, wherein
the semiconductor laser device includes a plurality of light-emitting device regions including the first light-emitting device region, the second light-emitting device region, and a third light-emitting device region,
a first protrusion structure protruding from the substrate is located adjacent to the second light-emitting device region located at one end in an arrangement direction in which the plurality of light-emitting device regions are arranged, on an opposite side of the second light-emitting device region to the first light-emitting device region,
a second protrusion structure protruding from the substrate is located adjacent to the third light-emitting device region located at an other end in the arrangement direction, on an opposite side of the third light-emitting device region to the first light-emitting device region,
a height of the first protrusion structure from the substrate and a height of the second protrusion structure from the substrate are approximately same as a height of the second light-emitting device region from the substrate and a height of the third light-emitting device region from the substrate, respectively, and
a third electrode film located on a surface of the first protrusion structure and the one-conductivity-type semiconductor layer in the second light-emitting device region are electrically connected to each other.

7. The semiconductor laser apparatus according to claim 1, further comprising:
a submount having a mounting surface on which a first metal film pattern and a second metal film pattern are formed,
wherein the first light-emitting device region and the second light-emitting device region in the semiconductor laser device are joined respectively to the first metal film pattern and the second metal film pattern.

8. The semiconductor laser apparatus according to claim 7, wherein
the semiconductor laser device includes a plurality of light-emitting device regions including the first light-emitting device region and the second light-emitting device region,
the submount includes a plurality of metal film patterns including the first metal film pattern and the second metal film pattern,
the plurality of light-emitting device regions are connected to respective metal film patterns from among the plurality of metal film patterns, and
when a total number of the plurality of light-emitting device regions is n, a total number of the plurality of metal film patterns is n+1.

9. The semiconductor laser apparatus according to claim 8, wherein
the plurality of metal film patterns each include a metal stack film in which an adhesion layer, a first barrier layer, a first contact layer, a second barrier layer, and a second contact layer are stacked in stated order from the mounting surface,
in a sectional view of the first light-emitting device region from an end surface of the first light-emitting device region from which laser light is emitted, one of the plurality of metal film patterns that is connected to the other-conductivity-type semiconductor layer in the first light-emitting device region includes the second barrier layer and the second contact layer that are greater in width than the other-conductivity-type semiconductor layer, and the adhesion layer, the first barrier layer, and the first contact layer that are greater in width than the second barrier layer and the second contact layer,
both ends of each of the second barrier layer and the second contact layer are located outside respective both ends of the other-conductivity-type semiconductor layer, and
both ends of each of the adhesion layer, the first barrier layer, and the first contact layer are located coincident with or outside the respective both ends of each of the second barrier layer and the second contact layer.

10. The semiconductor laser apparatus according to claim 1, wherein a polished surface is exposed on a surface of the substrate opposite to a surface on which the first light-emitting device region and the second light-emitting device region are formed.

11. The semiconductor laser apparatus according to claim 1, wherein
a separation region is located between the first light-emitting device region and the second light-emitting device region, the separation region being a region at which the one-conductivity-type semiconductor layer in the first light-emitting device region and the one-conductivity-type semiconductor layer in the second light-emitting device region are separated,
in the separation region, a groove portion is provided in the substrate, and
a current stop layer is located between the one-conductivity-type semiconductor layer in the first light-emitting device region and the substrate.

12. The semiconductor laser apparatus according to claim 1, wherein the other-conductivity-type semiconductor layer includes a ridge having a width smaller than a width of the other-conductivity-type semiconductor layer, a center of the ridge in a width direction is located closer to the first electrode film than a center of the other-conductivity-type semiconductor layer in the width direction is, in the first light-emitting device region.

13. The semiconductor laser apparatus according to claim 1, wherein a thickness of the first electrode film is 0.5 μm or more.

14. The semiconductor laser apparatus according to claim 1, wherein the first electrode film located on the one-conductivity-type semiconductor layer in the first light-emitting device region and the second electrode film located on the other-conductivity-type semiconductor layer in the second light-emitting device region are a same continuous film.

15. The semiconductor laser apparatus according to claim 1, wherein a thickness of the substrate is 80 μm or more.

16. The semiconductor laser apparatus according to claim 1, wherein a film thickness of the one-conductivity-type semiconductor layer is 20 μm or more.

17. A semiconductor laser apparatus, comprising:
a semiconductor laser device for junction-down mounting that includes a first light-emitting device region and a second light-emitting device region formed separately on a substrate; and
a submount having a mounting surface on which a first metal film pattern and a second metal film pattern are formed, wherein:
the first light-emitting device region and the second light-emitting device region in the semiconductor laser device each have a stack structure in which a one-conductivity-type semiconductor layer of one conductivity type, an active layer, and an other-conductivity-type semiconductor layer of an other conductivity type different from the one conductivity type are stacked in stated order,
the first light-emitting device region includes a first electrode film located on the one-conductivity-type semiconductor layer,
the second light-emitting device region includes a second electrode film located on the other-conductivity-type semiconductor layer, the first electrode film and the second electrode film are electrically connected to each other, the first light-emitting device region and the second light-emitting device region in the semiconductor laser device are joined respectively to the first metal film pattern and the second metal film pattern, a protective film is formed from a laser light emission end surface of the semiconductor laser device through to an end surface of the submount parallel to the laser light emission end surface.

18. The semiconductor laser apparatus according to claim 17, wherein the protective film is formed on a joining material between the semiconductor laser device and the submount.

19. A semiconductor laser apparatus, comprising:

a semiconductor laser device for junction-down mounting that includes a first light-emitting device region and a second light-emitting device region formed separately on a substrate; and a submount having a mounting surface on which a first metal film pattern and a second metal film pattern are formed, wherein:

the first light-emitting device region and the second light-emitting device region in the semiconductor laser device each have a stack structure in which a one-conductivity-type semiconductor layer of one conductivity type, an active layer, and an other-conductivity-type semiconductor layer of an other conductivity type different from the one conductivity type are stacked in stated order, the first light-emitting device region includes a first electrode film located on the one-conductivity-type semiconductor layer, the second light-emitting device region includes a second electrode film located on the other-conductivity-type semiconductor layer, the first electrode film and the second electrode film are electrically connected to each other, the first light-emitting device region and the second light-emitting device region in the semiconductor laser device are joined respectively to the first metal film pattern and the second metal film pattern, the semiconductor laser device includes a plurality of light-emitting device regions including the first light-emitting device region and the second light-emitting device region, the submount includes a plurality of metal film patterns including the first metal film pattern and the second metal film pattern, the plurality of light-emitting device regions are connected to respective metal film patterns from among the plurality of metal film patterns, and when a total number of the plurality of light-emitting device regions is n, a total number of the plurality of metal film patterns is n+1.

20. A semiconductor laser apparatus, comprising:

a semiconductor laser device for junction-down mounting that includes a first light-emitting device region and a second light-emitting device region formed separately on a substrate, wherein:

the first light-emitting device region and the second light-emitting device region in the semiconductor laser device each have a stack structure in which a one-conductivity-type semiconductor layer of one conductivity type, an active layer, and an other-conductivity-type semiconductor layer of an other conductivity type different from the one conductivity type are stacked in stated order, the first light-emitting device region includes a first electrode film located on the one-conductivity-type semiconductor layer, the second light-emitting device region includes a second electrode film located on the other-conductivity-type semiconductor layer, the first electrode film and the second electrode film are electrically connected to each other, and the other-conductivity-type semiconductor layer includes a ridge having a width smaller than a width of the other-conductivity-type semiconductor layer, a center of the ridge in a width direction is located closer to the first electrode film than a center of the other-conductivity-type semiconductor layer in the width direction is, in the first light-emitting device region.

* * * * *